US011596071B2

United States Patent
Knox et al.

(10) Patent No.: US 11,596,071 B2
(45) Date of Patent: Feb. 28, 2023

(54) APPARATUS FOR DEPOSITING CONDUCTIVE AND NONCONDUCTIVE MATERIAL TO FORM A PRINTED CIRCUIT

(71) Applicant: BotFactory Inc., Long Island City, NY (US)

(72) Inventors: Michael Knox, Manhasset, NY (US); Andrew Ippoliti, Sunnyside, NY (US); Georgios Kyriakou, New York, NY (US); Carlos Ospina, New York, NY (US); Nicolas Vansnick, Brooklyn, NY (US)

(73) Assignee: BOTFACTORY INC., Long Island City, NY (US)

( * ) Notice: Subject to any disclaimer, the term of this patent is extended or adjusted under 35 U.S.C. 154(b) by 286 days.

(21) Appl. No.: 16/773,944

(22) Filed: Jan. 27, 2020

(65) Prior Publication Data

US 2020/0163220 A1    May 21, 2020

Related U.S. Application Data

(63) Continuation-in-part of application No. 15/175,014, filed on Jun. 6, 2016, now Pat. No. 10,548,231, which is a continuation-in-part of application No. 14/392,408, filed as application No.
(Continued)

(51) Int. Cl.
| | | |
|---|---|---|
| *B23P 19/00* | (2006.01) | |
| *H05K 3/12* | (2006.01) | |
| *G01R 31/28* | (2006.01) | |

(52) U.S. Cl.
CPC ......... *H05K 3/125* (2013.01); *G01R 31/2805* (2013.01); *H05K 2203/013* (2013.01); *H05K 2203/162* (2013.01); *H05K 2203/167* (2013.01)

(58) Field of Classification Search
CPC ....... H05K 2203/013; H05K 2203/162; H05K 2203/167; H05K 3/1241; H05K 3/125; H05K 3/341; H05K 3/4664; H05K 3/4685; G01R 31/2805
See application file for complete search history.

(56) References Cited

U.S. PATENT DOCUMENTS

| | | | | |
|---|---|---|---|---|
| 5,838,567 A * | 11/1998 | Boggio, Jr. | .......... | H05K 3/1241 700/121 |
| 6,691,400 B1 * | 2/2004 | Negishi | .............. | H05K 13/0411 29/742 |
| 2015/0382459 A1 * | 12/2015 | Tsai | .................... | H05K 3/4664 29/745 |

* cited by examiner

*Primary Examiner* — Paul D Kim
(74) *Attorney, Agent, or Firm* — Herbert F. Ruschmann

(57) ABSTRACT

An apparatus for producing a printed circuit board on a substrate, has a table for supporting the substrate, a function head configured to effect printing conductive and non-conductive materials on the substrate, a positioner configured to effect movement of the function head relative to the table, and a controller configured to operate the function head and the positioner to effect the printing of conductive and non-conductive materials on the substrate. The apparatus optionally has a layout translation module configured to convert PCB files or multilayer PCB files to printing data for controlling the function head to print conductive material and nonconductive material onto the substrate. The apparatus has a testing head to verify conductors which operates automatically. The translation module also prints nonconductive material component alignment areas and nonconductive material substrate stiffeners.

32 Claims, 25 Drawing Sheets

Related U.S. Application Data

PCT/US2014/067986 on Dec. 1, 2014, now Pat. No. 10,779,451.

(60) Provisional application No. 61/910,210, filed on Nov. 29, 2013, provisional application No. 62/053,796, filed on Sep. 23, 2014.

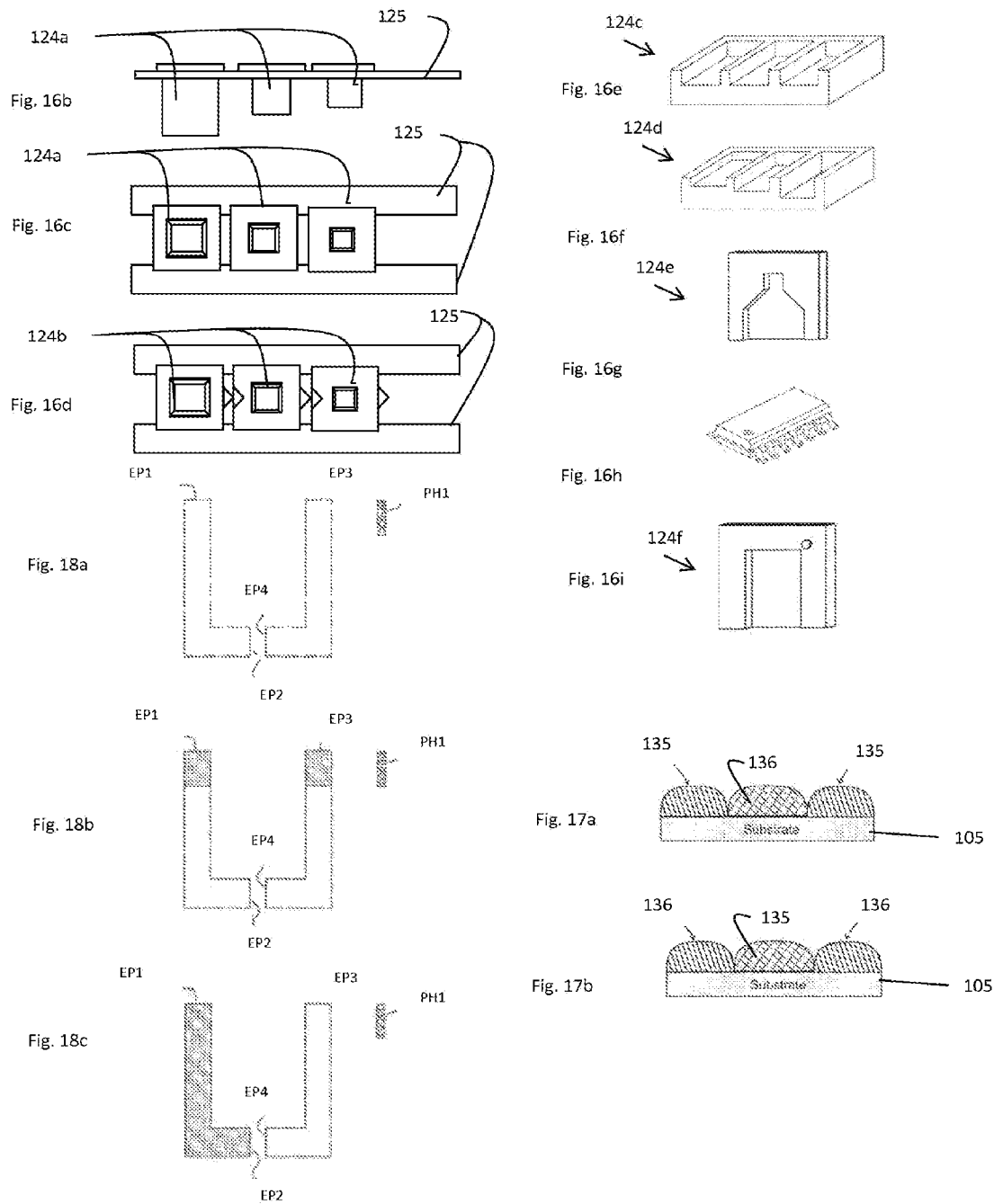

APPARATUS FOR DEPOSITING CONDUCTIVE AND NONCONDUCTIVE MATERIAL TO FORM A PRINTED CIRCUIT

RELATED APPLICATIONS

This application claims priority to U.S. provisional patent application No. 62/053,796, filed Sep. 23, 2014, and U.S. provisional patent application No. 61/910,210, filed Nov. 29, 2013, both of which are hereby incorporated herein by reference. This application is a continuation-in-part of and claims priority to application Ser. No. 15/175,014, filed Jun. 6, 2016, and now issued as U.S. Pat. No. 10,548,231, which is a continuation-in-part of application Ser. No. 14/392,408, which is a national stage application filed Jun. 1, 2016 of international patent application PCT/US2014/067986, filed Dec. 1, 2014, and claims priority thereto and hereby incorporates by reference all materials of PCT/US2014/067986 and provisional applications Nos. 62/053,796, and 61/910, 210 referenced above. Material of the provisional, PCT, national stage and prior CIP filings is intended only to augment the present disclosure and wording in the provisional or PCT applications is not to be interpreted as limiting this disclosure or requiring any material in the provisional applications as critical, indispensable, or a requirement unless so stated herein.

TECHNICAL FIELD

The present disclosure relates to fabrication and assembly of printed circuit boards including deposition of conductive traces and placement of components.

BACKGROUND

Modern electrical devices are comprised of semiconductor circuits integrated into small packages, passive components, Printed Wiring Board (PWB) and solder. The complete assembly is often referred as a Printed Circuit Board (PCB) or Printed Circuit Assembly (PCA). The manufacture of a traditional PCA is a multistep process that may include several specialized and often expensive machines. These highly specialized machines are directed to one operation during the PCA manufacture. For example, a typical PWB, is manufactured using a thin sheet of copper foil that is laminated to a non-conductive substrate. The copper thickness may be 1.4 mils (1 ounce) and the substrate is typically FR-4 with a substrate thickness of 62 mils. Other thicknesses and substrates are also available.

Referring to FIG. 1A, conductive circuit elements or traces, such as lines, runs, pads and other wiring features, are created by removing copper from the laminated substrate by chemically etching or mechanically machining as illustrated in FIG. 1A. This subtractive process leaves behind conductive traces 50, 50a, and 50b, located on a top surface of substrate 52. Referring to FIG. 1B, it may be necessary to include a second set of conductive traces, 50c and 54, which are electrically isolated from other conductive traces. In this case, conductive traces 50, 50a, and 50b, are etched to the top surface of the substrate 52 and conductive traces 50c and 54, are etched on a bottom surface of the substrate 52. Referring to FIG. 1C, by placing conductive traces, 50c and 54, on an opposite side of the substrate 52, the conductive traces, 50 and 54, can cross each other, for example at crossover 58, without making electrical connection.

Referring to FIGS. 1C and 2, when electrical connection is optionally used between the conductive traces, 50c and 50a, a via 60a is placed through substrate 52. The via 60a, often referred to as a "plated-through hole," is typically manufactured in a two-step process wherein a hole is first drilled through the conductive traces, 50c and 50a, and the substrate 52 and then the hole is plated with copper thus making connection between the two conductive traces.

When complex circuits are manufactured especially for a small dimensional footprint, the complete board may contain multiple printed wiring boards stacked to allow copper lines to cross over each other while maintaining electrical isolation. Referring to FIG. 3, a four-layer PWB comprises substrate 61a and substrate 61b glued together with prepreg 62. PWB substrate 61a, has conductive traces 64 etched on a top side and conductive traces 65 etched to a bottom side. PWB substrate 61b has conductive traces 66 etched on a top side and conductive traces 67 etched to a bottom side. A via 70 is capable of connecting traces to any combination of conductive traces on different layers. The prepeg 62 is an insulating material used to electrically isolate conductive traces 65 and 66.

Highly specialized equipment is used to manufacture printed wiring boards in order to rapidly fabricate the boards at an economical cost. The etching equipment only performs one of several tasks optionally used to assemble a complete PCA. Once the printed wiring board is etched and drilled, the exposed copper traces are typically coated with solder, silver, nickel/gold, or some other anti-corrosion coating. The finished printed wiring board is then typically sent to another facility for assembly of electronic components onto the PWB. The attachment of electronic components, e.g., semiconductor and passive components, are made using a solder reflow process. In one typical process, solder paste is applied to the PWB using screen printing techniques. Once the solder is printed onto the board, the electrical components are positioned onto the board. Positioning the components is often referred as "pick-and-place". Components may be manually placed, often with tweezers, or in high volume production, components may be placed with a computer controlled machine. Once the components are all positioned on the solder paste, the PCA is placed in an oven to melt (reflow) the solder paste which will permanently attach the components to the board. Because of the multiple machines and technologies involved, this complete process can often take up to 4 weeks to complete.

The process of determining routing of the conductive traces is often performed using a Computer Aided Design (CAD) software tool. When using CAD, a user enters a schematic of a desired circuit including electrical components and package sizes. The CAD tool generates a set of files used as a mask when chemically etching each layer of the PWB. The same file is optionally used to control a Computer Numerically Controlled (CNC) milling machine when mechanically etching the PWB. When mechanically etching the PWB, the CNC milling machine removes copper along an outside edge of a desired conductive trace leaving behind a copper line that is electrically isolated from other conductive traces. The CAD tool output is in a file format that is typically Gerber. Gerber is an industry standard in the PWB industry which allows multiple vendors to share the same data without loss of information. The file format is optionally native to the CAD tool such as Eagle, OrCAD and Altium to name a few. In all cases, there is information for each layer of the PWB. During the layout process, the CAD tool will attempt to route the conductive traces based on a set of design rules which include the number of layers used in the PWB. For example, an entry in the CAD tool may be the use of a four-layer board which implies that there will be four independent layers of conductive traces. The CAD tool will route conductive traces to cross over each other while not making electrical contact. When the CAD tool knows that insulating layers exist between the multiple conductive layers and knowing that the insulating layers extend to the edges of the PWB, cross-overs are easily created by dropping the line from one layer of conductive traces to a second layer of conductive traces and moving across the layer and finally returning to the original side of the PWB. As an example, referring to FIGS. 1A-1C, and 2, conductive traces 50, 50a and 50b, are etched on the top side of the substrate 52 and it is desired to have conductive trace 50a make an electrical connection to conductive trace 50b. The conductive trace 50c is routed between the other conductive traces, 50a and 50b, and connection is made through a pair of vias, 60a and 60b, as the electrical connection is dropped to a lower conductive layer and runs underneath the conductive trace 50 through the conductive line 50c. When using vias, 60a and 60b, conductive pads 72 are typically optionally used around the hole location to compensate for tolerances when drilling the via hole. In FIGS. 1B and 1C, conductive pads 72 are etched on the top of the substrate 52. Conductive pads, 73 and 72, are etched on the bottom of the substrate 52 or any other lower level of a multilayer PWB. In practice, conductive pads, 70 and 72, typically have the same diameter however, this is not required. Connecting conductive trace 50a to conductive trace 50b is made through conductive pads, 72 and 73, and plated-through vias 60a and 60b. When the conductive trace routing is complete, the CAD tool will produce a drill file which includes the location of via hole 60a and via hole 60b. The drill file is used to control a CNC machine for drilling holes in the PWB. The drill file is included as an output from the CAD tool.

The conventional multilayer PCB production method is expensive and requires multiple machines to produce a multilayer PCB. Thus, a need exist for a single apparatus and method which can produce a completed circuit board and optionally populate the circuit board with components.

SUMMARY OF THE DISCLOSURE

Accordingly, it is an object of the disclosure to provide a PCB production apparatus and method which provides for producing PCB's using ink and/or epoxy printing and optionally component placement.

Briefly stated, the present disclosure provides an apparatus for producing a printed circuit board on a substrate, has a table for supporting the substrate, a function head configured to effect printing conductive and non-conductive materials on the substrate, a positioner configured to effect movement of the function head relative to the table, and a controller configured to operate the function head and the positioner to effect the printing of conductive and non-conductive materials on the substrate. The apparatus optionally has a layout translation module configured to accept PCB multilayer circuit board files and convert multilayer circuit board layout data of the PCB multilayer circuit board files to printing data files for controlling the function head to print conductive material and nonconductive material onto the substrate to produce a printed circuit effecting functionality of the multilayer circuit board layout data.

In accordance with these and other objects of the disclosure, there is further provided an embodiment of the above described apparatus further having a component feed device disposed to present components for placement on the substrate with the substrate disposed on the table. The function head includes a component placement device configured to pick up the components and release the components. The controller is further configured to operate the component placement device, the function head and the positioner to effect placement the components on the substrate.

In a further embodiment of the present disclosure, an apparatus as described above is provided wherein the layout translation module is configured to accept the PCB multilayer circuit board files and convert component placement data of the PCB multilayer circuit board files to placement data files configured for controlling the function head and the component placement device to accept the components from the component feed device and place the components onto the substrate in accordance with the placement data files.

In yet a further embodiment of the present disclosure, an apparatus according to any of the above described embodiments is provided further comprising at least one heat source disposed to effect heating of the substrate with the substrate disposed on the table.

In another embodiment of the present disclosure there is provided a kit for printing a circuit on a substrate to produce a printed circuit board on a substrate. The kit comprises a conductive material print head containing a conductive material to be printed on the substrate, a nonconductive material print head containing a nonconductive material to be printed on the substrate, and a printing apparatus. The printing apparatus includes a table for supporting the substrate, a function head configured to accept installation, either simultaneously or one at a time, of the conductive material print head, or the nonconductive material printhead, and a positioner configured to effect movement of the function head and the table relative to one another. Further included is a controller configured to accept PWB data to operate the function head and the positioner to effect: printing on the substrate the nonconductive material when the function head has the nonconductive material print head installed; printing on the substrate of the conductive material to form printed conductors when the function head has the conductive material print head installed; and reprinting one or more of the printed conductors in response to test input indicating the one or more printed conductors fail testing.

A feature of the above embodiments includes the controller being configured to prompt a user for the test input reflecting a status of a printed conductor. Another feature includes the controller operating a display of one or more of the printed conductors which is configured to prompt the user for the test input corresponding to one or more of the printed conductors. Another optional feature provides for display presenting a diagram of the printed conductors.

Yet another feature of the above embodiments includes an electrical testing device having testing probe for test printed conductors at at least one point. The function head is configured to accept installation, either simultaneously or one at a time, of the conductive material print head, the nonconductive material printhead, or the testing probe. When the testing probe is installed in the function head, the controller operates the positioner and the function head to effect testing of the printed conductors to produce the test input indicating the one or more printed conductors fail testing and effect the reprinting of the one or more printed conductors in response to the test input. In an embodiment the testing probe and the conductive material printhead are simultaneously installed in the function head. In another embodiment the testing probe is integrated into the conductive material print head. A possible configuration includes the conductive material print head being an inkjet print head and the testing probe protruding from a bottom surface of the ink jet print head. In a further arrangement of the present disclosure the testing probe includes two probe contacts and the testing device effects a resistance measurement.

Still another embodiment of the present disclosure provides a kit for printing a circuit on a substrate to produce a printed circuit board on a substrate, wherein the kit comprises a conductive material print head containing a conductive material to be printed on the substrate, a nonconductive material print head containing a nonconductive material to be printed on the substrate, and a printing apparatus. The printing apparatus has a table for supporting the substrate, a function head configured to accept installation, either simultaneously or one at a time, of the conductive material print head, or the nonconductive material printhead. A positioner is configured to effect movement of the function head and the table relative to one another. A controller is configured to accept PWB data to operate the function head and the positioner to effect printing on the substrate the nonconductive material when the function head has the nonconductive material print head installed, printing on the substrate of the conductive material to form printed conductors and conductor pads when the function head has the conductive material print head installed; and generation of alignment structure data, based on the PWB data, which defines nonconductive alignment structures configured to align electrical components with the conductive pads when the components are installed on the conductive pads.

Further features of the above embodiment provide the nonconductive alignment structures including a nonconductive wall configured to surround the electrical components, or the nonconductive alignment structures including a nonconductive bosses configured to align the electrical components with the conductive pads. Aspects of this feature further provide that the nonconductive bosses are L-shaped, or crescent shaped, or round dots.

Still further aspects of the above embodiments of the present disclosure provide a controller is configured to accept data identifying areas of the substrate requiring stiffening and generate stiffening structure data for directing printing of the nonconductive material to form a stiffening support, and to operate the function head and the positioner to effect printing on the substrate the nonconductive material to form the stiffening structure when the function head has the nonconductive material print head installed.

Yet another embodiment of the present disclosure provides a kit for printing a circuit on a substrate to produce a printed circuit board on a substrate, with the kit comprising a conductive material print head containing a conductive material to be printed on the substrate, a nonconductive material print head containing a nonconductive material to be printed on the substrate, and a printing apparatus. The printing apparatus comprises a table for supporting the substrate, a function head configured to accept installation, either simultaneously or one at a time, of the conductive material print head, or the nonconductive material printhead, a positioner configured to effect movement of the function head and the table relative to one another, and a controller. The controller is configured to accept PWB data to operate the function head and the positioner to effect printing on the substrate the nonconductive material when the function head has the nonconductive material print head installed, and printing on the substrate of the conductive material to form printed conductors and conductor pads when the function head has the conductive material print head installed. The controller is further configured to accept data identifying areas of the substrate requiring stiffening and generate stiffening structure data for directing printing of the nonconductive material to form a stiffening support, and to operate the function head and the positioner to effect printing on the substrate the nonconductive material to form the stiffening structure when the function head has the nonconductive material print head installed.

The above, and other objects, features and advantages of the present disclosure will become apparent from the following description read in conjunction with the accompanying drawings, in which like reference numerals designate the same elements. The present disclosure is considered to include all functional combinations of the above described features and corresponding descriptions contained herein, and all combinations of further features described herein, and is not limited to the particular structural embodiments shown in the figures as examples. The scope and spirit of the present disclosure is considered to include modifications as may be made by those skilled in the art having the benefit of the present disclosure which substitute, for elements presented in the claims, devices or structures upon which the claim language reads or which are equivalent thereto, and which produce substantially the same results associated with those corresponding examples identified in this disclosure for purposes of the operation of this disclosure. Additionally, the scope and spirit of the present disclosure is intended to be defined by the scope of the claim language itself and equivalents thereto without incorporation of structural or functional limitations discussed in the specification which are not referred to in the claim language itself.

The foregoing is a summary and thus contains, by necessity, simplifications, generalizations, and omissions of detail; consequently, those skilled in the art will appreciate that the summary is illustrative only and is not intended to be in any way limiting. Additional features and advantages of various embodiments of the present disclosure will be set forth in part in the non-limiting description that follows, and in part, will be apparent from the non-limiting drawings, or may be learned by practice of various embodiments. The objectives and other advantages of various embodiments will be realized and attained by means of the elements and combinations particularly pointed out in the description and appended claims.

BRIEF DESCRIPTION OF THE DRAWINGS

In part, other aspects, features, benefits and advantages of embodiments of the present disclosure will be apparent with regard to the following description, appended claims and accompanying drawings wherein:

FIG. 1B is a bottom view of the PCB of FIG. 1a;

FIG. 9b is a diagram of a circuit trace defined by the PCB trace defining method shown in FIG. 9a;

FIG. 16b is side elevation view of another component tray and a holding frame of the present disclosure;

FIG. 16c is a top plan view of the component tray and the holding frame of FIG. 16b;

FIG. 16d is a top plan view of another component tray and the holding frame of FIG. 16b;

FIG. 16e is a perspective view of another component tray of the present disclosure;

FIG. 16f is a perspective view of another component tray of the present disclosure;

FIG. 16g is a perspective view of another component tray of the present disclosure;

FIG. 16h is a perspective view of a standard component;

FIG. 16i is a perspective view of another component tray of the present disclosure;

FIG. 17a is a cross-sectional view of a substrate with conductive and non-conductive traces produced in accordance with a method of the present disclosure;

FIG. 17b is a cross-sectional view of another substrate with conductive and non-conductive traces produced in accordance with another method of the present disclosure;

FIG. 18a is a view of exemplary circuit traces;

FIG. 18b is a view of the exemplary circuit traces of FIG. 18a with indicia indicating a method of the present disclosure;

FIG. 18c is a view of the exemplary circuit traces of FIG. 18a with further indicia indicating the method of the present disclosure discussed with reference to FIG. 18b;

FIG. 27C is a side elevation partial cross section view a further embodiment of a PWB produced by an apparatus and method of the present disclosure wherein nonconductive areas are printed and configured to align an electrical component on conductor pads by operation of inclined sides positioned adjacent the component;

DETAILED DESCRIPTION

For the purposes of this specification and appended claims, unless otherwise indicated, all numbers expressing quantities of ingredients, percentages or proportions of materials, reaction conditions, and other numerical values used in the specification and claims, are to be understood as being modified in all instances by the term "about." Accordingly, unless indicated to the contrary, the numerical parameters set forth in the following specification and attached claims are approximations that may vary depending upon the desired properties sought to be obtained by the embodiments of the present disclosure. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all subranges subsumed therein. For example, a range of "1 to 10" includes any and all subranges between (and including) the minimum value of 1 and the maximum value of 10, that is, any and all subranges having a minimum value of equal to or greater than 1 and a maximum value of equal to or less than 10, e.g., 5.5 to 10.

It is noted that, as used in this specification and the appended claims, the singular forms "a," "an," and "the," include plural referents unless expressly and unequivocally limited to one referent. Thus, for example, reference to "a member" includes one, two, three or more members.

Reference will now be made in detail to various embodiments of the present disclosure, examples of which are illustrated in the accompanying drawings. While the embodiments of the present disclosure will be described in conjunction with the illustrated embodiments, it will be understood that they are not intended to limit the disclosure to those embodiments. On the contrary, the disclosure is intended to cover all alternatives, modifications, and equivalents, which may be included within the disclosure as defined by the appended claims.

The headings below are not meant to limit the disclosure in any way; embodiments under any one heading may be used in conjunction with embodiments under any other heading.

Overview.

Figure 4:
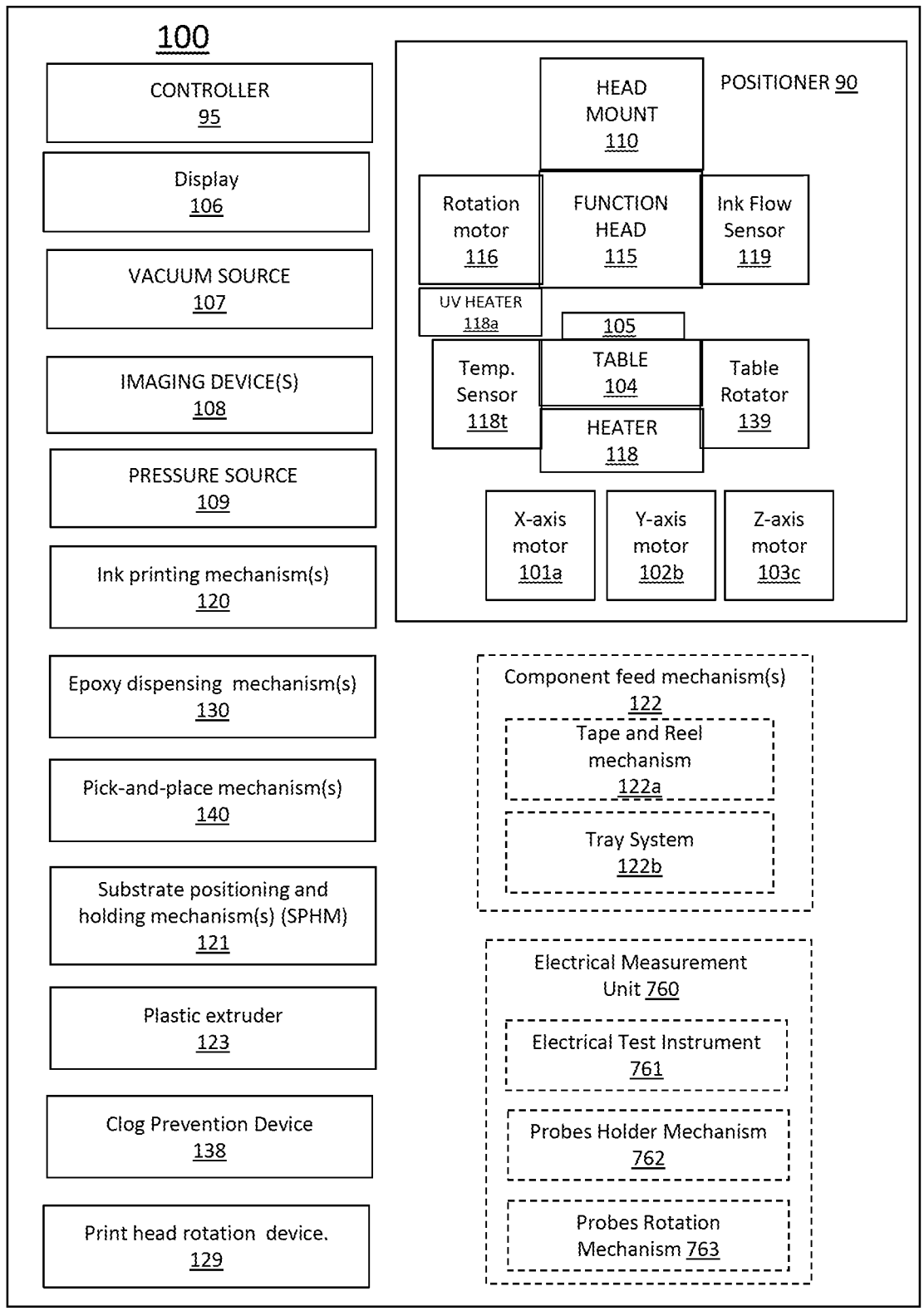
FIG. 4 is a block diagram of an embodiment of a PCB production apparatus 100 of the present disclosure.
Figure 7:
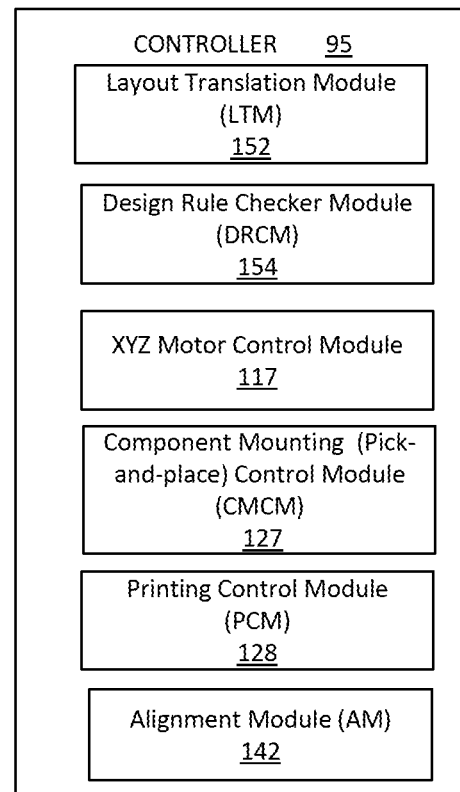
FIG. 7 is a block diagram of functional modules of a controller of the present disclosure.

Referring to FIG. 4, an embodiment of the present disclosure includes a printed circuit board (PCB) production apparatus 100 comprising a positioner 90, a controller 95, a display 106, a vacuum source 107, and an imaging device 108. The positioner 90 further comprises a head mount 110, a function head 115, and a table 104. The positioner operates to effect three axis movement of the function head 115 relative to the table 104 as directed by the controller 101. The table 104 is configured to support a substrate 105 which is a workpiece to be fabricated into a PCB. A component feed mechanism 122 and a component mounting head 140 are optionally provided. The component feed mechanism 122 may be embodied as a tape and reel mechanism 122a or a tray system 122b, or both either simultaneously or interchangeably. Details of the controller 95 are depicted in FIG. 7 and include a component mounting control module (CMCM) 127 which controls operations of the component mounting head 140 and the component feed mechanism 122 when the PCB production apparatus 100 is so equipped.

Figure 5A:
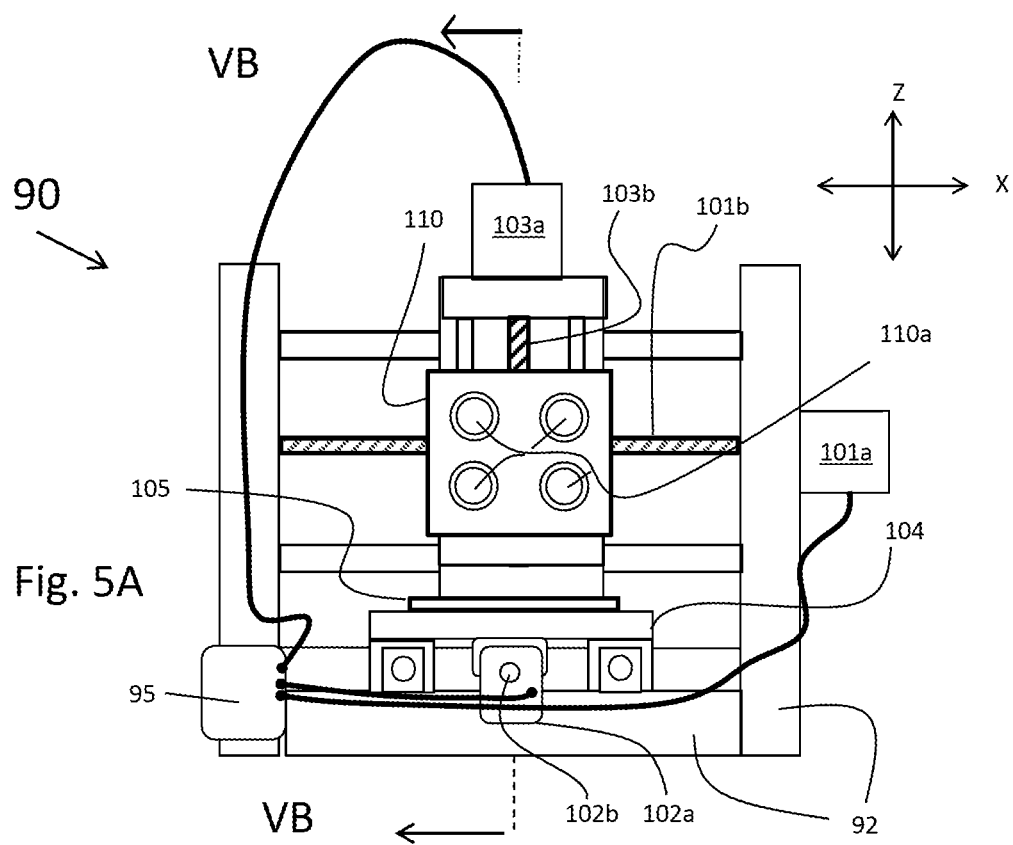
FIG. 5A is a schematic representation of the PCB production apparatus 100 of FIG. 4.
Figure 5B:
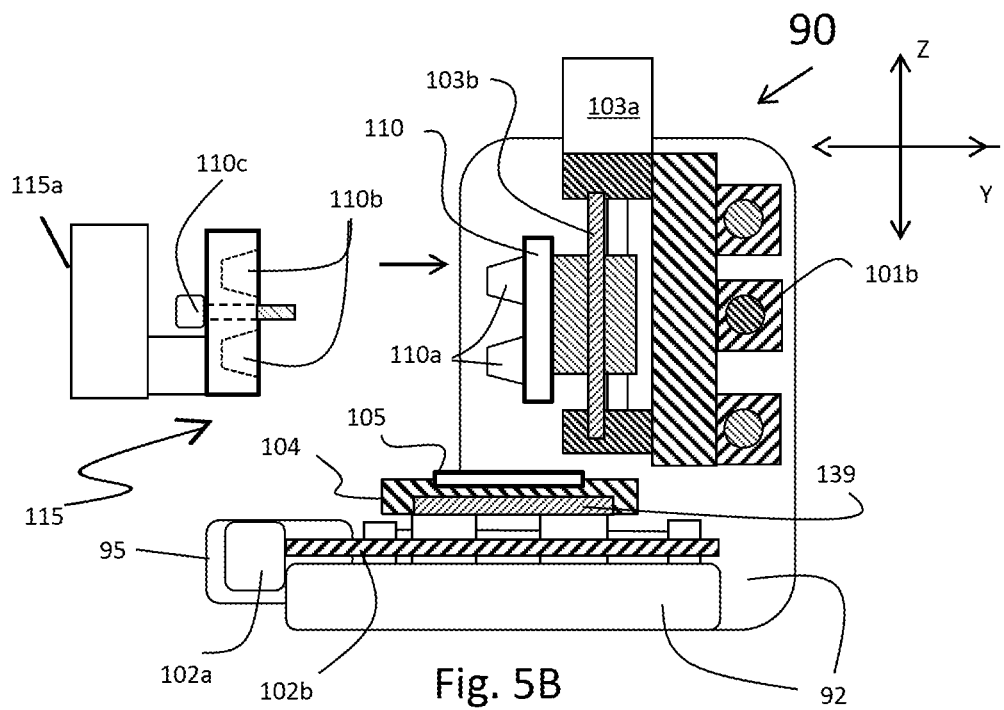
FIG. 5B is a side elevation view the PCB production apparatus 100 of FIG. 5A taken along line VB-VB.

Referring to FIGS. 5A and 5B, a simplified, schematic in part, depiction of an embodiment of the positioner 90 illustrates a basic configuration of a positioner. The present disclosure is not restricted to the configuration illustrated, and it will be understood by those skilled in the art that other positioner configurations are optionally adaptable for use in the PCB production apparatus 100 provided the configurations are capable of positioning the function head relative to the substrate 105 in x, y, and z axis directions. Motion along each axis is optionally implemented by a motor and a lead screw. Other optionally employable actuation mechanisms include, for example and not limitation, linear motors and motors operating, inter alia, belts and pulleys, and rack and pinions. In the embodiment of FIGS. 5A and 5B, an x-axis motor 101a drives an x-axis lead screw 101b, a y-axis motor 102a drives an x-axis lead screw 102b, and a z-axis motor 103a drives an z-axis lead screw 103b. The head mount 110 is vertically moved by the z-axis lead screw 103b and is horizontally moved in the x-axis by the x-axis lead screw 101b. The table 104, which supports the substrate 105, is horizontally moved in the y-axis direction by the y-axis lead screw 102b. The table 104 is optionally mounted to permit rotation in an embodiment including table rotator 139 which may be embodied as a motor, solenoid, field coil, or other actuator.

The function head 115 optionally mounts to the head mount 110 by mount screw 110c and is aligned by virtue of alignment cones 110a mating with alignment cavities 110b. Other mounting configurations may be adapted without departing from the scope of the present disclosure. The function head 115 has a function module 115a which is optionally configured to effect any or all of ink dispensing, epoxy dispensing, or component placement as is discussed below. The PCB production apparatus 100 is capable of printing circuit traces and/or performing pick-and-place attachment of electrical components. The PCB production apparatus 100 is optionally used for low-cost rapid prototyping and rapid manufacture of complete printed circuit assemblies.

As is elaborated upon below, an embodiment of the PCB production apparatus 100 comprises a function module 115a configured as a printing device for printing conductive material onto the substrate 105. The PCB production apparatus 100 is also optionally capable of positioning circuit components onto the substrate 105 in electrical connection to the conductive material with the function module 115a configured for component mounting as discussed below. In some applications, attachment of circuit components to the substrate 105 and conductive material may include application of a conductive epoxy and the function module 115a is optionally configured with the epoxy dispenser 130. An embodiment of the PCB production apparatus 100 is also capable of applying non-conductive epoxy at specific locations on the substrate 105. If heat curing is optionally used for proper operation of the conductive material and epoxy, an embodiment of the PCB production apparatus 100 optionally includes heater 118 which is a source of heat which is applied under the control of the controller 95. For lightweight and/or flexible substrates, an embodiment of the PCB production apparatus 100 optionally includes a substrate positioning/holding mechanism 121 for temporarily holding substrate 105 to table 104 which, in one embodiment, includes the vacuum source 107. The PCB production apparatus 100 optionally includes the imaging device 108 for implementing a scanning, or digitizing, function for creating a digital model of an arbitrary three dimensional structure for aiding in the positioning of the ink printing and component placement. A further embodiment of the PCB production apparatus 100 optionally includes a material printing function for printing plastic and/or metal structures for supporting and/or enclosing the PCA.

Controller.

The controller 95 controls functions of the PCB production apparatus 100, including the movement of the head mount 110 relative to substrate 105, and is implemented by software and/or firmware which resides internal to the PCB production apparatus 100, external to the PCB production apparatus 100, or split between the two, where some functions reside external to the PCB production apparatus 100 and some functions reside internal to the PCB production apparatus 100. To aid in the readability of this document, all software and/or firmware references related to the operation of the PCB production apparatus 100 will be referred to as firmware. In some cases, firmware will be referring to an application module that is part of the complete the PCB production apparatus system software or the firmware will be referring to application modules that are optionally operated as stand-alone software applications. Firmware will reside in the controller 95 which is integrated into the PCB production apparatus 100. The controller 95 may be any of a microcontroller, a single board computer capable of producing signals to control the movement of head mount 110, or a standalone computer, such as but not limited to a PC, which has an I/O unit configured to control components of the PCB production apparatus 100 such as any one or combination of the x-axis motor 101a, the y-axis motor 102a, the z-axis motor 103a, the function head 115, the imaging device 108, and the pressure source 109.

It will be understood by those skilled in the art that the controller 95, although depicted as a module within the PCB production apparatus 100 in FIG. 4, is optionally implemented in a distributed fashion wherein a control module is internal to the PCB production apparatus and a computer, separate from but in electronic communication with the internal control module, operate in conjunction with each other to effect control of the PCB production apparatus 100. For the purposes of this disclosure, the term "controller" is intended to include such an arrangement as well as an arrangement wherein a computer is external to the PCB production apparatus 100 but controls operation of components of the PCB production apparatus 100 as discussed above via an I/O unit. In such an embodiment, the computer is to be considered a portion of the PCB production apparatus 100.

Function Head.

Referring to FIG. 6, in an embodiment, the function head 115 includes an ink printing mechanism 120 for printing conductive traces by dispensing of conductive inks onto the substrate 105. The ink printing mechanism 120 is attached to the PCB production apparatus 100 at head mount 110. Dispensing conductive ink using the ink-printing mechanism 120 includes, but is not limited to, processes such as syringe printing, piezoelectric-based printing, ink-jet printing and ink spray. Some printing techniques, such as syringe printing, require the application of air pressure provided by optional pressure source 109, shown in FIG. 4, or mechanical pressure applied by an electric motor or other actuator to push the ink through the ink nozzle.

Conductive inks are typically silver and copper-based but could be of any ink that would provide reasonable conductivity for transfer of electrical signals across the conductive traces. An example of a commercially available silver-based conductive ink is Metalon HPS-021LV from Novacentrix. The HPS-021LV has a resistivity of 6.74 E-5 ohm-cm when the ink is cured at 125 degrees-C. There are several other manufacturers of conductive inks that are optionally used when printing conductive traces using the ink-printing mechanism 120 described in this disclosure.

The ink-printing mechanism 120 may include a nozzle or tip with an opening for the ink to flow through. The ink-printing mechanism 120 may be capable of having the tip replaced should a larger or smaller width line be required by the circuit.

Other commercially available conductive inks are capable of being printed using standard ink-jet printing techniques. These types of inks are typically based on nano-particles which allow the ink to be ejected from small holes characteristic of a standard ink-jet cartridge or piezoelectric nozzle. Here the conductive ink is optionally filled in an ink-jet cartridge and the PCB production apparatus 100 controls the release of conductive ink onto the substrate 105.

Movement of the head mount 110 relative to the table 104, is controlled by the controller 95 based on information contained in a digital model or image of a desired conductive trace geometry or circuit layout. Details of the circuit layout is often contained in an industry-standard Gerber file or any other type of file which supports the desired geometry of the conductive traces. File types may include electronic image files including bitmaps (BMP), JPEGs, GIFs and TIFFs to name a few. The position of the head mount 110 is optionally manually controlled by the operator via the controller 95.

Figure 6A:
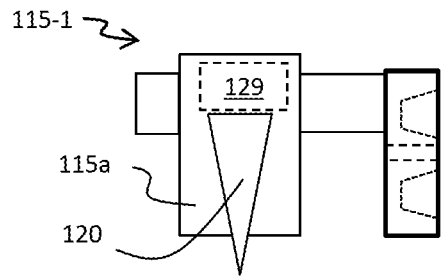
FIG. 6a is a partial schematic view of a function head of the present disclosure.
Figure 6B:
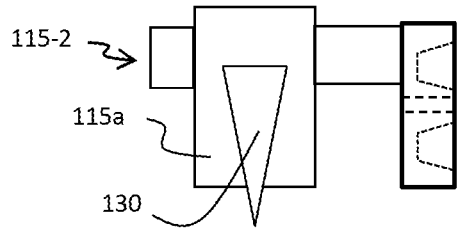
FIG. 6b is a partial schematic view of another function head of the present disclosure.
Figure 6C:
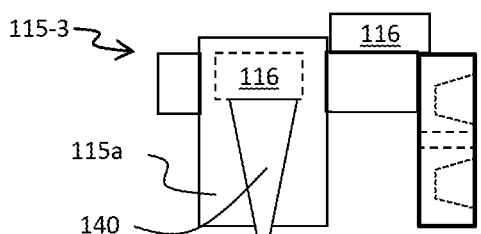
FIG. 6c is a partial schematic view of another function head of the present disclosure.
Figure 6D:
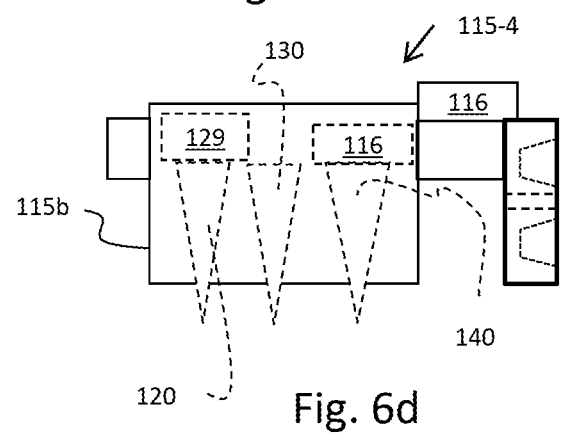
FIG. 6d is a partial schematic view of another function head of the present disclosure.
Figure 6E:
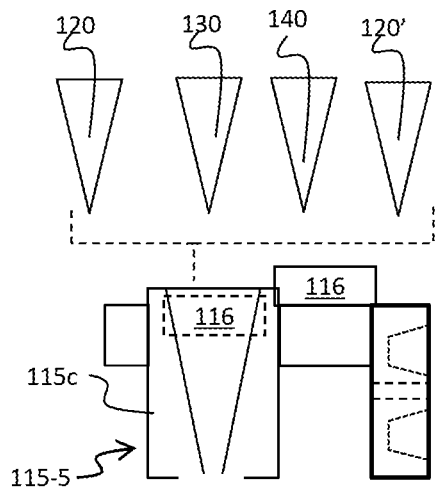
FIG. 6e is a partial schematic view of another function head of the present disclosure.

At any one time, embodiments of the function head 115 will contain at least one of the following PCB production mechanisms: the ink-printing mechanism 120 in a function head 115-1 of FIG. 6*a*, an epoxy-printing mechanism 130 in a function head 115-2 of FIG. 6*b*, and/or a pick-and-place mechanism 140 in a function head 115-3 of FIG. 6*c*. Alternatively, an embodiment of a function head 115-4 optionally has a function head module 115*b* which includes all or any combination of functions as shown in FIG. 6*d*. The function head module 115*b* is also optionally configured to include two functions instead of three. Alternatively, as shown in FIG. 6*e*, an embodiment of the present disclosure includes a function head 115-5 having a function head module 115*c* configured to be automatically or manually loaded with any of the PCB production mechanisms 120, 130, or 140 based on a desired operation and optionally under firmware control.

The function head 115 optionally has a rotation motor 116 (dashed line representation) to rotate the pick-and-place mechanism 140 or the pick-and-place mechanism 140 includes the rotation motor 116 (dashed line representation) to implement a rotation feature to properly position the electrical component onto the substrate 105. Another embodiment has the rotation motor 116 (solid line representation) mounted outside of the function head module 115*a*, 115*b*, or 115*c* so as rotate the whole function head module 115*a*, 115*b*, or 115*c*. Alternatively, the rotation motor 116 (dashed line representation) may be mounted on the function head module 115*a*, 115*b*, or 115*c* so as to rotate the function head module 115*a* or 115*b* relative to the function head 115-3, 115-4, or 115-5.

In an embodiment, the function head 115*b* includes the ink-printing mechanism 120 and the pick-and-place mechanism 140. The function head module 115*b* optionally has a print mechanism rotation device 129 (dashed line representation) to rotate the printing mechanism 120 or the printing mechanism 120 includes the rotation device 129 (dashed line representation) to implement a rotation feature to orient a print head as discussed below with regard to circuit trace printing. The print head rotation device 129 is optionally embodied as motor but other actuating devices such as solenoids, voice coils or pneumatic actuators operating off the vacuum source may be used. The embodiment of the function head module 115*b* having the rotation motor 116 (solid line representation) mounted outside of the function head module 115*a*, 115*b*, or 115*c* so as rotate the whole function head module 115*a*, 115*b*, or 115*c*, is also optionally adapted to print head orientation.

The function head module 115*b* may include several ink-printing mechanisms, one for each printing type, including mechanisms for conductive ink printing, insulator ink printing and epoxy deposition to name a few. The individual printing and deposition mechanisms may share common parts such as a syringe motor or pressure sensor to name a few. In one configuration, the function head module 115*b* allows substitution of one ink type for another, such as a case when a syringe that contains the conductive ink is replaced with a syringe containing the insulating ink. Having the flexibility to replace ink containers may reduce the total cost of the PCB production apparatus 100.

In some applications, it may be beneficial to have a complete inking mechanism for each type of ink and epoxy. For example, some ink and epoxy products are two-part systems containing a base material and a catalyst. In this case, a separate mechanism is optionally used to apply the two parts to substrate 105. The epoxy may include conductive and non-conductive forms. Conductive epoxy is optionally used for making an electrical contact between the component and the conductive traces. Non-conductive epoxy is optionally used for holding components and devices to the surface of substrate 105 and the conductive traces.

The epoxy is optionally thermally conductive for applications requiring the dissipation of heat. The epoxy will be dispensed using an epoxy-printing mechanism. The epoxy-printing mechanism may be of the same type as the ink-printing mechanism. The epoxy-printing mechanism may be of a different type than the ink-printing mechanism. For example, the ink-printing mechanism may include an ink-jet technology while the epoxy-printing mechanism may include a syringe printing process. Another example may have the ink-printing mechanism using a single tip dispensing process while the epoxy-printing mechanism optionally uses a dual tip dispensing system when a two-part epoxy is optionally used. These are not the only combinations of dispensing types but are used here to describe some possible variations in dispensing techniques.

Substrate.

The substrate 105 is optionally of any type of non-conductive material to which the conductive traces may be firmly attached and cured. The substrate material may be rigid or flexible, for example and not limitation, fiberglass boards, paper, plastic, wood, glass, cloth, or skin. Referring to FIGS. 5A and 5B, the substrate 105 is supported within the PCB production apparatus 100 using the table 104. The table 104 is typically a flat rigid plate which is attached to the PCB production apparatus 100. The table 104 is optionally made from a variety of materials including, but not limited to, plastics, metals and fiberglass board. The table 104 is optionally removable.

Table.

The table 104 optionally also includes a three-dimensional form onto which substrate 104 will be held. The form is optionally a shape that is cylindrical, hemispherical, conical or rectangular to name a few, other shapes are also possible. The limitation in the shape form is only dictated by the flexibility of the PCB production apparatus 100 to printing ink onto a complex structure.

The table 104 may be fixed in location relative to an apparatus frame 92 or may physically move in one or more dimensions under the control of the firmware in order to aid in the printing of inks and insulators. The PCB production apparatus 100 as shown in FIGS. 5A and 5B, is configured with table 104 movement along the y-axis relative to the apparatus frame 92. The y-axis motor 102a is attached to the lead screw 102b which moves table 104 when motor 102a is turned. When the y-axis motor 102a moves the table 104, the relative position to the head mount 110 to the table 104 is changed. The x-axis motor 101a is connected to the lead screw 101b and moves the head mount 110 along with the z-axis motor 103a and lead screw 103b relative to the frame 92 and the table 104 along the x-axis. The z-axis motor 103a drives another lead screw 103b to move the head mount 110 in the vertical direction along the z-axis relative to the table 104 and the frame 92. Having three axis of motion allows the head mount 110 to be positioned anywhere across table 104 and the substrate 105. An alternative embodiment of the PCB production apparatus 100 movably supports the table 104 to move in both in the x-axis and y-axis directions relative to the frame 92 and the head mount 110 to move in the z-axis relative to the frame 92. One skilled in the art will understand that there are numerous other combinations for three dimensional movement of the table 104 relative to head mount 110 and will appreciate that such configurations are within the scope of this disclosure.

PCB Production Files.

PCB production techniques produce conductive traces that follow a circuit pattern required for an electronic circuit with details defining the circuit pattern saved in an electronic file. The information contained in the pattern, also called the layout, may be recalled through the firmware from an electronic database and transferred to the apparatus controller 95 by the operator. In typical applications, the layout would be designed and saved using a separate Computer Aided Design (CAD) tool such as Cadence OrCAD, CadSoft Eagle and Mentor Graphics PADS to name a few. In an embodiment of the present disclosure, the CAD tool is optionally integrated as part of the PCB production apparatus firmware. The CAD tools may output the circuit layout in the form of native file types, Gerber, or some other standardized file type. For example, a Gerber file is a data file describing the physical layout of a single layer of a printed wiring board. These layout file types may also include Bitmaps (BMP), JPEGs, GIFs and TIFFs to name a few. The Gerber file is an industry standard used in the fabrication of chemically etched and mechanically etched printed wiring boards. To improve the readability of this document, the term Gerber will be used to describe any type of electronic file that describes the layout of a single layer of printed wiring board including vector and image based electronic files. However, it will be understood that the present disclosure includes any other file type defining a circuit layout when using the name Gerber unless explicitly limited to a Gerber file.

To completely describe a PCB, a set of Gerber files is often required including files that may define conductive and non-conductive features of the printed wiring board. These files may also include the physical location of individual components. In a multilayer printed wiring board, several Gerber files are required to describe each layer in the complete board. In general, the generic term "PCB file" will be used hereinafter to refer to a file describing circuit layout features directed to single or multilayer PCB to be manufactured using conventional methods, such as a Gerber file. The term "printed PCB file" will be used to refer to a file configured to control the PCB production apparatus 100 for producing a PCB using the method of the present disclosure for printing circuitry incorporating multiple layers using printing techniques.

Layout Translation Module.

Firmware of the controller 95 will optionally include a layout translation module (LTM) 152 to translate the PCB files into instructions for controlling a location of head mount 110 and each of the associated operations of the PCB production apparatus 100 including the ink-printing mechanism 120, epoxy-printing mechanism 130 and the pick-and-place mechanism 140. The LTM 152, implemented by PCB file translation-software, may reside external to the PCB production apparatus 100 or included as part of the firmware. When the translation-software is external to the PCB production apparatus 100, it may reside in a local personal computer, reside in a web-based tool or any other computing device capable of inputting electronic data files and performing the translation from layout of conventional PCB files to files for controlling the PCB production apparatus 100, hereinafter referred to as apparatus layout files (ALFs), which define the conductive and nonconductive geometries and traces to be produced by the PCB production apparatus 100. Taken a further step, the ALFs may subsequently be translated into apparatus control files (ACFs) which are commands for controlling the PCB production apparatus 100 to produce the PCB. The ACFs may be created "on the fly" from the ALFs to control the PCB production apparatus 100 in the manner that interpreters accept source code and effect program functions without first compiling source code.

In an alternative embodiment of the PCB production apparatus 100, the LTM 152 of FIG. 7 is included within a CAD tool that examines the conductive layers and creates a separate PCB file that includes the insulating geometries to separate at least two conductive layers. The generation of a PCB file containing the insulating geometries is optionally independent of the firmware of the PCB production apparatus 100 in this embodiment. In the embodiment of FIG. 7, firmware of the PCB production apparatus 100 includes the LTM 152 and imports PCB files, inter alia, Gerber files, for two or more conductive layers and determines the insulating geometries for the non-conductive ink. While the aforesaid embodiment of the present invention optionally includes firmware of the LTM 152 that interprets PCB files, inter alia, Gerber files, for two or more conductive layers, the firmware optionally further includes a module recognizing direct commands for the PCB production apparatus 100 to effect PCB creation based on files not requiring a translations and, instead, directly controlling the PCB production apparatus 100.

Design Rule Checker.

A Design Rule Checker module (DRCM) 154 is optionally employed to verify that the CAD file and/or printing instructions is compatible with control of the PCB production apparatus 100 and also within limits for printing conductive and non-conductive traces defined by limits of the PCB production apparatus 100, for example and not limitation, line width, line spacing and overlap. The DRCM 154 may also check the capability for printing conductive epoxy. In an embodiment, the DRCM 154 is included as an option in the CAD software tool. In another embodiment the DRCM 154 is included as part of the firmware so that the PCB production apparatus 100 can check files from CAD tools not specifically equipped to provide files for the PCB production apparatus 100.

Intersection Determination and Isolating Layers.

Figure 2:
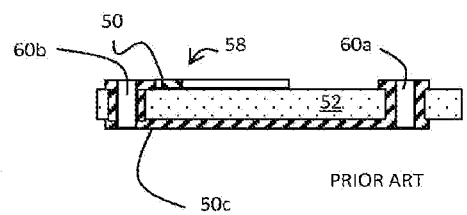
FIG. 2 is a side elevation view of a cross section of the PCB of FIG. 1C.
Figure 3:
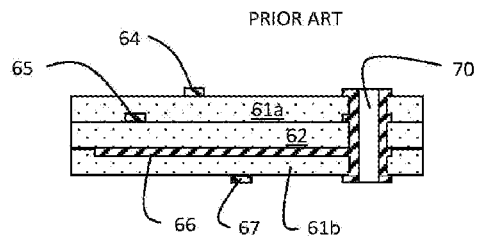
FIG. 3 is a side elevation view of a cross section of multilayer PCB.

In producing two-layer and multi-layer PWBs using the PCB production apparatus 100, it may be necessary to print insulating inks when two or more conductive lines must cross over each without making electrical contact. The insulating ink replaces the function of the built-in isolation achieved with substrate 52 shown in FIG. 2. In this case, there are at least two PCB files to describe each layer in the complete PCB. The LTM 152 has a function that will process the PCB files to identify the need for an insulating layer by locating a position of circuit traces of different layers that intersect when the PCB is viewed from the z-axis direction in order to generate an insulator geometry for electrically isolating intersecting conductive traces when producing the PCB using the PCB production apparatus 100.

Figure 8:
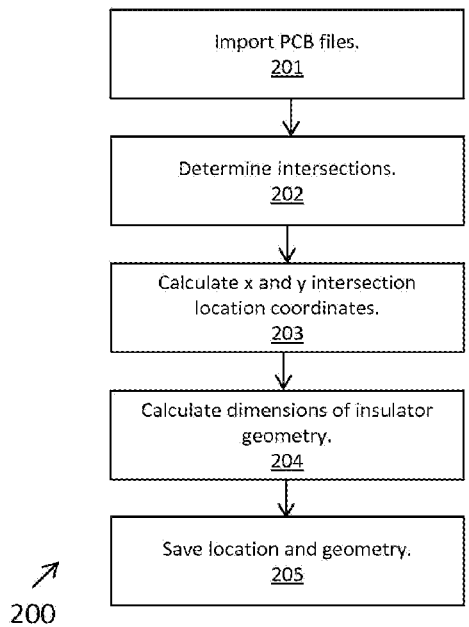
FIG. 8 is a flowchart of an embodiment of operations of a layout translation module of the present disclosure.

The LTM 152 optionally creates a list of locations where insulating ink is to be deposited onto the substrate 105 covering a first circuit feature and preventing electrical connection between the first circuit feature and those that cross over the first circuit feature. The list may include a width and length of the insulator geometry formed by printed insulating ink. Referring to FIG. 8, an insulator generation process (IGP) 200 is a multistep process which includes importing the PCB files 201, examining the PCB files for intersections 202, calculating x, y location coordinates for each intersection 203, calculating length and width of insulating geometry 204, saving location and geometry information 205 for later use by the PCB production apparatus 100 to print non-conductive ink.

When examining conventional PCB files which contain layout geometry for two or more different conductive layers in a PWB, it is important to identify lines from separate layers that would cross over, intersect or overlay is some way when printed with conductive ink absent intervening board layer(s) of conventional PWBs. A standard Gerber file includes information contained in the header followed by a description of the geometry. For example, a single trace would have the following text-based file stored in the format of a Gerber file.

% FSLAX25Y25*%
% MOIN*%
% IPPOS*%
% ADD10C,0.05*%
% LPD*%
X0Y0D2*D10*G1X84464Y145472D2*X113885D1*
X0Y0D2*M02*

The file begins with % FSLAX25Y25*% which describes the coordinate format of Leading Zero's omitted, Absolute Coordinates, 2 Digits in the Integer Part and 5 Digits in the Fractional Part. The % MOIN*% represents the units set to inches. % IPPOS*% sets the image to have positive polarity. The % ADD10C,0.05*% defines an aperture with D-code 10 as a 0.05-inch circle. The % LPD*% Start a new level with dark polarity. The X0Y0D2*D10* commands a move to (0,0) and select aperture D10. G1 command is for linear interpolation. The Command X84464Y145472D2 is a move to (0.84464", 1.45472"). Command X113885D1 is draw to (1.13885", 1.45472"). The X0Y0D2 commands a move to (0,0). The M02 is the end of file.

Figure 9A:
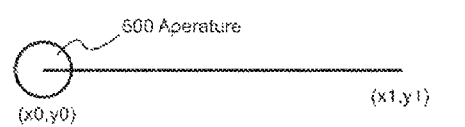
FIG. 9a is a diagram of a PCB trace defining method.
Figure 9B:

Referring to FIG. 9a, an example of a line defined by a Gerber file with two end points of a line are shown as (x0,y0) and (x1,y1). An aperture 500 is defined using the aperture definition in the Gerber file. The final geometry is created by moving the aperture 500 from endpoint (x0,y0) to (x1,y1). It should be noted that circular apertures are not the only types available in Gerber formats, squares, rectangles and almost any shape is optionally assigned to an aperture according to the 274X specification. Referring to FIG. 9b, the geometry of the first conductive trace 501 based on the information shown in FIG. 9a is shown. The first conductive trace 501 is the geometry that will be printed using either the PCB production apparatus 100 or conventional PCB manufacturing equipment. When Gerber files from two or more conductive layers are to be printed on a substrate, it is assumed that there will be overlap between portions of at least one pair of conductive traces.

There a several ways to determine overlap between traces from two or more layers. An imaging method is optionally used to convert the conductive trace 501 to a graphics or image file and compare the information contained in this image file to the information contain in another image file. Another method optionally employed is to mathematically determine the location of the overlap using mathematical techniques known in the industry which compare line segments for overlap or touching. Mathematical techniques must also include aperture inclusion wherein the width of the aperture that runs along the centerline of the trace including the extension beyond the endpoints of the line created by the radius of the aperture at each end.

Figure 9C:
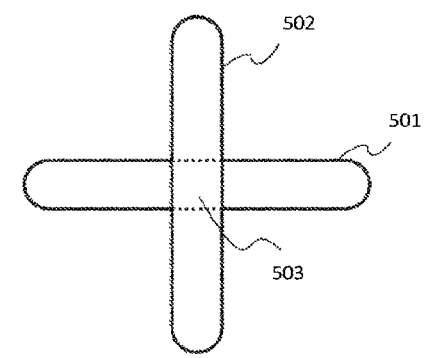
FIG. 9c is a diagram of a PCB traces.

Referring to FIG. 9c, in using the imaging method, the first conductive trace 501 is converted to an image file and the second conductive trace 502 is converted to an image file. In the operation 202 of FIG. 8, the imaging technique may be used wherein the images are aligned and a pixel by pixel comparison is made until first overlap 503 is determined. Alternatively, the mathematical technique may used wherein a conductive intersection is optionally determined by examining a vector representation of the first conductive trace 501 and the second conductive trace 502. In an embodiment of the mathematical technique, matrix calculating methods are optionally employed using determinants. It will be understood that other techniques for calculating the conductive intersection 503 are optionally developed including when conductive intersection 503 includes shapes such as square, rectangular and other complex geometries.

In operation 203, the coordinates of the intersection are determined based on the technique used to find the intersection. In an embodiment of operation 203, the area of the first overlap 503 is stored as another image file based on the total number of pixels and layout of the pixels. Another embodiment of operation 203 includes a technique to store the first overlap 503 in terms of a centroid, length and width. As not all overlaps are rectangular, as in the case when diagonal lines are present, the geometry of a complex overlap may be stored.

Insulating Geometry.

Once the overlap, i.e., intersection, is determined, operation 204 is effected wherein a new geometry for an insulator is created that matches or is slightly larger than the geometry of the overlap 503. When printing two conductive traces that should be electrically isolated, it is advantageous to oversize the overlap geometry to prevent the possibility that the two conductive traces will short together. Referring to FIG. 9c, an insulating patch 504 is designed to be slightly larger than first overlap 503. When printing conductive traces 501 and 502, insulating patch 504 will be printed between them to create a layer of insulation. This is likewise shown in FIG. 10a wherein the insulating patch 213 is depicted.

Figure 10A:
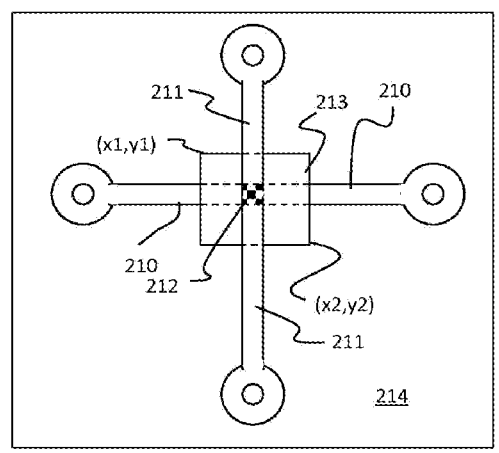
FIG. 10a is a plan view of a PCB including the insulating patch of the present disclosure.

Referring to FIG. 10a, it is optionally provided that an approximate area and location for the overlap be determined in order to calculate an appropriate size of the insulating geometry 213. As shown in FIG. 10a, the insulating geometry 213 is shown as a square with center xc, yc and associated width (x2−x1) and length (y2−y1). Insulating geometry 213 can also be represented by corner points (x1,y1) and (x2,y2). The insulating geometry 213 is not limited to square geometries and is optionally of any shape large enough to electrically isolate the conductive trace 210 from the conductive trace 211.

Creating Isolated Insulated Intersecting Traces.

Returning to FIG. 9d, the process to create insulating patch 504 starts with the geometry of first conductive trace 501 and geometry of second conductor 502. These geometries are optionally stored as part of a software tool that routes conductive traces onto separate layers. These routing tools create the layout geometries that will be converted to commands used by apparatus to print conductive ink. Another option would be to recall two Gerber files that contain the appropriate layout information for first conductive trace 501 and second conductive trace 502.

The insulator geometry operation 204 uses the overlap geometry determined using image-based techniques or mathematically techniques in operations 202 and 203. An example of the insulator geometry is the insulator patch 504 of FIG. 9d. In an advantageous configuration, the insulating patch 504 is configured using an oversize dimension that, in one embodiment, is at least 0.005-inch larger than the overlap geometry 503 however this is not a requirement as other oversize dimensions may be used. The actual size of the insulating patch is a function of the printing capability of the apparatus including print resolution for both the conductive and non-conductive inks. The sizing of the insulating patch is optionally automatically determined or input by the operator such as a manually introduced setting that the insulating patch to be 0.005-inch beyond the nearest point to the overlap geometry 503.

The creation of the insulator geometry of the insulating patch 504 is performed by the LTM 152 in operation 204 or is optionally performed in a software tool that routes the layout. Once the layout information for the insulating patch is determined, it is stored as an image file or as a Gerber file, for example purposes only as other known commercial standards for files defining multilayer circuit boards are optionally used by the PCB production apparatus 100 during the multilayer printing process. If the layout information is determined by the LTM 152, it is optionally used to directly control the printing-mechanisms in apparatus.

Creating Insulated Regions of Intersecting Traces.

Figure 10B:
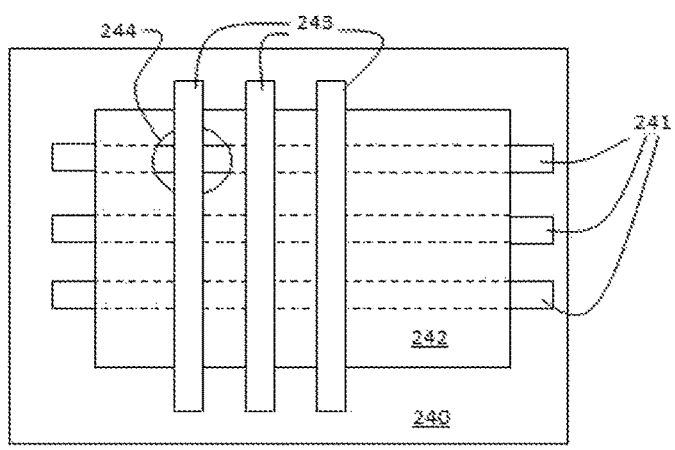
FIG. 10b is a plan view of a PCB including another insulating patch of the present disclosure.

Another form of insulating two conductive layers is to print an entire region of insulating ink between the two conductive layers. Referring to FIG. 10b, a first conductive layer 241 is first printed on a substrate 240. Insulating layer 242 is then printed on top of first conductive layer 241 to cover at least a portion of the conductive traces of first conductive layer 241. Second conductive trace layer 243 is printed on top of insulating layer 242. The geometry of insulating layer 242 is determined by examining the Gerber files of first conductive layer 241 and second conductive layer 242. In some cases, the geometry of insulating layer 242 may be optimized to reduce ink usage and time printing the non-conductive ink, or the insulating patch technique discussed above may be employed. In some cases, it is preferred to completely cover the substrate 240 with insulating layer 242.

Printing Insulated Intersecting Traces.

Figure 11:
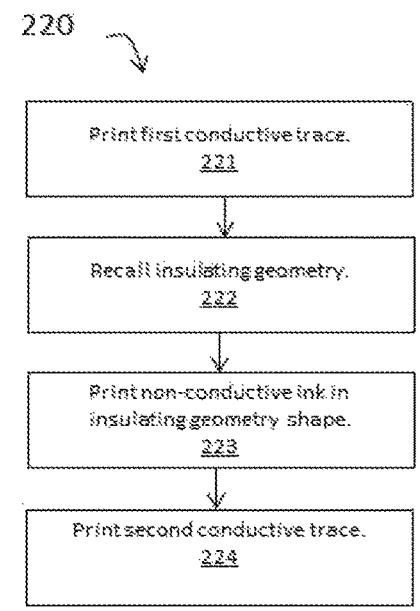
FIG. 11 is a flowchart of a circuit printing method of the present disclosure.

Referring to FIG. 11, a multilayer printing process 220 is shown for printing two conductive traces separated by an insulating layer shaped with a geometry that electrically isolates the two conductive lines. The multilayer printing process 220 starts with printing a 1st conductive trace in operation 221, followed by recalling the insulating geometry 222 which has been defined in operation 222, followed by operation 223 printing non-conductive ink in the shape of the insulating geometry 223 and lastly, printing 2nd conductive trace 224. The function head module 115b of FIG. 6d optionally includes two of the ink-printing mechanisms 120 respectively containing conductive and non-conductive inks in the same subsystem. Alternatively, the function head module 115a has a single one of the ink-printing mechanisms 120 with the conductive ink and non-conductive ink being exchanged during the printing process. In yet another alternative, the PCB production apparatus 100 will include the function head module 115c of FIG. 6e wherein two separate ink-printing mechanisms 120 may be automatically loaded and unloaded.

Figure 9D:
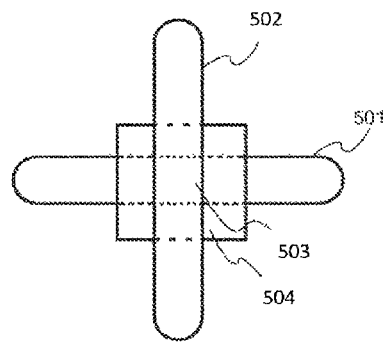
FIG. 9d is a diagram of PCB traces and an insulating patch of the present disclosure.

Referring to FIG. 9d, an embodiment of a process to print a PWB using the PCB production apparatus 100 starts with the first conductive trace operation 221 wherein the function head 115 is controlled to print the first conductive trace 501 on the substrate using conductive ink. Next, operation 222 controls the PCB production apparatus 100 to print insulating patch 504 using a non-conductive ink. Lastly, second conductive trace 502 is printed using a conductive ink in operation 224.

Referring to FIG. 10a, a first conductive trace 210 is representative of a first conductive layer as an output from a CAD tool, Gerber file or image file. The first conductive trace 210 is printed first on a substrate 214. A second conductive trace 211 is representative of a second conductive layer. The first conductive trace 210 and the second conductive trace 211 intersect, or overlap, at a conductive trace intersection 212. The conductive trace intersection 212 is calculated by the LTM 152, or if so configured, an external circuit layout tool. The PCB production apparatus 100 alternates printing of conductive ink for the conductive traces, 210 and 211 and non-conductive inks for the insulating geometry 213.

Creating Layer Connections.

Referring to FIG. 10b, when electrical connection between a portion of first conductive layer 241 and second conductive layer 242, typically at a location where a via hole is found using the drill file and/or the Gerber files, an opening in insulating layer 242 is optionally printed by not printing insulating ink in this region as discussed below. In this way, when second conducting layer 243 is printed on top of insulating layer 242, electrical connection is optionally made between first conductive layer 241 and second conductive layer 242.

Figure 1A:
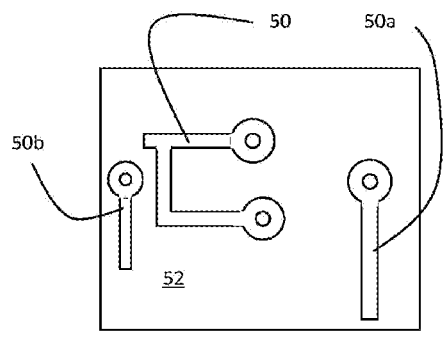
FIG. 1A is a top plan view of a PCB.
Figure 1C:
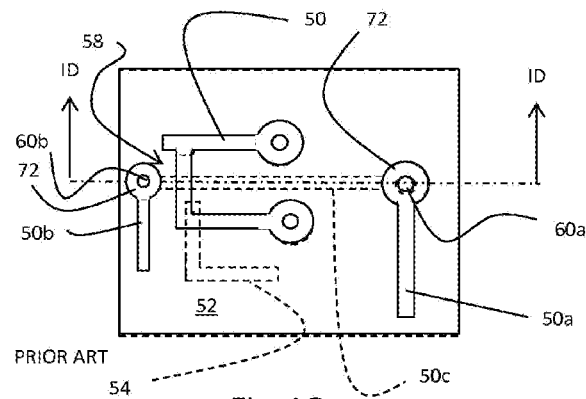
FIG. 1C is a top plan view of the PCB of FIG. 1a showing the bottom view of FIG. 1B in dashed lines.
Figure 1B:
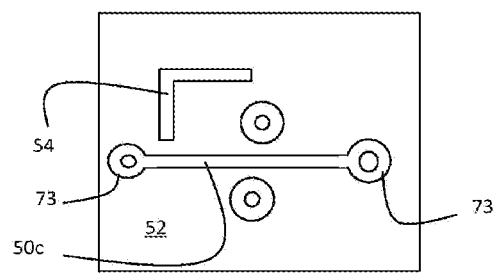

In printing two-layer and multi-layer PWBs using the PCB production apparatus 100, the need to print conductive connections between conductive traces arises. These connections replace the drilled vias, 60a and 60b, in a traditional PWB as described above in relation to FIG. 1c. In processing PCB files, the LTM 152 optionally creates a list of locations where conductive ink would overlap creating an electric connection between conductive traces of two or more conductive layers. CAD tools for layout of PCB's typically output a data file, referred as a drill file or Excellon drill file, that includes the two dimensional locations of holes that are used by the PCB manufacturer to create plated-through via holes. As shown in FIG. 1c, these vias are used to connect circuit features between multiple layers in a multilayer PCB. The LTM 152 optionally uses the data stored in the drill file to aid in the location of circuit connections where conductive ink is placed by the PCB production apparatus 100.

Typically optionally used by traditional PCB vendors, drilled via holes are often located at a center of a circular pad similar to the pads 72 of FIG. 1c. The individual pad information is contained in the PCB file for each conductive layer. For example, in the text file for Gerber extended 274X, a 0.1 inch diameter pad would be described using the following statements:

% ADD10C,0.1*%
X0Y0D2*D10*G1X58333Y155833D3*X0Y0D2*M02*.

For the first statement, AD is an aperture description, D10 is a circular aperture, C is a circle macro, 0.1 is a diameter of 0.1 inches. The second line lists a center of the pad at x=0.5833 inches and y=1.55833 inches. The information contained in this Gerber file is optionally compared to a second Gerber file and is optionally used to determine if two pads overlap and therefore should be connected in the final circuit without the need to examine the drill file. In addition, as drilled via holes are no longer required when printing conductive ink on a substrate using the PCB production apparatus 100, pad features are optionally eliminated or at least their diameters are optionally reduced during the layout process or after the layout process.

Figure 12A:
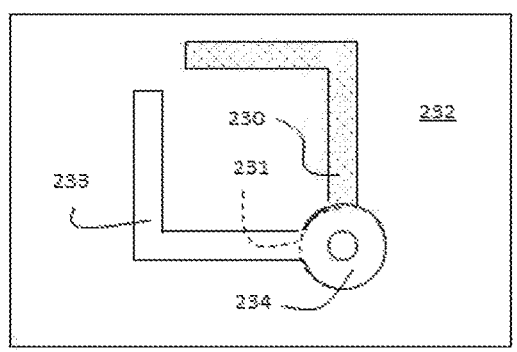
FIG. 12a is a plan view of a PCB including a trace connection of the present disclosure.
Figure 12B:
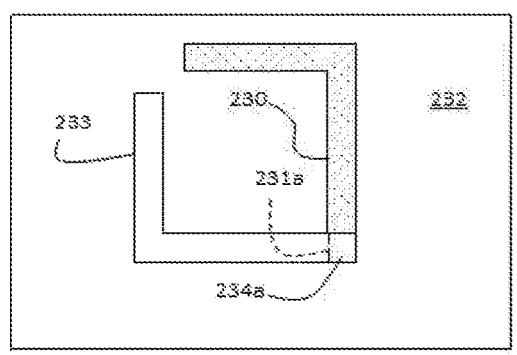
FIG. 12b is a plan view of a PCB including another trace connection of the present disclosure.

Referring to FIGS. 12a and 12b, a first conductive trace 230 which is included in a PCB file for one layer of a multilayered PWB is printed onto substrate 232. First conductive trace 230 includes a first conductive pad 231 (portion of outline shown in dashes). A second conductive trace 233 is from another PCB file for another conductive layer of the multilayered PWB. The second conductive trace 233 includes a second conductive pad 234. When examining the PCB files associated with these conductive layouts or when examining an electrical schematic for the intended circuit, or when examining the drill file, the LTM 152 first determines that the first conductive pad 231 is to make electrical contact to the second conductive pad 234, then the second conductive pad 234 is printed directly on top of the first conductive pad 231 as represented by the partial dashed outline of the first conductive pad 231.

Another method optionally effected by the LTM 152 is to combine the layouts of first conductive trace 230 and first conductive pad 231 and second conductive trace 233 and second conductive pad 234 into a combined conductive trace and print both sets of conductive geometries at the same time in which the layout would not need the conductive pads and a continuous configuration having the outline shown in FIG. 12b is produced.

Yet another method where there is no drill file but there is an image or a Gerber (or analogous type file) that shows the hole locations and the hole size the LTM is programmed to identify the location for the overlap between the two conductive layers. Another alternative operation includes the use of the pad geometries to not print the overlap area but instead print the diameter of the drill listed in the drill file. Although the total surface area printed between the two conductors is less using the drill file dimension, it suffices to provide and interconnection between layers.

In traditional multilayer PWB, a via hole is drilled through the entire stackup of conductive layers and substrates. To ensure the plating process adheres within the drilled hole, conductive circular pads are typically located on each conductive layer for each plated through hole to be drilled through thus allowing tolerance for the drilling alignment. In some traditional PWB applications, the via hole is only drilled through the layers that require direct electrical connection(s). These types of vias are called "blind-hole vias" and are typically more expensive to manufacture using traditional methods. Using the PCB production apparatus 100, printing the equivalent of a blind-hole via is easily created by only printing the electrical connection between those conductive traces. Using the PCB production apparatus 100, printing the equivalent of a blind-via would not add any additional cost to the printed PWB and is advantageous as it will reduce an amount of conductive ink that is to be printed by eliminating the typical circular pads, 231 and 234, from those layers that would have been used in a standard chemically etched PCB process. Instead, a configuration, as shown in FIG. 12b, results wherein the ends of the conductive traces, 231a and 234a, overlap to make a connection when the conductive traces, 230 and 233, cannot be printed in the same operation because of other overlapping contingencies which require the insulating geometry 213 of FIG. 10a.

Figure 13:
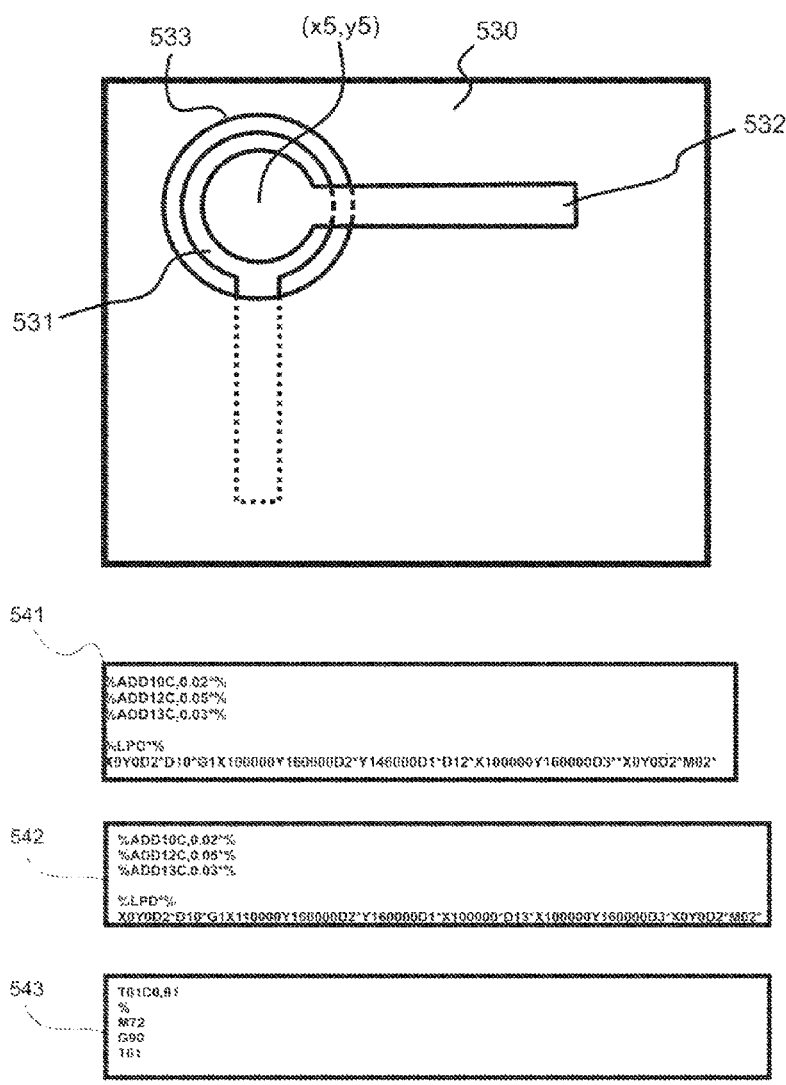
FIG. 13 is a plan view of a PCB including another trace connection of the present disclosure, and PCB file syntax for effecting PCB fabrication of circuit traces.

Software layout tools that generate Gerber files will also generate a drill file that contains information regarding plated-through-hole via connections between layers. Apparatus may use information in the drill file to determine the (x,y) locations where electrical connections are to be made and also where to create clearance holes in a non-conductive layer to allow these connections. Referring to FIG. 13, first conductive trace 531 is to connect to second conductive trace 532. The layout information of first conductive trace 531 is contained in a first Gerber file 541. The layout information for second conductive trace 532 is contained in second Gerber file 542. The via hole information, including center location (x5,y5), is contained in Drill File 543.

When printing conductive and non-conductive inks in order to connect first conductive trace 531 to second conductive trace 532 only on the area of via hole center (x5,y5), the process begins by identifying the (x5,y5) location of via hole using the drill file associated with the PWB. The second operation is to print first conductive trace 531.

The third operation in the process is to print insulating patch 530. Insulating patch 530 includes first clearance hole 533 which exposes a portion of first conductive trace 531 in the area of via hole center (x5,y5). Insulating patch 530 is optionally designed to cover all other conductive traces associated with the layer containing first conductive trace 531 or only a portion of other conductive traces associated with the layer containing first conductive traces. Alternatively, insulating patch 530 may contain other clearance holes associated with other connections between two conductive layers. Alternatively, insulating patch 530 can completely cover the substrate and all remaining conductive traces associated with the layer containing first conductive trace 531 with the exception of first clearance hole 533 which exposes a portion of first conductive trace 531 and any other clearance holes used to connect two layers.

The fourth operation in the process is to print second conductive trace 532 on top of insulating patch 530. As second conductive trace 532 overlaps first conductive trace 531 in the area of (x5, y5), there will be an electrical connection between first conductive trace 531 and second conductive trace 532. The diameter of first clearance hole 533 is optionally set to a nominal value determined automatically or entered by the user. Alternatively, the diameter of first clearance hole 533 is optionally determined using pad diameter information contained in Gerber file 541 and/or Gerber file 542. In one case, the diameter of first clearance hole 533 will be set to the largest diameter of pad connected to first conductive trace 531 or second conductive trace 532. In another case, the diameter of first clearance hole 533 will be set to a diameter larger than the largest pad connected to first conductive trace 531 or second conductive trace 532. In this case, the diameter of first clearance hole 533 is optionally oversized to take up printing tolerances while still exposing the conductive ink associated with first conductive trace 531 and second conductive trace 532.

Typically oversize diameters will be 10 mils larger than the largest pad connected to first conductive trace 531 or second conductive trace 532.

In an alternative embodiment of the PCB production apparatus 100, the LTM 152 of FIG. 7 is included within a CAD tool that produces the insulating patch with the required clearance hole. The CAD tool will output the geometry of the insulating patch as a data file including Gerber.

Ink Conservation.

To conserve ink, the GERBER file information may be used to create a framework of the original circuit trace. In this case, the translation software may find the center line or an edge line to print the conductive ink. By examining the GERBER file, the start and end points of a conductive line are optionally determined and the printed line width is optionally optimized to reduce the overall cost of the printed circuit.

Figure 14A:
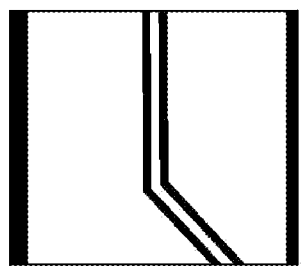
FIG. 14a is a plan view of a PCB including a circuit plane embodiment of the present disclosure.
Figure 14B:
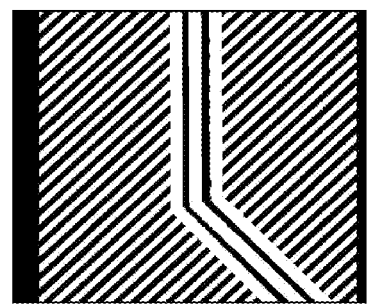
FIG. 14b is a plan view of a PCB including another circuit plane embodiment of the present disclosure.
Figure 14C:
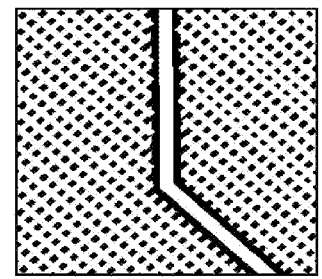
FIG. 14c is a plan view of a PCB including another circuit plane embodiment of the present disclosure.

Another way to conserve ink it to create a mesh in areas that were originally specified as solid conductive regions. For example FIG. 14a shows a original GERBER file having two large areas of solid conductor on either side of the conductive line. When using a chemically etched or mechanically machined printed wiring board, it is relatively easy to leave these large conductive areas in place as the original printed wiring boards are completely clad in copper. When printing conductive inks onto a substrate, it is faster and more economical to reduce the amount of ink printed onto the substrate. In this case, the LTM 152 will identify these large conductive regions and create a mesh that will be printed as a substitute. FIGS. 14b and 14c show two mesh equivalents that will be printed with conductive ink. It is important to note the configurations shown in FIGS. 14b and 14c, are not the only possible mesh configurations as there are numerous configurations that will provide the electrical equivalent to a solid conductor. In an alternative embodiment of the PCB production apparatus 100, the LTM 152 of FIG. 7 is included within a CAD tool that produces the mesh. The CAD tool will output the geometry of the mesh as a data file including Gerber.

Printing Order.

Figure 15:
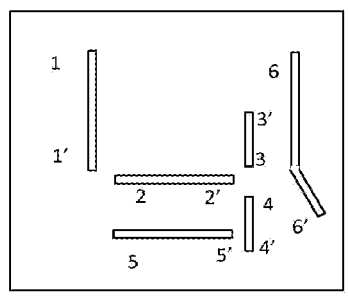
FIG. 15 is a plan view of a PCB having conductive traces thereon.

When printing inks, the function head 115 including the ink-printing mechanism 120 must move around the substrate under the control of the apparatus firmware. The LTM 152 analyzes the PCB file to create a configuration which is effective to move the function head with the minimum travel path. For example, FIG. 15 shows a typical circuit layout have 6 individual lines that need to be printed. The original PCB file may include the physical locations for endpoints of these lines but may not have listed the lines in an optimized order for printing using the ink-printing mechanism 120. The LTM 152 re-orders the lines to increase printing speed and decrease the total travel path for two or more lines. In one optional configuration, the LTM 152 will group endpoints with the nearest proximity. For example, FIG. 15 shows the six lines with endpoints labeled. For example, line 1 has endpoints 1 and 1'. The LTM 152 groups 1' and 2 as being physically near each other. This group may also include endpoint 5. Another grouping may include endpoints 2', 3 and 4. Another group may include 4' and 5'. Movement of the ink-printing mechanism 120 will be controlled by an optimized ordering of the endpoints. For example, assume that the last position of the ink-printing 120 is near endpoint 1. One solution is to begin by printing line 1-1', then 2-2', then 3-3', then 4-4' then 5'-5. The LTM 152 optionally uses the length and angle of the individual lines to minimize the total path traveled. The LTM 152 optionally optimizes the traveled path with relation to acceleration of the ink-printing mechanism 120 that is optionally used. The optimized travel path is not limited to the ones discussed here as there are other algorithm that is optionally used to optimize the travel path. For example, the optimization may include the starting point or "home" location of the ink-printing mechanism 120. A similar optimization process may be used for the epoxy-printing mechanism 130, pick-and-place mechanism 140 and protective-ink mechanism 120. A different ordering and path optimization is optionally used for each mechanism, 120, 130, or 140. For example, the pick-and-place mechanism 140 requires that the mechanism 140 moves to a known location to pick up the components to be placed. In this case, the optimized travel path may be different than the other mechanisms as the mechanism 140 will need to be returned to the component feed mechanism 122 for picking up the individual components.

Component Placement Order.

In the PCB production apparatus 100 that optionally includes a pick and place function, the function head 115 would include the pick-and-place mechanism 140. In one configuration, the pick-and-place mechanism 140 includes a vacuum pickup, vacuum tip, and/or suction cup, for temporarily holding an electrical component while the component is positioned onto the substrate. The pick-and-place mechanism 140, either in part or whole, may be detachable from the function head 115 in order to share common components with the ink-printing mechanism(s) 120. In the preferred configuration, the pick-and-place mechanism 140 is located adjacent to the printing mechanism(s). The function head 115 optionally has a rotation motor 116 to rotate the pick-and-place mechanism 140 or the pick-and-place mechanism 140 includes the rotation motor 116 to implement a rotation feature to properly position the electrical component onto the substrate 105. The minimum rotation capability would be 0-degrees and 90-degrees but other rotation angles may be possible. In one embodiment, or the function head 115 has the rotation motor 116 arranged to rotate the electrical component prior to placement on the substrate. Another embodiment has the rotation motor 116 arranged to rotate the entire function head module 115a.

The function head module 115b optionally includes a motor, a solenoid, field coil or other controllable actuator, or multiples thereof, set a distance between a selected one of the mechanisms 120, 130, or 140, and the table 104. For example, a solenoid may be used to lower a height of the ink-printing-mechanism 120 such that the insulator-printing mechanism 120', pick-and-place mechanism 140 and epoxy-printing mechanism 130, will maintain a larger distance to the surface of the table 104.

Heater.

The printing table 104 optionally includes the heater 118 embodied as a heating element to elevate the temperature of the substrate 105 in order to accelerate curing of inks and epoxies. For example, the Novacentrix HPS-021LV has a cure time of 30 minutes when the ink is held at 125 degrees-C. The apparatus-firmware would control the heating element in the printing table. The temperature control optionally employs a temperature sensor 118s which is monitored by the controller 95 for effecting correct curing of epoxies and inks.

Ink-Flow Sensor.

An ink-flow sensor 119 is optionally used to measure when the ink has begun to flow and has reached the substrate. The sensor 119 is optionally optically-based or measurement based. In an embodiment, a measurement based sensor 119 measures a resistance and/or capacitance between an ink dispensing tip and the substrate 105. For example, the dispensing tip is optionally metallic and with a sensor connected between the tip and the substrate, a relative change in the resistance and/or capacitance is measured with and without ink flowing between the tip and the substrate.

Component Placement.

The pick-and-place mechanism 140 is optionally integrated in the PCB production apparatus 100 and operates in conjunction with a component feed mechanism 122. Referring to FIG. 4, the component feed system optionally includes a "tape and reel" strip mechanism 122a. The strips often contain a set of equally-spaced holes along the side of the tape for locating the components and pulling, or pushing, the tape into the apparatus.

Referring to FIGS. 16a-16h, an alternate configuration for the component feed mechanism 122 is a tray system 122b wherein electrical components are held in a component tray and components are manually loaded into a tray or slot and the components are picked up by the pick-and-place mechanism 140 for placement onto the substrate 105. When using a tray system, the components are optionally ejected or dropped from a hole or slot located at the bottom or side of the tray. The hole or slot location is pre-determined so the pick-and-place mechanism 140 has knowledge of the component location for picking up the component. The tray system 122b may include individual trays containing a cavity or hole that is sized to the electrical component. The individual trays have an outer dimension that is common.

Figure 16A:
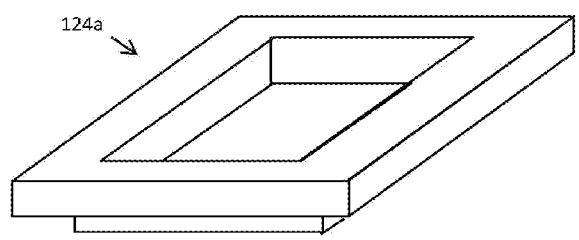
FIG. 16a is perspective view of a component tray of the present disclosure.

Referring to FIG. 16a, an example of a component tray 124a is shown. The tray material is optionally plastic, metal or any other suitable material that can support holding the component in place. It is expected that the tray has a bottom for holding the components. The bottom could be closed or have an opening that could aid in locating the tray within the apparatus. The depth of the component tray 124a is approximately equal to the height of the component. This would allow the top of all the components to be located at approximately the same position when placed within the apparatus making it easier for the pick-and-place mechanism 140 to pick up the component. The top hole opening in the component tray 124a would correspond to the size of the component. The individual component trays 124a would be inserted into the apparatus along a tray support frame 125 as shown in FIGS. 16b-16d. The spacing between rails of the tray support frame 125 is approximately equal to the tray width. A lip or edge may be included as part of the tray support to properly position the tray along the center of the tray support frame 125. The centers of the trays 124a will be known to the apparatus so that the pick-and-place mechanism 140 can pick up a component. The tray or trays 124a may be fed into the apparatus as part of the feed-mechanism.

In another configuration, a tray or trays 124a have a location that is fixed once the trays are inserted into the apparatus. In another configuration, a tray 124a may be ejected from the component feed mechanism 122 once the component is removed from the tray 124a. In this configuration a next tray 124a is optionally moved into the location of the tray 124a that was previously ejected. This configuration allows the pick-and-place mechanism 140 the option to pick up components in the same location. FIG. 16d shows a configuration for trays 124b which include a key arrangement. The key is an interlocking mechanism for aligning the trays 124b along the tray support 125. The trays, 124a or 124b, are optionally interconnected prior to placement into the apparatus.

Referring to FIGS. 16e and 16f, in an alternative configuration may have the trays be assembled as one part as a multi-cavity tray, 124c and 124d. This allows the components of a specific circuit to be pre-assembled and inserted as one common unit into the component feed mechanism 122. The trays are optionally held in place with a spring loaded mechanism similar to a desk stapler wherein a spring loaded mechanism pushes the trays to the front of the component feed mechanism 122, for example, a front of the tray support frame.

Referring to FIG. 16e, the multi-cavity tray 124c includes several elevated walls creating separate compartments to place individual components or groups of components. The example of the multi-cavity tray 124c shown has three compartments but may include more or fewer compartments. The compartments may be of equal size or are optionally sized to accommodate the variety of different package sizes of modern electronic components including resistors, capacitors, diodes, transistors and integrated circuits to name a few. FIG. 16f shows a multi-cavity tray 124d wherein heights are made unequal to accommodate differences in heights of various parts. For example, the height of a 0603 surface mount resistor would be 0.45 mm and the height of a 1206 resistor would be 0.6 mm. The compartment height may be optimized for manual insertion of the components by sizing the heights to fit the component height relative to the operator's finger sliding the part into the compartment. In one example, it may be easier to slide the component into a corner when the compartment height is slightly lower than a top surface of the multi-cavity tray, 124c or 124d.

In contrast to tray 124a, the multi-cavity tray, 124c or 124d, optionally has one or more sides open to aid the operator in placing the parts into the multi-cavity trays, 124c or 124d, which are shown as having one open side for exemplary purposes and are not so limited. The operator may manually place a part into the multi-cavity trays, 124c or 124d, and slide the component into a corner of the multi-cavity trays, 124c or 124d. Based on a location of a corner of tray 124a, or if more than one compartment, corners of the tray, 124c or 124d, the CMCM 127 is able to position the pick-and-place mechanism 140 near an appropriate corner in order to pick up the component. The operator may enter a location of each component into a table displayed on a computer screen or other visual interface device. The preferred location of the component on the tray is optionally determined by the CMCM 127. In this case, the CMCM 127 will display one or more of component identification, the associated compartment location, component orientation, and compartment corner for positioning the component. When guided by CMCM 127, there may be an ideal tray location for each part which improves the speed of the pick-and-place operation. For example, if the printed circuit includes a resistor located in the bottom region of the circuit and a capacitor in the upper region of the circuit, the ideal location for the resistor would be at the lower portion of the tray and the capacitor at the upper region of the tray. In this way, the movement of the pick-and-place mechanism 140 is controlled to reduce a total length of movement.

Referring to FIG. 16f, a tray 124e may also include a guide that allows a more accurate alignment of the component as it is pushed into the compartment. An example of the tray 124e is shown and has a channelized compartment that becomes narrower near the top. If a component is placed into the compartment at the bottom and then pushed up, either by a finger or other automated device, as the part moves up into the compartment, the component will be properly positioned at the top of the compartment. It is noted that an actual orientation of the tray 124e is in the horizontal plane, the discussion of compartment and tray configuration is relative to the figures of this document. It is understood that components come in a variety of sizes and shapes so it is expected that this channelized approach would not be able to accommodate all components. In this case, more than one channel is provided for the tray system.

In most integrated circuits having multiple pins, the package includes a marked feature to highlight the location of one of the pins, typically pin 1. FIG. 16h shows a typical package of an integrated circuit having 14 pins. Pin 1 is clearly marked with the "dot" located near pin designated as pin 1 for this package. Referring to FIG. 16i, an embodiment of a tray 124f includes a mark that indicates how the component should be loaded into the tray. For example and not limitation, the tray 124f includes a "dot" to be used to properly locate the associated "dot" on the package of the integrated circuit. The operator is optionally guided by the CMCM 127 as to how the component should be positioned in the tray. This is optionally provided by the aid of a graphical image or a text based description of the component location on the display.

For components with two terminals, such as diodes, the "dot" convention is typically not used. In this case, components manufacturers rely on a variety of different marking schemes to describe the direction of current flow from anode to cathode. When placing this type of device onto a tray, an identifiable mark is optionally placed on the tray to aid the operator as to the proper orientation for the component. One such mark is optionally a typical schematic symbol for a diode. The CMCM 127 may also provide a graphical image or text based description of the proper orientation for the component when placed in the tray.

To eliminate the need for accurately placing a component into a tray for pickup by the pick-and-place mechanism 140, or when improved accuracy is needed when placing a component onto a substrate, optionally provided is the imaging device 108, such as a camera, for providing the CMCM 127 with a method to "visually" identify a component's orientation and offset in order to rotate the component prior to placement onto the substrate 105 or to offset the component when placing the component on the substrate 105. The imaging device 108 is optionally located above, below or to the side of the component in the tray. The imaging device 108 is optionally located separate from the tray and the pick-and-place mechanism 140 will pick up the component from the tray and then move the component into the visual field of the imaging device 108. In this case, the imaging device 108 is optionally located above, below or to the side of the component as the pick-and-place mechanism 140 moves the component into the field of view of the imaging device 108.

An embodiment of PCB production apparatus 100 has a camera system as the imaging device 108 placed adjacent to the tray pointing upward. The pick-and-place mechanism 140 picks up the component from the tray and move the component over a camera lens. The camera image is passed to an algorithm to detect edges and/or a center of the component. Any rotation of the component relative to a desired position on the substrate 105 is corrected to within a given tolerance by the PCB production apparatus 100 prior to placement on the substrate 105. The pick-and-place mechanism 140 is optionally capable of rotating the component as discussed herein with regard to the rotation motor 116. In an advantageous embodiment, the pick-and-place mechanism 140 can rotate the part by at least 90 degrees. More preferably the pick-and-place mechanism 140 can rotate the part by at least 180 degrees. Even more preferably the pick-and-place mechanism 140 can rotate the component over a 360 degree angle. The camera is optionally any relatively low cost camera such as the LinkSprite JPEG 2MP Color Camera. As most cameras have a long focal point, a macro lens is optionally placed over the lens of the camera system in order to be able to focus the camera on the component which can be fairly close to the imaging system.

In another embodiment of the present disclosure, the operator manually places components onto the tray and then the pick-and-place mechanism 140 picks up the components and moves them to a separate location or "holding area" for temporary storage until they can be placed on the substrate 105 at a later time. One benefit to this action is that the operator may place all the necessary components into the apparatus during one step in the total print and assembly process. For example, by placing all the components into the PCB production apparatus 100 during the initial phase of the operation, all printing and component assembly can occur without any further intervention by the operator. Another benefit for the implementation of a holding area is to reduce the complexity of the tray system which optionally allows for a tray with a single compartment. Another benefit to the holding location is that a tape-and-reel system is optionally added to PCB production apparatus 100 where the tape and reel system only requires a single reel handling mechanism.

For the pick-and-place mechanism 140, the LTM 152 may also create a list of an order for which the components would be placed onto the substrate. The list may be provided to the user prior to inserting the components into the PCB production apparatus 100. In this way the components may be inserted in the optimized order for facilitating the pick and place process. As another option would allow the user to enter a list of components in an order in which the user inserted the components into the PCB production apparatus 100. The component mounting control module (CMCM) 127, implemented by the controller 95 and shown in FIG. 7, uses this list and the information provided by the LTM 152 to pick up the components. The CMCM 127, based on the location and order of the components loaded into the apparatus, optionally optimizes an order in which to pick up the components to improve throughput of the pick-and-place process. Another option is to provide an electronic file that contains an order of the components based on a pre-determined order. For example, if the components are assembled into a tray or other holding mechanism, the order of the components in the tray is optionally contained in a electronic file which is optionally used by the CMCM 127. The optimization algorithm of the pick-and-place process is optionally embodied in the LTM 152 or the CMCM 127.

One Layer Component Positioning.

In a standard PCB process using two or more conductive layers, it is possible to place and solder components to the outermost two layers on the PWB. As there is at least one insulating layer between these conductive layers, components are placed at or near the same (x,y) coordinates so there could be a some amount of overlap between the components without interfering with each other. When using PCB production apparatus 100, all components are placed on one layer of the substrate. For PCB production apparatus 100, the components are on one side and must be properly positioned so there is not overlap between the components and their respective pads.

Figure 21:
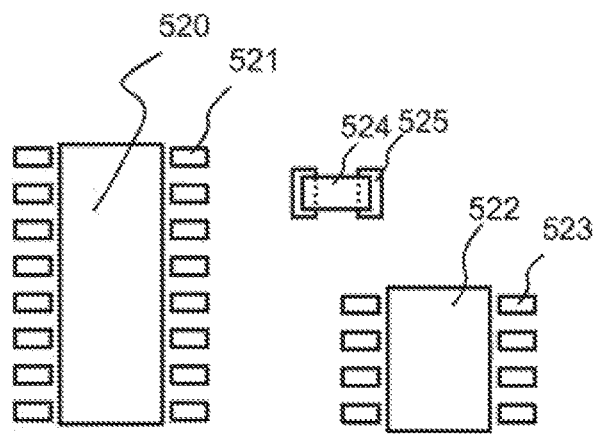
FIG. 21 is an illustration of standard component pad arrangements.

Referring to FIG. 21, first component 520 having at least one first connection pad 521 and second component 522 having at least one second connection pad 523 and third component 524 having at least one third connection pad 525 are positioned so there is no overlap between components and pads. Not shown in FIG. 21 are leads coming from first component 520 and second component 522 that lay on top of the pads. In one method embodiment, the LTM 152 locates the connection pads of all components on the conductor layer that is printed directly on the substrate as this will guarantee the component leads will have a flat and uniform surface during the pick-and-place operation of PCB production apparatus 100. The LTM 152 functions to avoid other conductive traces and insulating layers interfering with properly positioning the component leads on the connection pads during the pick-and-place operation.

In an embodiment of the LTM 152, conductive traces are positioned to run under the components and these conductive traces will be printed on the same conductive layer as the connection pads. In cases where it is expected that the PWB will exposed to the environment, the LTM 152 will automatically create a PCB file, for example and not limitation, a Gerber file, that will include a non-conductive pad to completely cover the conductive line that is printed under the component so that the conductive line will not oxidize when exposed to the environment. The components and associated connection pads are spaced far enough apart so there is no overlap while also providing space for connecting conductive traces. For example, spacing connection pads by at least 30 mils will allow at least one conductive trace to be routed between two components assuming that a printed conductive trace has a minimum width of 10 mils and the spacing between conductive elements is a minimum of 10 mils on either side of a conductive line. The LTM 152 follows guidelines set for component spacing which may include using a default or user-generated value for the component spacing.

In an alternative embodiment of the PCB production apparatus 100, the LTM 152 of FIG. 7 is included within a CAD tool that produces the layout with the required spacing for the conductive traces and pads. The CAD tool will output the geometry of the conductive layer as a data file including Gerber.

Extruder.

PCB production apparatus 100 optionally includes a plastic-extruder 123 for printing a plastic housing over the substrate. In one configuration, the plastic-extruder 123 is part of the function head 115. The plastic-extruder 123 is similar to 3-D printers available on the commercial market. The plastic-extruder 123 is optionally used to fabricate the substrate on which the conductive traces and components are placed. Printing the substrate allows for a variety of complex three dimensional shapes to be fabricated and also provides a more accurate placement of the components and printing the conductive and non-conductive traces as the same apparatus head is used for all types of material printing.

The outer surface of a complex three dimensional shape or form can be modeled and included as part of the printing and assembly process. The surface model would be used to position the ink-printing mechanism over the substrate. The surface model can be an electronic file that is used by the LTM for the printing and assembly process. The PCB production apparatus 100 may include an integrated surface scanner or digitizer, referred here as the surface-scanner, used to measure the three dimensional substrate and/or three dimensional substrate-form in order to create a model of the surface contour for any three dimensional object.

Protective Coating.

PCB production apparatus 100 may also have a mechanism for printing a protective coating over the surface of the circuit. In some applications, it may be important to protect the surface from scratches. In this case, a protective-ink mechanism 120 is included in PCB production apparatus 100, and may be part of the function head 115. Some protective coatings, such as the commercially available "Humiseal", can provide a conformal coating and shield against moisture, humidity and chemicals. These coating materials may be of type acrylic, polyurethane, silicone to name a few.

Camera.

PCB production apparatus 100 optionally includes the imaging device 108 embodied as a camera for identifying to orientation of components used during the pick-and-place process. For example, there may be a slight rotation of the parts in the component holder and when the pick-and-place mechanism 140 picks up the component, the camera is optionally used by the CMCM 127 to identify if the component is properly positioned for placement onto the substrate.

Conductive Substrate.

In addition to non-conductive substrates, the substrate material is optionally electrically conductive, semiconductive or metallic. When using these types of conductive or partially conductive substrates, the PCM 128 would first print a layer of insulating ink prior to printing the electrically conductive circuit traces using conductive ink. Substrates that are metallic and electrically conductive are optionally used to improve the thermal dissipation of high power electrical components and assemblies such as high power transistors and light emitting diode (LEDs). Printing a thin insulating layer between the electrically conductive circuit traces and the substrate may substantially improve the thermal performance of the circuit where excessive heat generated by the electrical components is transmitted through the thin layer of insulating material to the metallic substrate and dissipated away from the components. The technique of printing a thin layer of insulation ink over a metallic substrate would also be useful in applications that do not require high thermal dissipation but optionally uses a high strength substrate.

Substrate Positioning.

As discussed above, the PCB production apparatus 100 optionally includes a substrate-positioning/holding mechanism (SPHM) 121 to aid the operator in properly positioning the substrate 105 onto the printing table. The SPHM 121 may be a simple cross hair or grid located across the surface of the printing table. The SPHM 121 may be a raised edge or a combination of raised edges in which the operator can push the substrate 105 into the proper location known to the PCB production apparatus 100. The SPHM 121 may be useful to identify a common point for the PCB production apparatus 100 to use as an absolute reference to the circuit geometries that will be printed. The SPHM 121 is optionally removable and placed within the PCB production apparatus 100 once the substrate 105 is properly positioned. The SPHM 121 is optionally an optical-based or sensor-based sub-system to automatically locate edges of the substrate 105 once the substrate 105 is placed on the printing table. In this case, the position of the substrate 105 is optionally arbitrary and the PCB production apparatus 100 will automatically locate the substrate 105 on the printing table.

The PCB production apparatus 100 may include the SPHM 121 to temporarily hold the substrate 105 in place during the printing and assembly process. The substrate-holding mechanism 121 is optionally clips, weights or any object capable of temporarily holding the substrate 105 in position. The substrate-holding mechanism 121 may be a vacuum based sub-system which is optionally activated once the substrate 105 is properly positioned onto the printing table.

Substrates are not limited to planar, or flat, geometries. The substrate 105 can also be any three dimensional object which would support the conductive ink and/or associated circuit components. Any complex surface geometry is modeled and included as part of the printing and assembly process. The surface model would be used to position the ink-printing 120 over the substrate 105. PCB production apparatus 100 may include an integrated scanner or digitizer, referred to herein as the surface-scanner as one of the imaging devices 108, which is used to measure the three dimensional substrate 105 and/or three dimensional substrate-form in order to create a model of the surface contour for any three dimensional object.

Conductive Ink Printing Using Channels.

When printing conductive inks using the ink printing mechanism 120 embodied as a syringe, inkjet, piezoelectric or other means of dispensing conductive inks onto a substrate 105, it may be desired to layer the ink in order to build up enough cross section for use in circuit applications requiring high electrical current. In order to constrain conductive traces to a narrow width while providing a thickness to the total cross section of the printed conductive line, an initial printing process using non-conductive inks provide support during the layering of the conductive ink. Referring to FIG. 17a, the support process begins with the PCM 128 printing non-conductive material 135 on one (not shown) or both sides of a conductive circuit line 136 which is next printed. The non-conductive material 135 creates a channel for conductive ink 136. Referring to FIG. 17b, printing non-conductive material 135 is useful when two conductive lines 136 are in close proximity and the non-conductive material 135 prevents an electrical connection, or "bridge", from occurring between the two conductive lines 136. The process for FIG. 17b implemented by the PCM 128 optionally starts with printing one conductive line 136, then the non-conductive material 135, then the second conductive line 136. The process in FIG. 17b could also start with printing the non-conductive material 135 first, and then by printing the two conductive lines 136.

Conductive Ink Printing without Drying the Print Surface.

When printing conductive inks using techniques such as syringe printing, inkjet printing, piezoelectric printing and others, it is important that the ink is not allowed to dry at or near the interface where the ink leaves the printing mechanism and the air. Often, a printing process of the PCM 128 moves enough material to prevent clogging of the printing mechanism 120 or epoxy printing mechanism 130 but in applications where the printing mechanisms, 120 or 130, must move across a large distance, it is possible that the ink may dry at the air interface. One way to prevent drying would be to temporarily cover or cap the printing mechanism, 120 or 130 until the mechanism is at or near the desired printing site. Another technique would be to have a wiping mechanism that wipes a surface of the printing mechanism, 120 or 130, and removes dried ink from the printing mechanism, 120 or 130. The wiping action could include a moist surface to wet the dried ink enough to become fluid. It is known that many conductive inks, including silver nanoparticle inks, are water based. In this case wiping the printing mechanism, 120 or 130, with a damp sponge, cloth or other material prevents the printing mechanism, 120 or 130, from becoming permanently clogged. Thus, an embodiment of the PCB production apparatus 100 optionally has a clog prevention device 138 including one, or both, of a wiping mechanism or capping mechanism, which is controlled by the PCM 128.

Another embodiment of a method optionally employed to prevent the printing mechanism 120 from becoming clogged and implemented by the PCM 128 is to reduce the time between printing and not printing. In this case, the conductive traces are optionally printed in a preferred sequence in order to minimize the time when the printing mechanism is not printing. In a typical application, the printing mechanism's printing surface may have a dimension less than the circuit line dimension thus requiring the printing mechanism 120 to make several passes over the circuit in order to complete the circuit. For example, FIG. 18a shows a circuit with two lines having vertical and horizontal sections of lines. The left line has end points EP1 and EP2. The right line has end points EP3 and EP4. For this example, assume that the printing mechanism 120 is an inkjet cartridge with a set of holes arranged in a linear column. The holes eject droplets of ink under the control of the PCM 128. FIG. 18a shows an example of the set of holes PH1. There are numerous options for printing the lines including printing across the horizontal or printing in the vertical. FIG. 18b shows an example of horizontal printing where the printing mechanism 120 is moved horizontally across the substrate 105 and prints ink only where conductive traces are desired. In this case, the shaded areas near end points EP1 and EP3 show the ink deposited from the first pass of the printing mechanism 120 across the substrate 105. In this example, the printing mechanism 120 is moving from left to right, a top portion of line EP1-EP2 would be printed first and as the printing mechanism continues along the horizontal path, the top portion of line EP3-EP4 would be printed next. To continue the printing process, the printing mechanism would be moved down the line and the process would repeat either moving the printing mechanism from right to left, reversing the printing direction, or returning the printing mechanism 120 to the left side and repeating the printing process as before.

If the horizontal spacing between the upper ends of lines EP1-EP2 and EP4-EP4 are too far enough apart, it may be possible that the ink would dry on the surface of the printing mechanism 120 creating a condition of clogging the holes in the printing. It would then be difficult to print the top of line EP3-EP4. In this case it may be optionally used to wipe the surface of the printing mechanism 120 prior to printing line EP3-EP4 or cover the printing mechanism 120 between the printing of line EP1-EP2 and line EP3-EP4 using the clog prevention device 138.

An embodiment of a method of printing directed to address ink drying examines the circuit and prints the circuit in a path that minimizes dead time between activating the printing mechanism 120. For example, FIG. 18c shows a shaded area of completely printing line EP1-EP2 before moving to line EP3-EP4. In this case, the spacing between end points EP2 and EP4 is much closer in distance than the spacing between end points EP1 and EP3 which would result in a less likely chance that ink on a surface of the printing mechanism 120 dries and clogs the printing mechanism 120. Optimal line spacing is very dependent on a speed of the printing mechanism 120 as it moves across the substrate 105. This spacing is dependent on an amount of ink that is ejected from the printing mechanism 120. This line spacing is dependent on the time it takes for the ink to dry at the printing mechanism 120. In a typical application using a commercially available C6602A inkjet printer cartridge filled with a silver conductive nanoparticle ink, it was determined that the distance between circuit features should be less than 0.25 inches. However, depending on the ink type and temperature, this distance is nominally in the range of 1.0 to 0.2 inches.

If the holes in the inkjet cartridge are spaced such that the deposited ink from one hole does not make contact to the deposited ink from an adjacent hole, one solution is an overlap process to offset the printing mechanism 120 equal to a distance less than a diameter of the hole in order to overlap the deposited ink between passes of the printing mechanism 120. This overlap process is optionally used in printing conductive ink, non-conductive ink and protective coatings. The overlap process is optionally used for printing processes requiring the deposition of an ink onto a substrate 105 using a syringe, inkjet, piezoelectric, spray or other inking process where the ink leaving a printing mechanism has a smaller dimension than a circuit feature.

Figure 19A:
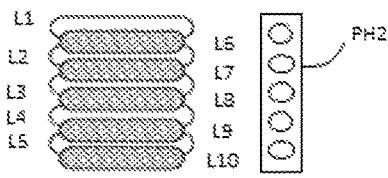
FIG. 19a is an illustration of circuit traces in relation to an embodiment of a print head.

Referring to FIG. 19a, an printed ink pattern using an inkjet cartridge PH2 is illustrated. The unshaded lines L1-L5 depict the first pass of the printing mechanism 120 as it moves from left to right. In this case, the inkjet cartridge PH2 is activated by the PCM 128 as the printing mechanism 120 is moved across the substrate 105 releasing ink onto the substrate 105 producing five thin lines of ink labeled L1-L5. In this example, the inkjet cartridge PH2 includes five separate nozzles which are independently controlled. As the nozzles are spaced a distance apart, there are in this example gaps between the printed lines L1-L5 and gaps between lines L6-L10. The gaps must be filled in order to make connections between adjacent lines. In this process, the printing mechanism 120 is offset by a distance that is less than one diameter of the nozzles of the print head PH2. Lines L6-L10 (stippled) are printed using a second pass of the printing mechanism 120. This process is repeated until a complete circuit feature is produced. This process is optionally used by the PCM 128 for printing conductive traces when the print head PH2 would otherwise leave gaps. This process is optionally used by the PCM 128 for printing non-conductive regions when producing multi layered circuit boards or when a protective coating is optionally used to prevent surface damage to the printed lines or reduce the effects of environmental conditions such as moisture or heat.

Figure 19B:
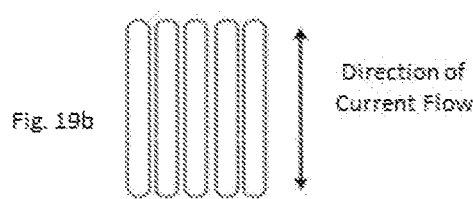
FIG. 19b is an illustration of circuit traces in relation to current flow.

In an one embodiment of the PCM 128, printing conductive traces in the direction of current flow in the final circuit is addressed. Following the discussion of FIG. 19a, the PCM 128 printing direction for lines EP1-EP5 and lines EP6-EP10 is in the direction of the current flow in the final circuit. This process reduces the amount of resistance of the circuit line. This process also improves the performance of high frequency RF circuits. FIG. 19b shows a line printed with a single pass of the printing mechanism having five nozzles in the inkjet cartridge PH2. This line is printed along the direction of current flow. In this example, a second pass of the printing mechanism 120 is optionally used to fill in the gaps left by the nozzles.

To provide the flexibility to print along the direction of current flow, the printing mechanism 120 is rotated by the print head rotation device 129, or the rotation motor 116 rotating the function head 115, in order to align a nozzle plane to be perpendicular to the direction of current by the PCM 128. Alternatively, the printing mechanism 120 remains fixed and the substrate 105 is rotated by the table 104 being rotated by the table rotator 139, shown in FIGS. 4 and 5B, under control of the PCM 128. Rotation of the printing mechanism 120 would not be required in this scenario. Furthermore, using a printing mechanism 120 with a single nozzle, such as in syringe printing or other piezo-electric systems, would obviate the need for gap filling needed in the case of the print head PH2.

Diagonal Lines.

Figure 19C:
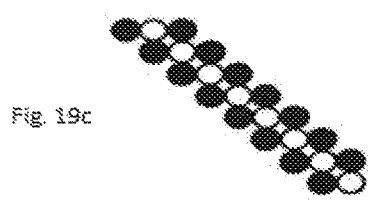
FIG. 19c is an illustration of a diagonal circuit trace.

The PCM 128 controls printing diagonal conductive traces optionally uses a process to ensure that the resistance of the line is below an acceptable level. Printing diagonal conductive traces using any process that ejects ink from a small diameter hole or nozzle, may create limited connections or gaps between the printed dots on the substrate 105. For example, FIG. 19c shows a diagonal line created with a set of printed dots. The unshaded dots are the results of printing a line based on parameters entered by operator or from a conventional PCB file or equivalent database. If the requested line is fairly thin, the dots may not make adequate connection between the adjacent neighbors, as shown by the unshaded dots in FIG. 19c. In this case, the LTM 152 optionally determines that extra dots are required and the PCM 128 prints the dots during the printing process as shown by the shaded dots. Additionally, rotating the printing mechanism 120 or the substrate 105 may lower the resistance when printing diagonal conductive traces as the line may be printed in the direction of the current flow in the final circuit.

Epoxy.

In an embodiment of the present disclosure, component attachment uses deposition of an electrically conductive epoxy or other electrically conductive glue by the PCM 128. Types of conductive epoxy used, for example and not limitation, are MG Chemicals 8331S and Creative Materials 111-29. The printing of epoxy may be performed with a variety techniques including syringe printing, piezoelectric or other types of printing mechanisms. The location for epoxy deposition requires the identification of component pads by the LTM 152. One technique for locating the epoxy deposition is for the LTM 152 to use information contained in a standard PCB file (GERBER file) for a solder mask. The solder mask file provides the location and pad size used when performing a standard soldering operation for the components. This same file is optionally used for the epoxy printing.

Another method for obtaining the location for epoxy deposition may be accomplished by the LTM 152 using information about the components including the size and orientation of the component. For example, if a resistor of size 1206 is placed in a horizontal orientation, the package size and orientation is optionally used to determine the location of the epoxy deposition. This also includes an amount of epoxy optionally used for proper attachment. Additionally, the location for epoxy deposition is optionally determined by the LTM 152 using circuit features contained in the circuit file provided to the LTM 152. For example, conductive traces that end without connection typically require a connection to a component. These features are optionally used by the LTM 152 to produce instructions controlling the PCM 128 during the epoxy deposition process. As some epoxies are rated for a heat cure which often accelerates the curing process, the PCB production apparatus 100 is optionally equipped with a heater in the form of table heater 118. As some epoxies are rated for a UV cure, the PCB production apparatus 100 is optionally equipped with a UV heater 118a, shown in FIG. 4. The heaters are optionally controlled by the PCM 128 to automatically operate after deposition of the epoxy.

Solder Paste.

The PCM 128 optionally implements deposition of solder paste by the techniques mentioned above for conductive epoxy. In one embodiment of the PCB production apparatus 100, solder paste is applied by the epoxy dispenser 130 to the printed circuit conductive traces prior to placement of the components. The solder paste would be applied using a syringe, piezoelectric or other printing mechanism. The application of solder paste to the substrate 105 uses either the ink printing mechanism 120 or the epoxy dispenser 130, developed for printing inks and epoxy. In another embodiment of the present disclosure, the PCB production apparatus 100 optionally uses a separate sub-system. As mentioned above, the PCB production apparatus 100 optionally includes an integrated heat source such as the UV heater 118*a* for effecting solder reflow.

It is optionally possible to apply the solder paste using a silk screen process where a solder mask is placed over the substrate 105, which includes the previously printed circuit features, and the solder is pulled across the solder mask to place the solder paste onto the conductive line. This process is fairly standard in the industry but is unique to a system that includes all the printing and attachment processes. The solder paste would be reflowed during a separate heating process of the substrate 105. As mentioned above, the PCB production apparatus 100 optionally includes an integrated heat source such as the UV heater 118*a*.

Non-Conductive Epoxy.

The PCM 128 optionally implements a process for deposition of non-conductive epoxy. For example, when attaching large components or with applications requiring a flexible substrate 105, attachment of components using a non-conductive epoxy aids the component attachment to the substrate 105. In an embodiment of the process, the deposition of non-conductive epoxy is done before the deposition of conductive epoxy or solder paste. Alternately, the non-conductive epoxy is deposited after the deposition of the conductive material. In either case, the deposition of conductive and non-conductive epoxies and/or solder onto the substrate 105 occurs prior to the placement of the one or more components onto the substrate 105.

Multilayer Circuit Boards.

When printing a multilayered circuit, the process begins with two or more files containing the individual circuit conductive traces and features. These files are typical of a GERBER format but may be of any PCB file type that properly describes circuit features in each of the layers. In one embodiment of the LTM 152, the files are examined and the locations of the circuit crossovers are determined as discussed above. This identification process may be performed internal to the LTM 152 or external to the PCB production apparatus 100. Once locations of crossovers are identified, the LTM 152 optionally creates a new single layer circuit layout which combines all the circuit conductive traces and features from the layers with the exception of breaks or discontinuities at the location of the crossovers. This process may accelerate the printing process by producing a single layer board that is optionally printed in one pass of the printing mechanism. To produce the completed board, a secondary process of layering non-conductive and conductive layers only in the areas of the crossovers of crossovers is implemented.

In a standard printed wiring board process, each layer is etched onto the surface of a laminated substrate. In this case the crossovers are electrically isolated by the non-conductive substrate material between the various layers. When creating a printed wiring board using a printing process as part of this disclosure, the various layers are compared and crossovers are identified. Once crossovers are identified, different layers are optionally combined into a single layer for printing. In this case, the crossover information is preserved and used during the secondary process.

Figure 20C:
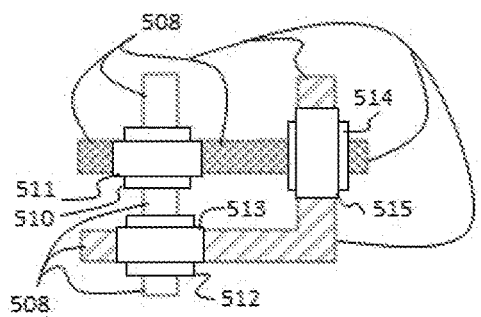
FIG. 20c is an illustration of the circuit traces of FIG. 20b modified by a further method of the present disclosure.
Figure 20D:
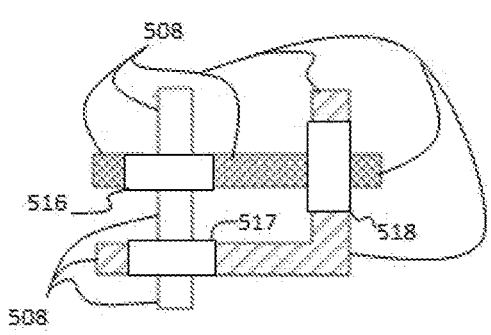
FIG. 20d is an illustration of the circuit traces of FIG. 20b modified by a still further method of the present disclosure.
Figure 20A:
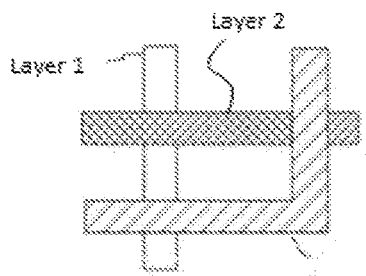
FIG. 20a is an illustration of circuit traces.
Figure 20B:
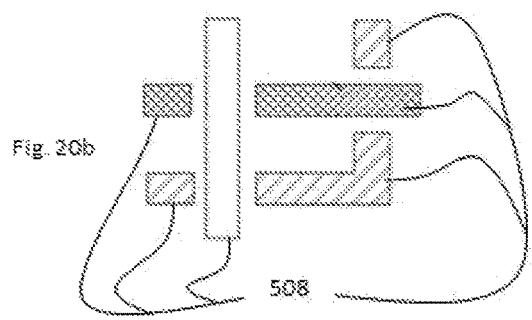
FIG. 20b is an illustration of the circuit traces of FIG. 20a modified by a method of the present disclosure.

Referring to FIGS. 20*a*-20*d*, an example of a layout for a three layer PCB circuit board is shown with each layer being depicted in different shading. For this example, the information for the three layers are optionally contained in three separate files or all contained in one or two files. The process involves the LTM 152 identifying the crossovers and creating a combined single layer equivalent for printing. In this case, FIG. 20*b* shows the combined circuit layout of the combined single layer 508 with three crossovers locations identified. This combined layout includes breaks in the circuit conductive traces where crossovers will be placed in a secondary process after printing the combined single layer 508. For this example, the line on PCB layer 1 is not changed. For this example, the line on PCB layer 2 is produced with break in an area of an intersection between layer 1 but remains continuous in an area of intersection with the line of PCB layer 3. For this example, the line on PCB layer 3 includes two breaks at intersections between the conductive traces in PCB layer 1 and PCB layer 2. The example shown on FIG. 20*b* is only one possible configuration out of many possible combinations for determining which conductive traces are to be implemented with breaks.

The next step is to reconnect the printed conductive traces that have a break. In one embodiment shown in FIG. 20*c*, an area of non-conductive ink 510, 512, or 514 is printed over each one of the conductive traces followed by a layer of conductive ink, embodied in connections 511, 513, or 515, connecting the conductive traces (formerly of layers 1, 2 and 3 of the multilayer PCB) across the breaks in the combined trace layer now printed. In another embodiment shown in FIG. 20*d*, a connecting component, 516, 517, or 518, is optionally glued or soldered across each break. The connection component includes a lower insulating layer and an optional upper conducting layer. In the former embodiment, the connection conductor layer shown in FIG. 20*c* is determined by the LTM 152 and printed by the PCM 128 connecting to the conducting lines of the combined single layer 508 printed on the board as shown in FIG. 20*b*. In the later embodiment, the connecting component, 516, 517, or 518, is optionally a standard commercially available component such as a resistor, capacitor, inductor or wire. In one embodiment, the connecting component is a 0.1 ohm surface mount resistor. In this case, the gap in the break is slightly smaller than the length of the resistor so terminals of the resistor will overlap the desired conductive traces and complete the connection between two segments. In one embodiment, a custom connecting component is optionally used to connect the two conductive traces. In one embodiment, the connecting component is designed with geometry suitable for the pick-and-place mechanism 140. In one case, the connecting component has two electrically conducting terminals for connecting the printed conductive traces to the connecting component. In one embodiment, the connecting component may have a low resistance path between its two terminals. In one embodiment, the connecting component may be an electrical element which provides a means of connecting the two segments of the printed line and also provides an optionally used circuit function such as resistance, capacitance, and inductance.

Printing Resistors Using Conductive Ink.

The process of printing conductive inks is optionally optimized to produce a line with a specified resistance. This technique not only produces an electrical connection between two points but also eliminates need to add a separate resistor to the printed circuit.

Multiple Function Head Registration/Calibration

The function head 115 is optionally used during a calibration process to set to location of an absolute substrate or system position, i.e., table position. This location may be considered the (X, Y, Z)=(0, 0, 0) location or "home" location. Using a common function head 115, the calibration process may only need to be performed once for all inking, deposition, and pick-and-place functions. A Z-axis or vertical calibration is optionally performed periodically before and/or during the printing process or may be performed continuously by means of a sensor which monitors the top of the substrate and printed wiring board. The sensor may include a mechanical "feeler" or by optical means.

Referring to FIGS. 6a-6e, various embodiments of the function head 115 include function heads 115-1 through 115-3 which are directed to specific operations of ink printing, epoxy printing, and component placement. While function head 115-4 combines the aforesaid operation into one function head, use of function heads 115-1 through 115-3 involves interchange of the function heads in the process of producing a PCB. The interchange of function heads may introduce alignment offsets of point of operation of the various heads, the points of operation being where on the substrate ink, epoxy, solder paste or a component is deposited on the substrate 105. Additionally, the function head 115-4 having multiple functions incorporated therein may also require alignment of the points of operation. This may be necessitated by the function head 115-4 accepting replacements of the printing mechanism 120, the epoxy mechanism 130, or the component placement mechanism 140. While precision manufacturing of mechanisms 120, 130, and 140, optimally reduces changes in alignment, an alignment operation is optionally used to compensate for differences in the alignment of function heads.

Predefined built-in offsets for function heads are based on ideal mechanical dimensions of the printing mechanism 120, the epoxy mechanism 130, or the component placement mechanism. For example, the table 104 has an inherent zero position with relation to which operation points of the function heads are to be coordinated. The positioner 90 is optionally zeroed with respect to the inherent zero position such that the motors are operated to position the head mount 110 at a predetermined spatial relationship to the inherent zero position of the table 104. At this position, operating positions in each of the three axes of the positioner 90 are set to zero meaning that, when the controller 95 commands the positioner 95 to move to position 0, 0, 0, for example, it returns to the inherent zero position. This may be done either in the controller 95 as a final adjustment to commands or within the positioner 90.

Each of the function heads has an inherent built-in offset such that when the positioner actually moves the operation point of a given function head to the inherent origin, positions recognized by the positioner 90 and controller 95 will reflect the built-in offsets of the particular function head which will be called for clarity purposes, F1X, F1Y, and F1Z, wherein the designation F1 indicates the particular function head, i.e., function head "F1." When the positioner 90 moves the operation point of the function head to the inherent origin, the controller 95 has directed the positioner to −F1X, −F1Y, and −F1Z. In operation, the controller 95 will make these adjustments in the final commands sent to the positioner 90 and the adjustments will be based on which function head is in use. Optionally, the function heads will include indicia which may be electronically or manually communicated to the controller 95 so that the controller 95 associates the particular function head with stored built-in offsets. This is optionally done by optically reading indicia on the function head using the imaging device 108, or electronically reading the indicia via any of hardwired, RF, such as for example and not limitation, an RFID tag, or infrared.

In practice, the actual built-in offsets will vary based on machining tolerances. If tolerances are wide enough in the particular application to producing a circuit board, use of the built-in offsets may be suffice an no further alignment is necessary. When tolerances are tighter, a calibration is done to effect accurate registration of the function heads with relation to either the substrate or the table.

An embodiment of an alignment method implemented by an alignment module (AM) 142 of the controller 95, shown in FIG. 7, includes operation of the printing mechanism 120 to print a registration mark on the substrate 105 which may be the object of production or may be a test substrate used for alignment. The location on the substrate will have some predefined offsets to the aforesaid zero position of the table which will be called "substrate offsets." The registration mark marks what will be termed a "substrate zero position." The substrate zero position is optionally the inherent origin or a substrate origin defined by substrate origin offsets from the inherent origin. For simplicity purposes in the following discussion, it is taken that the inherent origin and the substrate zero position are the same. It is to be understood that this need not be case and that substrate origin offsets are optionally used to compensate alignment when the inherent origin and the substrate origin are not the same in the following discussion in a manner as will be appreciated by those skilled in the art in light of this disclosure.

Once the registration mark is made by the printing mechanism 120, the epoxy mechanism 130 is next operated to print an epoxy dot at the registration mark made by the ink printing mechanism 120 based on predefined built-in relative offsets between the printing mechanism 120 and the epoxy mechanism 130 and the substrate offsets. However, variations of function head dimensions, and the various mechanism included in the function head, will invariably result in a misalignment of the epoxy dot with the registration mark. In an embodiment of the PCB production apparatus 100, the imaging device 108 is mounted so as to view the registration mark and is read by the alignment module 142 of the controller 95. The X and Y offsets are then determined from the image and stored as head component offsets which are added to the built-in relative offsets of the mechanisms 120, 130, or 140. Alternatively, the offsets may be manually entered and confirmed. In subsequent operations the head component offsets and built-in offsets are used to effect operations.

The component placement mechanism 140 is also calibrated in a similar procedure wherein a standard component or a dummy component is placed by the component placement mechanism 140 so a predefined point of the standard or dummy component is to align with the registration. Head component offsets of the predefined point from the registration mark are then determined and entered, either automatically or manually.

Another embodiment of the above registration mark does not require printing an initial registration mark using the printing mechanism. Instead, a feature on the substrate 105, for example a corner or an indicia on the substrate is used in place of the registration mark. Each of the printing mechanism 120, the epoxy mechanism 130, and the component placement mechanism 140 will have the operation point thereof positioned aligned with the feature. The operation point is optionally, for example and not limitation, a tip of a syringe of the epoxy printing mechanism 130, a tip of a suction nozzle of the component placement device 140, or a print jet orifice or an alignment mark or protrusion of the ink printing mechanism 120. When each of the operations points are aligned with the feature, a position reading of the positioner is taken. If alignment is perfect, all the position readings will be same. However, variations in alignment will result in the readings being different. Several calibration option exist.

A first option is to use a relative offset correction that corrects align of the function head module operation points with respect to each other. One of the readings taken when the operation point of a selected function head is aligned with the feature is taken as a base line with the head component offset being the raw position readings from the positioner 90. The reading selected functions as a baseline taken as 0,0,0, i.e., a base origin, and then store differences between the position readings of the other function head components and that of the selected baseline component as head component offsets to be applied in future operations. Operations are then conducted with the selected function head using 0, 0, 0, as a head component offset, and the differences are stored as the head component offsets of the other function head components. Thus, the relative positions of the function head components are compensated for variations in mechanical dimensions.

Another approach is to store the position readings taken when the alignment with the feature is in place as the head component offsets with respect to the zeroed head mount position. These readings are then used as the head component offsets for each head components. In this method, the head component offsets subsume the built-in offsets of the various head components.

Figure 22A:
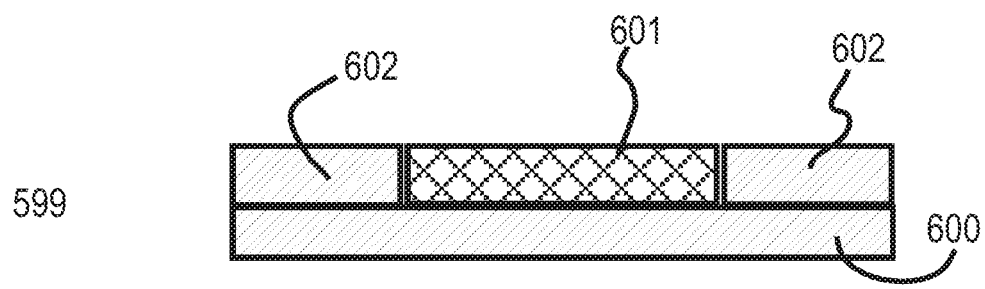
FIG. 22A is an illustration of a portion of a printed wiring board 599 wherein a conductive layer 601 is printed on top of a base nonconductive layer 600 and nonconductive layers 602 are printed adjacent the conductive layer 601 in order maintain a relatively flat surface across the printed wiring board 599.

When printing a multilayer PWB using conductive and non-conductive inks, it may be necessary to maintain a relatively flat surface across the entire top of the PWB. For example, FIG. 22*a* shows a cross section of a PWB 599 having a first non-conductive layer 600 printed across an area of the PWB 599, and first conductive layer 601 printed on top of a portion top of first non-conductive layer 600. To maintain a flat surface across this area of the PWB 599, a second non-conductive layer 602 is placed adjacent to conductive layer 601. The approximate height of the first conductive layer 601 and second non-conductive layer 602 would be predetermined in order to know if any of these layers were need to be overprinted to maintain and equal height between first conductive layer 601 and second non-conductive layer 602. If the apparatus 100 uses a similar process for printing conductive layers and non-conductive layers, such both using piezoelectric printing, it would be expected that printing these layers would require the same number of layers to maintain the same height. If the apparatus 100 uses a different process for printing conductive layers and non-conductive layers, such as one using piezoelectric printing and one using syringe printing, it would be expected that printing these layers would require a different number of layers to maintain the same height.

Figure 22B:
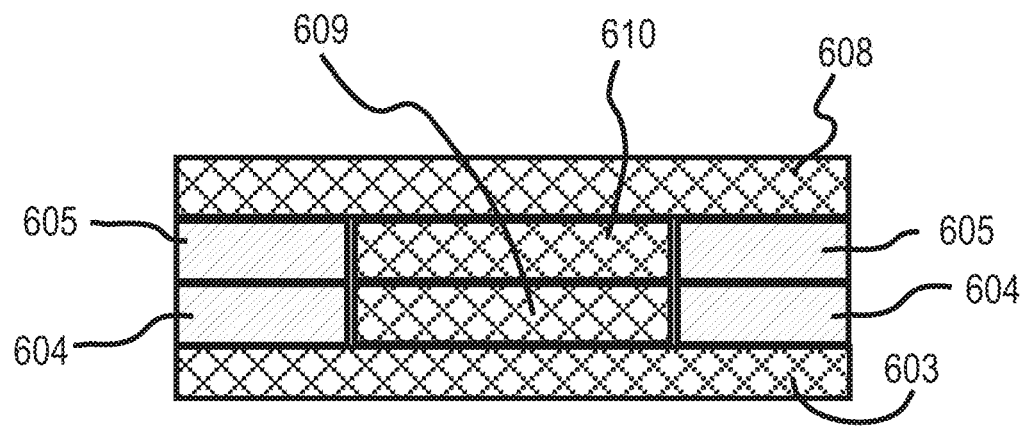
FIG. 22B is an illustration of a portion of a printed wiring board wherein first and second nonconductive layers 604 and 605 are printed to maintain electrical isolation between conductive layers of a converted multilayer circuit board layout data, which conductive layers include conductive layers 603 and 604 which are interconnected by two conductive layers 609 and 610 disposed in a via opening defined in the two nonconductive layer 604 and 605 in a stacked arrangement to maintain a relatively flat surface across the printed wiring board at via interconnects.

When printing a non-conductive layer between two conductive layers in order to isolate the two conductive layers from making electrical contact, it may be necessary to over print non-conductive layer to guarantee that the non-conductive layer completely covers the first conductive layer or to increase the non-conductive layer height to a functional height required by the circuit. Keeping a count of the number of non-conductive layers printed would be necessary to calculate the approximate thickness of the total non-conductive layer. For example, FIG. 22*b* shows a cross section the first conductive layer 603 which has printed two non-conductive layers 604 and 605 which includes a gap that allows two conductive layers 609 and 610 to be printed in the gap. For this example, the approximate height of non-conductive layers 604 and 605 and conductive layers 609 and 610 are similar so only two layers for each material is required to maintain a flat surface for printing the next layer. In FIG. 22*b*, the top layer is conductive layer 608 but could also be another type of material such as a non-conductive layer, epoxy, solder paste, protective coating or electrical component. For example, if the layer thickness for non-conductive layers 604 and 605 is 4 microns, then printing conductive layer 609 and 610 with an approximate 4 microns would create a relatively flat surface across the top. In the preferred method, intermediate curing of each printed layer and layer type improves the accuracies of the printed feature characteristics. Curing of the printed conductive and non-conductive inks can be accomplished with air-drying, applied heat and/or applied UV light depending on the requirements for processing the ink. In one case, both conductive and non-conductive would require heat curing. In another combination, the conductive ink would require air-drying and the non-conductive ink would require UV curing. Other combinations are possible and all combinations will not be listed here but knowing that the ink properties determine the type of curing and different combinations are possible with the apparatus 100. Also noting, that it would be possible to apply at least two types of curing methods simultaneously to facilitate rapid curing of combinations of conductive and non-conductive inks, epoxies and protective coatings.

In FIG. 22*b*, is was described that non-conductive layers 604 and 605 were printed prior to printing conductive layers 609 and 610 but it is possible to reverse the order and print the conductive layers first. Is it also expected that non-conductive layer 604 and conductive layer 609 would be printed before printing non-conductive layer 605 and conductive layer 610.

When creating circuits that require a high current capacity, the selection of a traditional PWB using chemical or mechanical etching processes is usually limited to selecting the thickness of the copper cladding on the FR4 board. Generally, copper clad boards are specified in ½ ounce, 1 ounce and 2 ounce copper thickness. For example, a 1 ounce copper clad board has a copper thickness of 1.4 mils. For the highest current capacity, the more expensive 2 ounce copper cladding is usually selected. The thicker cladding also requires more processing time and cost to chemically etch the PWB. In general, not all the wiring on the PWB requires high current capacity as circuits usually contain a mix of low and high current requirements. For example, a PWB designed for a motor control, would contain high current wiring for the motor drive and lower current wiring for the embedded microcontroller.

Figure 23:
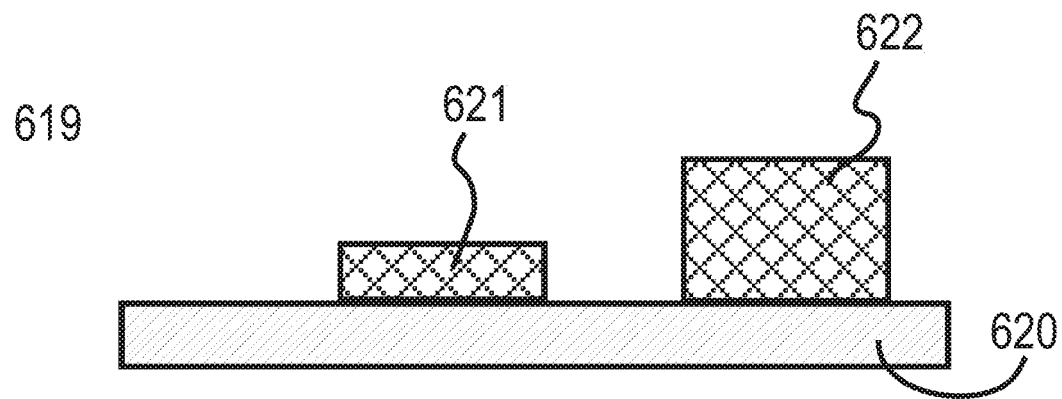
FIG. 23 is an illustration of a portion of a printed wiring board 619 wherein first and second conductive traces, 621 and 622, are printed on nonconductive layer 620 and differing thickness so as to provide different current carrying capacity or resistance.
Figure 24:
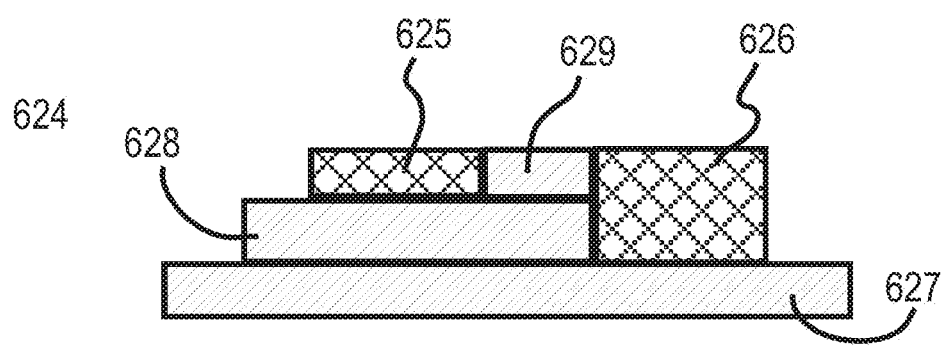
FIG. 24 is an illustration of a PWB 624 having two conductive lines 625 and 626 printed on substrate 627. which could be conductive or non-conductive, having a conductive line 625 is printed on top of non-conductive layer 628 with a height that places a top of conductive line 625 at approximately a same position as a top of conductive line 626.

In order to reduce the cost of the PWB using printed method, apparatus 100 can print conductive layers with different amount of thicknesses. FIG. 23 shows a cross section of PWB 619 having two conductive lines 621 and 622 printed on a non-conductive substrate 620. Conductive line 621 has less height than conductive line 622. It is expected that conductive line 622 would be capable of carrying a higher amount of current when compared to conductive line 620. It is expected that conductive line 622 would have less resistance that conductive line 621. Apparatus 100 can be configured for the user to enter the conductive thickness, the required current capacity or the required line resistance. If the input to apparatus 100 is either the required current capacity or the required line resistance, then apparatus 100 would automatically calculate the height of the printed conductor to meet that specification. The determination of the conductor height may be performed in LTM 152, PCM 128, external to apparatus 100 or any electronic means that allows a user input to be translated to the required height for each printed conductor. If two conductive lines require different current capacity or resistance requirements, and also require that their upper surfaces lie within a common horizontal plane, then a non-conductive layer may be printed under the conductive line with the small height. FIG. 24 shows PWB 624 having two conductive lines 625 and 626 printed on substrate 627. Substrate 627 could be conductive or non-conductive. Conductive line 625 is printed on top of non-conductive layer 628 with a height that places the top of conductive line 625 at approximately the same position as the top of conductive line 626. Additionally, non-conductive layer 629 may be placed between conductive lines 625 and 626 though not required for operation having different current capacities or resistance values.

Figure 25:
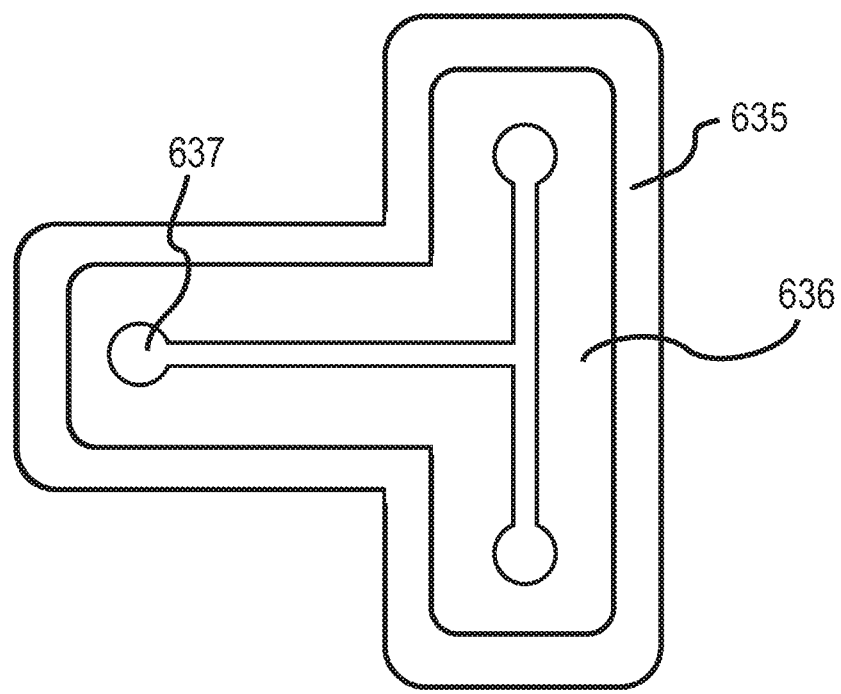
FIG. 25 is an illustration of a PWB having a previously cut optionally provided non-conductive substrate 635 with a printed non-conductive layer 636 and a conductive layer 637.

In some cases, the outline of the finished PWB is not rectangular. When processing a PWB using traditional methods of chemically or mechanically etching the traces, the copper clad board starts as a square or rectangular form and then the finished PWB is mechanically cut to the desired shape. The shape, or outline, is either specified as another file included in the set of Gerber files, as an image file or can also be determined by examining the geometries of the conductive traces and moving some pre-determined distance from the outmost traces. This process often leads to some material waste especially when the final outline is irregularly shaped. Apparatus 100 can begin with the substrate previously cut to form or apparatus 100 can directly create the substrate by printing a layer of conductive or non-conductive material to the desired outline. Printing the substrate to the desired outline saves time and material by eliminating the need to cut the outline from the rectangular board and discard the waste. FIG. 25 shows a PWB with a previously cut substrate 635 having a printed non-conductive layer 636 and a conductive layer 637. Substrate 635 can be made of a conductive or non-conductive material including, but not limited to, fiberglass, glass, aluminum, Kapton, paper and polyester film. In some cases, non-conductive layer 636 may not be required if substrate 635 is non-conductive. In another application, substrate 635 is used as a temporary support for building the PWB. Examining FIG. 25, non-conductive layer 636 and conductive layer 637 would be printed on substrate 635. When the PWB is complete and the inks have cured, substrate 635 would be removed. Substrate 635 could then be re-used on another PWB or discarded. It is also possible that a conductive layer is the first material to be printed onto substrate 635. It is also possible that a combination of non-conductive and conductive inks be printed over portions of substrate 635 and later the combination, functioning as a complete PWB, is removed from substrate 635 as part of the complete PWB. In another embodiment, substrate 635 is not required at all. In this case, non-conductive layer 636 would be printed directly onto table 104 and later removed as a functional PWB. It is also possible that a conductive layer is the first material to be printed onto table 104 and later removed as a functional PWB. It is also possible that a combination of non-conductive and conductive inks be printed over portions of table 104 and later the combination, functioning as a complete PWB, is removed from table 104. It may be necessary to apply a coating onto table 104 so that the non-conductive and conductive inks will not stick to table 104 surface. The coating may be permanent attached to table 104 or can be painted or sprayed onto the surface of table 104 as a temporary coating to prevent the non-conductive and conductive inks from sticking to the surface.

Figure 26A:
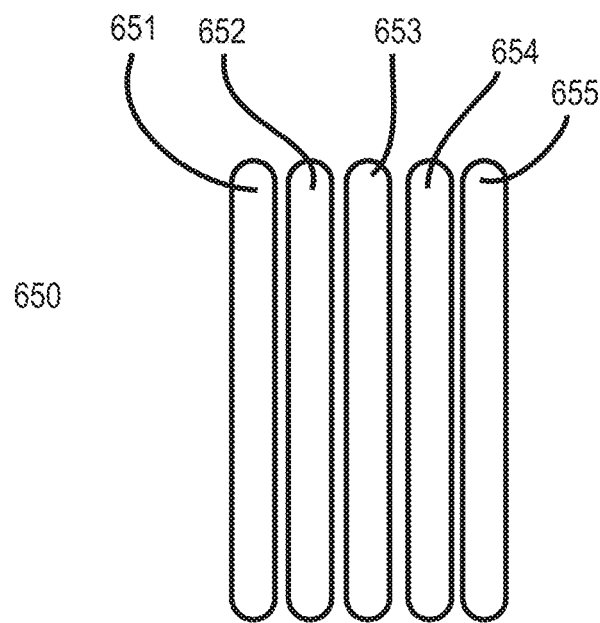
FIG. 26A is an illustration of a test pattern 650 created by printing a pattern using a function head with five nozzles.
Figure 26B:
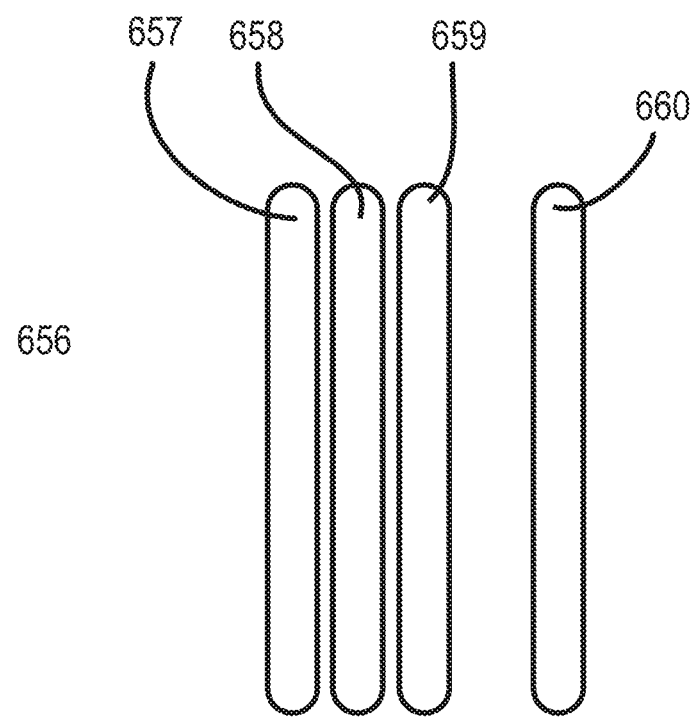
FIG. 26B is an illustration of a test pattern 656 having a non-functioning nozzle creating a gap.

Function heads for printing inks, epoxies and solder paste may include multiple nozzles for producing small dots. It is possible, especially in low-cost piezoelectric print heads and cartridges, that one or more of nozzles become clogged or stop functioning. It is necessary to identify non-functioning nozzle before printing a PWB. In one embodiment, a test pattern is printed on a substrate in order to identify if a nozzle is not functioning properly. The test pattern can be created by individually activating a nozzle and printing a small amount of material. In one embodiment, the user examines the test pattern and determines which nozzle or nozzles are not functioning and enters the nozzle into the apparatus 100 interface. In another embodiment, apparatus 100 is configured with an optical system that automatically identifies nozzles that do not function. If a nozzle is identified as not working, apparatus 100 may notify the user on a procedure to correct the problem. FIG. 26a shows a proper test pattern 650 created by printing a pattern having a function head with five nozzles. Test pattern 650 includes individual lines 651 652, 653, 654 and 655. FIG. 26b shows test pattern 656 having a non-functioning nozzle creating a gap. For this case, only lines 657, 658, 659, 660 are observable. Once non-functioning nozzles have been identified, the apparatus can compensate for gaps in the printed conductive, non-conductive, epoxy or solder paste areas. Gaps will be filled using functioning nozzles.

Laser Trimming

When using integrated circuits with very close lead spacing or when printing two lines very close together, the functional print head may not be able to adequate separation between printed geometries and it may be possible that two printed geometries are not electrically isolated as intended. In this case, a laser or other optical means will be used to burn away portions of a printed geometry to improve the electrical isolation between these geometries. In certain high frequency application, it is important to maintain a controlled impedance of the printed conductive line. The impedance is determined by the line width and several characteristics of the non-conductive material around the printed line. If the conductive line is not the correct width or the width was intentionally printed wider than required, the laser can trim the line to the desired width. Another important property when transmitting high frequency signals along a printed transmission line, is that the majority of the signal current flows on the outside edges of the printed line. Having line edges that are uneven will increase the signal loss as the signal is transmitted through the line. In this case, the laser can be used to clean up the edges of the printed line in order to reduce the signal loss.

A low-cost laser system can use the laser contained in a Bluray disc read/write system though any laser system capable of removing the conductive material would work. In certain low-cost laser units, a focusing lens may be required to obtain a dot size small enough to create the required geometries. In one embodiment, the laser system is a functional head that can be detached from apparatus 100. In another embodiment, the laser is attached to apparatus 100 or may be part of the printing head. The alignment of the laser spot on the PWB may also be included as part of the calibration process mentioned earlier. In this case, a geometry is printed with some identifiable geometry and the laser burns a portion of the geometry to guarantee alignment between the printed geometry and the burned portion. If there is misalignment, the offset can be manually corrected by the user or automatically corrected by optical means such as a camera mounted to apparatus 100.

Rectangular Holes for Through Holes

In most PCA applications, it is necessary to connect the functional circuit to a battery. It is also often required to epoxy or solder some type of wire, connector or other interface to the PWB to complete the PCA. It is possible to use components based on surface mount technology for these connections but to improve the reliability of these connections, it may be important to utilize components based on "through-hole" technology. In this case, the printed conductive and non-conductive geometries must include a hole through at least a portion of the printed layers. When the PWB is complete, the metallic and possibly non-metallic, wire, tab or other protruding geometry would be pushed into the printed hole and epoxied or soldered into place. Another key feature of this process, is that many of the wires, tabs or other protruding geometries are not necessarily circular and using the printing process of apparatus 100, it is possible to create a hole that is conformal to the geometry of the connection point of the through-hole component. For example, a card edge connector, such as Sullins RBB10DHHN in a 20 pin through-hole connector where each metallic connector lead has a cross sectional geometry that is rectangular at 0.018 inches by 0.012 inches. When using traditional PWB fabrication, the manufacturer suggests drilling holes with 0.04 inches in diameter. With the printing process, the printed holes can be rectangular at approximately 0.025 inches by 0.020 inches.

Component Alignment.

Figure 27A:
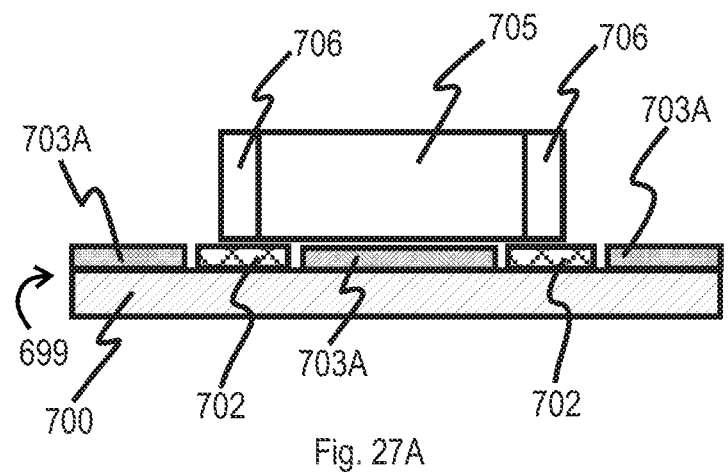
FIG. 27A is a side elevation partial cross section view of a traditional etched PWB showing an electrical component positioned on conductor pads and a solder mask applied to the PWB.

Traditionally, solder masks are used to protect the conductive lines from oxidation and isolate closely-spaced conductive lines during the process of soldering components, and their associated electrical terminals, to the conductive traces. The traditional solder mask exposes the conductive traces in the areas of solder attachment. The traditional solder mask is generally very thin in height to prevent component tombstoning during solder reflow operation. Referring to FIG. 27A, a cross section of a traditional printed wiring board (PWB) 699 is shown having a non-conductive substrate 700, first conductive pads 702 and a solder mask 703A. An electrical component 705 has electrical terminals 706 positioned in order to align the electrical terminals 706 with portions of the first conductive pads 702. It is expected that a thin layer of conductive material, such as conductive epoxy or solder paste, is placed between the electrical terminals 706 and the first conductive pads 702 in order to create a secure electrical connection. The solder mask 703A has a thickness that is typically 0.003-inch to 0.008-inch in height. When using a CAD/CAM tool, such as Eagle, KiCAD, OrCAD or Altium, a geometry for an opening in the solder mask 703A is automatically generated based on a geometry of the first conductive pads 702. For example, CAD/CAM tool Eagle defines the solder mask as a layer named TSTOP and automatically produces solder mask openings that are 4 mils larger than the associated conductive pad geometry. The user can modified the default opening size. The CAD/CAM produces a separate file associated with the solder mask geometries for use in fabrication. *

Figure 27B:
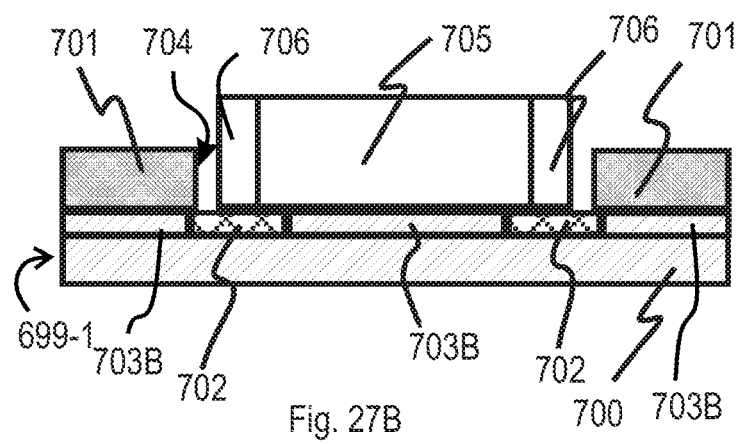
FIG. 27B is a side elevation partial cross section view an embodiment of a PWB produced by an apparatus and method of the present disclosure wherein nonconductive areas are optionally printed leveling a board surface, and further nonconductive areas are printed and configured to align an electrical component on conductor pads.

When printing a PWB with conductive and non-conductive inks using apparatus 100, a non-conductive guide layer may be printed on top of the PWB for the purpose of assisting the placement of electrical component onto the PWB. For example, FIG. 27B shows a cross section of a PWB 699-1 having the non-conductive substrate 700 with a non-conductive layer 703B printed adjacent the first conductive pads 702 which are printed on top of portions of the non-conductive substrate 700. The electrical component 705 is positioned in order to align the electrical terminals 706 with portions of the first conductive pads 702. A thin layer of conductive material, such as conductive epoxy or solder paste, is placed between the electrical terminals 706 and the first conductive pads 702 in order to create a secure electrical connection. In order to improve alignment between the electrical component 705 and the first conductive pads 702, a non-conductive guide layer 701 is printed on a portion of the non-conductive layer 703B. A first edge 704 of the non-conductive guide layer 701 serves as a locating guide when the pick and place mechanism of apparatus 100 is positioning electrical component 705 onto PWB 699-1. The first edge 704 is optionally printed to overlap the first conductive pads 702 bringing the first edge 704 closer to electrical terminals 706. *

The overlap of the first edge 704 can be determined by the geometry of the first conductive pads 702. For example, if the first conductive pads 702 have a geometry of 0.020-inch wide and using an overlap factor of a 10%, then the first edge 704 will overlap the first conductive pads 702 by 0.002-inch. Another option is printing the first edge 704 with a recess relative to the second non-conductive layer 703B thus placing the first edge 704 further away from electrical terminals 706. In this case, the electronic CAD/CAM file associated with the mask layer maintains a recess which by default is 0.002-inch using the Eagle tool. *

To aid in the placement of electrical component 705, the non-conductive guide layer 701 should have a height of at least 20% of the height of electrical component 705. More preferably, the height of non-conductive guide layer 701 should be at least 50% of the height of electrical component 705. For example, a 0602 SMT resistor with a height of 0.018-inch would result in a height of at least 0.0035-inch or more preferably, 0.0088-inch.

Figure 27C:
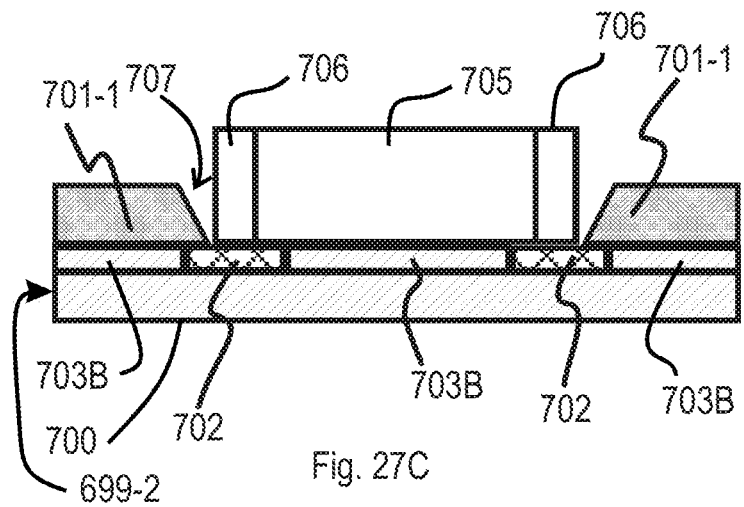
FIG. 27C is a side elevation partial cross section view another embodiment of a PWB produced by an apparatus and method of the present disclosure wherein nonconductive areas are printed leveling a board surface and further nonconductive areas are printed and configured to align an electrical component on conductor pads by operation of inclined sides positioned adjacent the component.

As shown in FIG. 27B, the non-conductive guide layer 701 can be printed with the first edge 704 perpendicular relative to PWB 699-1 or, as shown in FIG. 27C, a non-conductive guide layer 701-1 can be printed with a second edge 707 being tapered relative to PWB 699-2. *

Figure 27D:
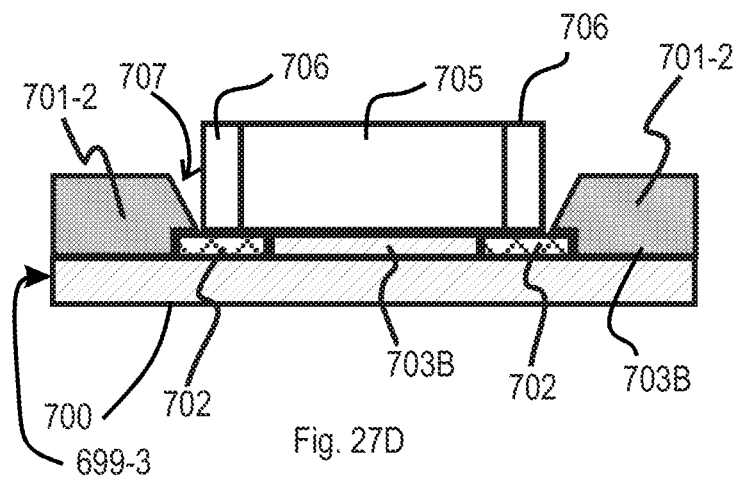
FIG. 27D is a side elevation partial cross section view a still further embodiment of a PWB produced by an apparatus and method of the present disclosure wherein nonconductive areas are printed and configured as dikes to align an electrical component on conductor pads.

Alternatively, non-conductive guide layer 701 or non-conductive guide layer 701-1 and non-conductive layer 703B can be printed together from one type of non-conductive material. FIG. 27D shows the configuration for printing as a contiguous nonconductive guide layer 701-2. The geometry of non-conductive guide layer 701-2 may follow the combined geometries of the individual layers.

The non-conductive guide layers, 701 and 701-1, can be printed using piezoelectric printing methods, syringe printing or any printing technique that can provide an edge for locating electrical component 705 with the electrical terminals 706 in alignment with portions of the first conductive pads 702. In some cases, the location, size and/or edge type of the holes in the non-conductive guide layers, 701 and 701-1, is determined by the LTM 152 based on coordinates of the first conductive pads 702, or a solder mask file. Alternately a CAD tool, such as Eagle, KiCAD, or Altium, would create a Gerber file, or other electronic file, that contains the location, size and/or edge type of the geometry in the non-conductive guide layers, 701 and 701-1. ??

Figure 27E:
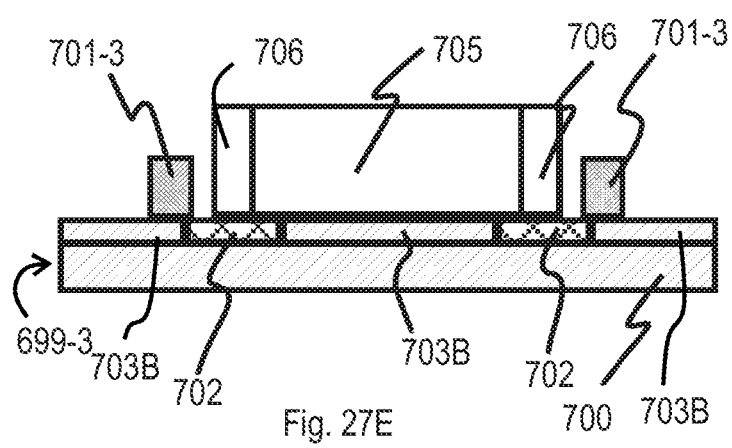

In some cases, non-conductive guide layer 701, non-conductive guide layer 701-1 or non-conductive guide layer 701.2 may cover large portions of the PWB 699, PWB 699-1, PWB 699-2 or PWB 699-3 respectively. Alternatively a non-conductive guide layer 701-3 may cover only a portion of the PWB 699-4 as shown in FIG. 27E. The dimensions of non-conductive guide layer 701-3 are such to perform the function of properly positioning electrical component 705 onto PWB 699-4. For example, the non-conductive guide layer 701-3 may form a wall around the perimeter of the electrical component 705. Alternative, the non-conductive guide layer 701-3 may take the form of bosses in the form of L-shaped guides at some or all corners of the electrical component 705. For circular shaped component the non-conductive guide layer 701-3 the bosses may take the form of crescents positioned to align the circular electrical component. Still further the non-conductive guide layer 701-3 take the form of bosses shaped as dots that are positioned about the perimeter of a rectangular, circular, or irregularly shaped electrical component at a sufficient number of locations to maintain the electrical component properly aligned.

Manual Trace Correction.

Figure 28A:
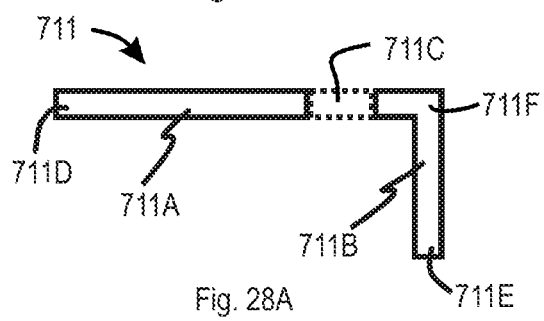
FIG. 28A is a plan view of a conductive trace having portions identified and the conductive trace containing a flaw.

During printing of conductive traces using apparatus 100, it may be possible that good electrical connection may not be achieved throughout the entire printed trace. For example, FIG. 28A shows a top view of a single printed conductive trace 711 which includes a first break 711C between first trace portion 711A and second trace portion 711B. First break 711C reduces or disables the electrical connection between first trace portion 711A and second trace portion 711B.

It is possible to direct apparatus 100 to overprint conductive trace 711 once the location of first break 711C is identified by the user. It is important to note that manually testing the conductive trace immediately following the printing provides an advantage over traditional methods as conductive traces open to the environment immediately begin to oxidize and create a resistance between the conductive trace and the probe tips. The accuracy of the resistance measurement improves when the conductive traces are measured as close to fabrication as possible. Also, important to note, when measuring the electrical performance of a traditional etched multilayer PWB, if a fault is detected along a conductive trace that is embedded within the multilayered stack, repair is impossible as the PWB layers are all laminated together before electrical testing begins. Using Apparatus 100, it is possible to electrically test the performance of each conductive trace before the next layer is printed on top. This process will greatly improve the yield of functional multilayered boards.

The user may be able to identify the location by visual inspection of conductive trace 711 or the user may require an instrument that is capable of measuring electrical conductivity between first trace portion 711A and second trace portion 711B. One example of an instrument is an ohmmeter that is capable of measuring the resistance between two test points. In this case, the user would place one ohmmeter lead on top of first trace portion 711A and a second ohmmeter lead on top of second trace portion 711B. The ohmmeter would report the electrical resistance between the two test points. If the electrical resistance is measured to be higher than expected across the first break 711C, the user would identify the location using a computer interface to LTM 150. LTM 150 would then return to the location of break 711C and print another layer of conductive ink across the break establishing an adequate electrical connection. The user would then have the option to retest the electrical connection and repeat the process if necessary.

Referring to the IPC-9252 Guidelines and Requirements for Electrical Testing of Unpopulated Printed Circuit Boards (hereby incorporated by reference), Section 4.4, states that "one hundred percent continuity and isolation electrical test is the confirmation that the actual electrical interconnect of conductive nodes matches a proven reference source, including but not limited to CAD/CAM digital data, master pattern artwork, or released drawings". An electrical feature that is a continual conductive line may have several features including a variety of lines, pads and via holes. Together, all of these features are defined by a "net" and the information is typically stored in an electronic file such as a Gerber file. The "end of net" is a feature that is a termination point along a conductive net. In order to meet the guidelines contained in IPC-9252 for optimized net list testing.

Traditional test systems measure continuity between pairs of "end of net" features and are operated upon traditionally printed circuit boards following etching and laminating processes. For the example shown in FIG. 28A, the terminations are shown as first conductive termination 711D and second conductive termination 711E. Identifying these locations is typically achieved by examining the electronic data file associated with the PWB layout. The traditional etched and laminated (for multilayer boards) circuit board is operated upon by test instrumentation when removed from manufacturing equipment.

For example, single printed conductive trace 711 contains a segment that is 0.15" across moving from first conductive termination 711D to the right angle bend 711F and also contains a segment that is 0.10" from right angle bend 711F to second conductive termination 711E, The associated Gerber data contained in an electronic Gerber file would be as follows:

% FSLAX25Y25*%
% MOIN*%
% IPPOS*%
% ADD10R,0.025X0.025*%
% LPD*%
X0Y0D2*
D10*
G1X15000Y-10000D2*
Y0D1*
X0*
M02*

With this format, the line "X0Y0D2*" identifies first conductive termination 711D and line "G1X15000Y-10000D2*" identifies second conductive termination 711E. These two X-Y locations can be used for positioning test probes for measuring the electrical performance of the entire line following IPC-9252. The Gerber file presented above, the width of the conductive trace is identified by the size of the line aperture using "% ADD10R,0.025X0.025*%". In this case, the line width, and associated aperture is rectangular with dimension 0.025" by 0.025".

Figure 28B:
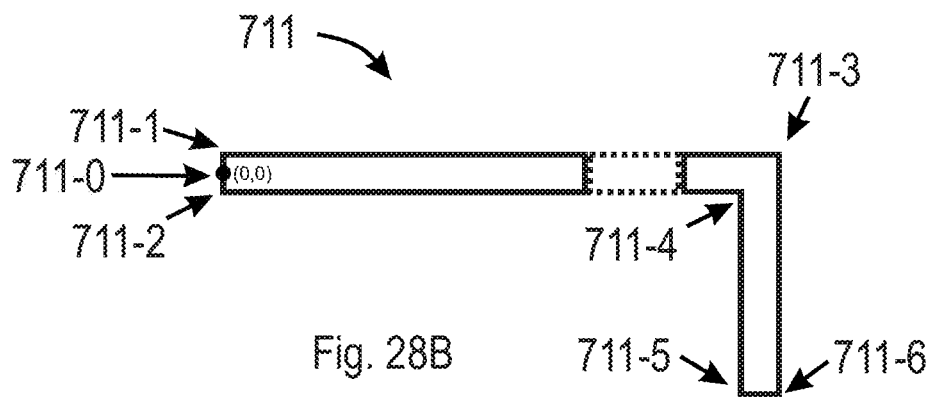
FIG. 28B is a plan view of a conductive trace having printing coordinates identified and the conductive trace containing a flaw.

It is possible that CAD/CAM tools may produce a GERBER file that identifies the outside geometry of the conductive trace. For example, FIG. 28B is the same conductive trace as described above but the GERBER file details the individual vertices, namely first vertex 711-1, second vertex 711-2, third vertex 711-3, fourth vertex 711-4, fifth vertex 711-5 and sixth vertex 711-6. First vertex 711-1 and second vertex 711-2 are used to identify the location for placing the test probe. Fifth vertex 711-5 and sixth vertex 711-6 identify the location for placing the other test probe. The following Gerber data identifies second vertex 711-2 with "G01X0Y-

125D02'", fourth vertex 711-4 with "G01X1375D01*'", fifth vertex 711-5 with "G01Y-1000D01*'", sixth vertex 711-6 with "G01X1625D01*'", third vertex 711-3 with "G01Y125D01*'" and first vertex 711-1 with "G01X0D01*'".

% FSLAX24Y24*%
% MOIN*%
% SFA1.0000B1.0000*%
% OFA0.0B0.0*%
% ADD10C,0.000025*%
% LNcond*%
% IPPOS*%
% LPD*%
G75*
G36*
G01X0Y-125D02*
G01X1375D01*
G01Y-1000D01*
G01X1625D01*
G01Y125D01*
G01X0D01*
G01Y-125D01*
G37*
M02*

The numeric values extracted from the Gerber commands are listed as absolute coordinates relative to the origin vertex 711-0 with units of "inches". For example, second vertex 711-2 has a command line resulting in the vertex of X=0 inch and Y=−0.125 inch (0 inch, −0.125 inch). The points are determined by following the Gerber format described in the Ucamco document "The Gerber Format Specification" (hereby incorporated by reference). The following table shows the vertices and their associated x-y coordinates.

| Vertex | (X, Y) [inch, inch] |
|---|---|
| 711-1 | (0, 0.0125) |
| 711-2 | (0, −0.0125) |
| 711-3 | (0.1625, 0.0125) |
| 711-4 | (0.1375, −0.0125) |
| 711-5 | (0.1375, −0.1000) |
| 711-6 | (0.1625, −0.1000) |

Identifying endpoints can be performed with several techniques such as taking differences between coordinates that have one coordinate the same. For example, first vertex 711-1 and second vertex 711-2 have the same x coordinate, and the difference in the y coordinate is 0.0250 inch which is the width of conductive trace 711 and could be recognized as an endpoint to the line. Third vertex 711-3 and sixth vertex 711-6 have the same x coordinate and the different in the y coordinate is 0.1125 inch which is larger than the line width so this can be assume to be a length of conductive trace. Another example with the same y coordinate is fifth vertex 711-5 and sixth vertex 711-6 has a difference in the x coordinate of 0.025 inch which could be an endpoint.

Optionally, using predetermined parameters regarding line widths, the endpoints are identified. Alternatively, the user may input line widths. Yet another option is that the differences are examined and the line width is determined based on length to width ratios of conductors. Test probes would be placed a distance from the endpoint at least the radius of the test probe. For example, if the test probe has a conductive tip of diameter equal to 0.020 inches, then locating the test probe on top of conductive trace 711 at a distance of 0.010 inch from the endpoint associated with first vertex 711-1 and second vertex 711-2.

Semi-Automated Conductor Testing.

Figure 29A:
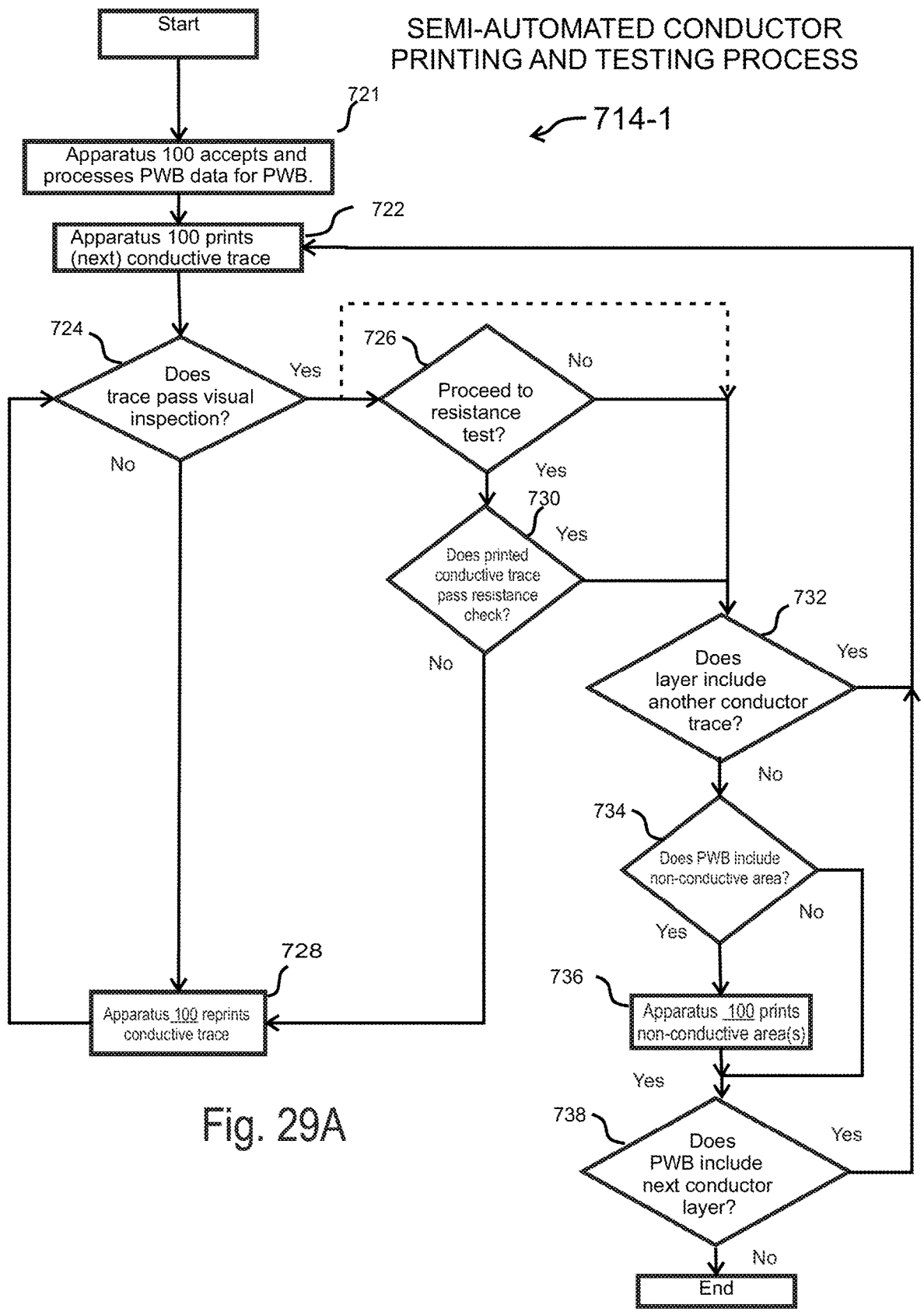
FIG. 29A is flowchart of an embodiment of a semi-automated conductor printing and testing process.

Referring to FIG. 29A, an optional first semi-automated testing process 714-1 for printing a conductive trace, measuring conductive trace resistance, and correcting a faulty trace is shown. The process begins in operation 721 by the LTM 150 of the apparatus 100 accepting geometry data for a PWB including one or more layers of printed conductive traces and optionally layers of nonconductive material to be printed. The geometry data may be obtained from files prepared by a CAD program, such as a Gerber file for example and not limitation. Alternatively, the geometry data may be generated by the LTM 150 based on such CAD files translated by the LTM 150 to data for printing conductive traces and nonconductive areas as discussed previously in this specification. Still further, another option allows data otherwise input to the apparatus 100 by the user.

Preferably, although not required, the LTM 150 organizes the conductive traces in lists corresponding to layers followed by nonconductive area layers to printed as required by either the input file data or the translated data produced by the LTM to facilitate producing the PWB by printing conductive and nonconductive material. That is, a group of conductive traces is printed and tested followed by the printing of nonconductive areas, with this printing sequence being repeated as necessary to complete the PWB. The term "list" is used figuratively in sense that conductive traces are designated for printing in a manner required for functionality of a resultant PWB In operation 722 the apparatus 100 prints a conductive trace based on the geometry data processed which preferably arranged in a list of conductive traces to be printed during a sequence of conductive printings to be implemented. The conductive trace is printed using conductive ink on a non-conductive substrate or, on a non-conductive area previously printed by apparatus 100 using a non-conductive ink.

In operation 724, the apparatus pauses for the user to visually inspect the printed conductive trace for breaks or other anomalies. The LTM 150 initiates display of information that the system is paused and questions whether the conductive trace passes visual inspection. The display of information may be on the display 106 which is either integral to the apparatus 100, or external to the apparatus 100 and connected directly or via a computer used to control or interface with the apparatus 100 as previously discussed. In operation 724 apparatus 100 accepts the user input in the form of a continue command or a reprint command respectively corresponding to the conductive trace passing or failing visual inspection.

When the user visually detects a flaw in the conductive trace the user inputs the reprint command in decision operation 724 which directs the apparatus 100 to recall printing data for the last printed conductive trace and again print the conductive trace in operation 728. The process then moves back to operation 724 for visual inspection.

If the user's visual inspection is acceptable the user inputs continue in operation 724. It is advantageous to measure the electrical properties of printed conductive traces especially when traces are narrow and defects may not be visually apparent. Other times traces are relatively wide and visual inspection will suffice. The apparatus 100 is optionally set to either proceed to prompt for a resistance pass/fail input, prompt the user for input as to whether the conductive traces is to be tested, or proceed directly to bypass the resistance test and move on to operation 732. When the apparatus 100 is previously set to perform the resistance testing, operation 726 directs flow to operation 730 based on the setting. Alternatively, the apparatus 100 may be set to prompt the user as to whether each conductive trace is to be resistance tested in operation 726. A positive user response directs flow to operation 730 while a negative user response directs flow to operation 732. When the apparatus 100 is previously set to not perform the resistance testing, operation 726 directs flow to operation 730 based on the setting. It is further an option that the apparatus 100 is configured only for accepting visual confirmation of the conductive traces in which case a positive response in operation 724 results in flow proceeding directly to operation 732 as shown by the dashed flow line.

In operation 730 the apparatus 100 optionally displays an expected value of the resistance of the conductive trace to compare against the user's measurement. The expected resistance may be calculated by LTM 150 having knowledge of the trace geometry and the conductivity of the conductive ink. The expected resistance may also be located in a database which is retrieved by LTM 150. The apparatus 100 pauses for the user to manually measure the properties of the trace. The user may use a basic ohmmeter to measure the resistance of the printed conductive trace. The apparatus 100 awaits confirmation of an acceptable resistance measurement.

Returning to FIG. 28A, LTM 150 could identify the expected resistance for the complete conductive trace 711. For example, if the specification for resistance of a printed conductive line is 40 mOhm/square, then a printed conductive line that is 1-inch long with a width of 0.020-inch would be expected to have resistance of 2-ohms. In this case, LTM 150 would report this expected resistance to the user and the user would then compare the total expected resistance to the measured resistance. In order to measure the resistance of the entire conductive trace 711, the user would place one ohmmeter lead on top of conductive trace 711 at location 711D and a second ohmmeter lead on top of conductive trace 711 at location 711E. If the measured resistance is higher than expected, apparatus 100 is directed to reprint the entire conductive trace 711. As discussed, the user would then have the option to retest the electrical connection and repeat the process if necessary.

As an alternative to displaying an expected resistance, the apparatus 100 may simply await confirmation of an acceptable resistance measurement. An nominal value of resistance may simply be assumed for a conductive trace or traces as may be the case where circuitry has high impedance inputs and little current is used, or other situation where a low resistance connection is not required.

If the measured resistance is unacceptable, the user provides a negative input in operation 730 and flow proceeds to operation 728 wherein that conductive trace is reprinted and flow then proceed to another inspection of the trace. If the user determines that a reprint is not required, i.e., the resistance measurement is acceptable, flow proceeds to operation 732 wherein the apparatus 100 determines whether there are further conductive traces to be printed in the given group prior to printing of nonconductive material. As noted above, the LTM 150 optionally processes the PWB data to assemble groupings of conductive traces to be printed sequentially prior to a grouping of nonconductive areas to be sequentially printed, with the printing of sequences of conductive traces and sequences of nonconductive areas being repeated until the PWB is complete. If there remain further conductive traces in a grouping, or layer, to be printed, flow returns to operation 722 and a next conductive traces in a sequence is printed.

If the sequence, or layer, of conductive traces to be printed has been completed, operation 732 yields a negative outcome and flow proceeds to operation 734 wherein it is determined whether the processed PWB data next requires printing of nonconductive areas. If so, flow proceeds to operation 736 wherein the LTM 150 moves on to printing non-conductive areas as required. Printing non-conductive areas may be performed automatically after the resistance measurement or LTM 150 may request an input from the user in order to continue processing the PWB. In a multi-layered PWB, LTM 150 proceeds to the next layer of conductive and non-conductive geometries based on operation 732-738, with operation continuing until the PWB is complete.

It should be noted that measuring electrical connection between two locations on a printed conductive trace can be measured using a variety of techniques. The ohmmeter is a standard measurement technique. Other techniques include applying a voltage and/or current at one location along the printed conductive trace and measuring the voltage and/or current at another location along the trace. The resistance can be determined by using the Ohm's law equation. The user may also use other instrumentation to measure the electrical performance of the trace including capacitance, inductance, insertion loss, return loss, time domain reflectometry (TDR) or any other measurement technique that can verify that the printed conductive trace is capable of performing the intended function. Thus, while resistance is referenced above, other parameters may be substituted.

Semi-Automated Conductor Layer Testing.

Figure 29B:
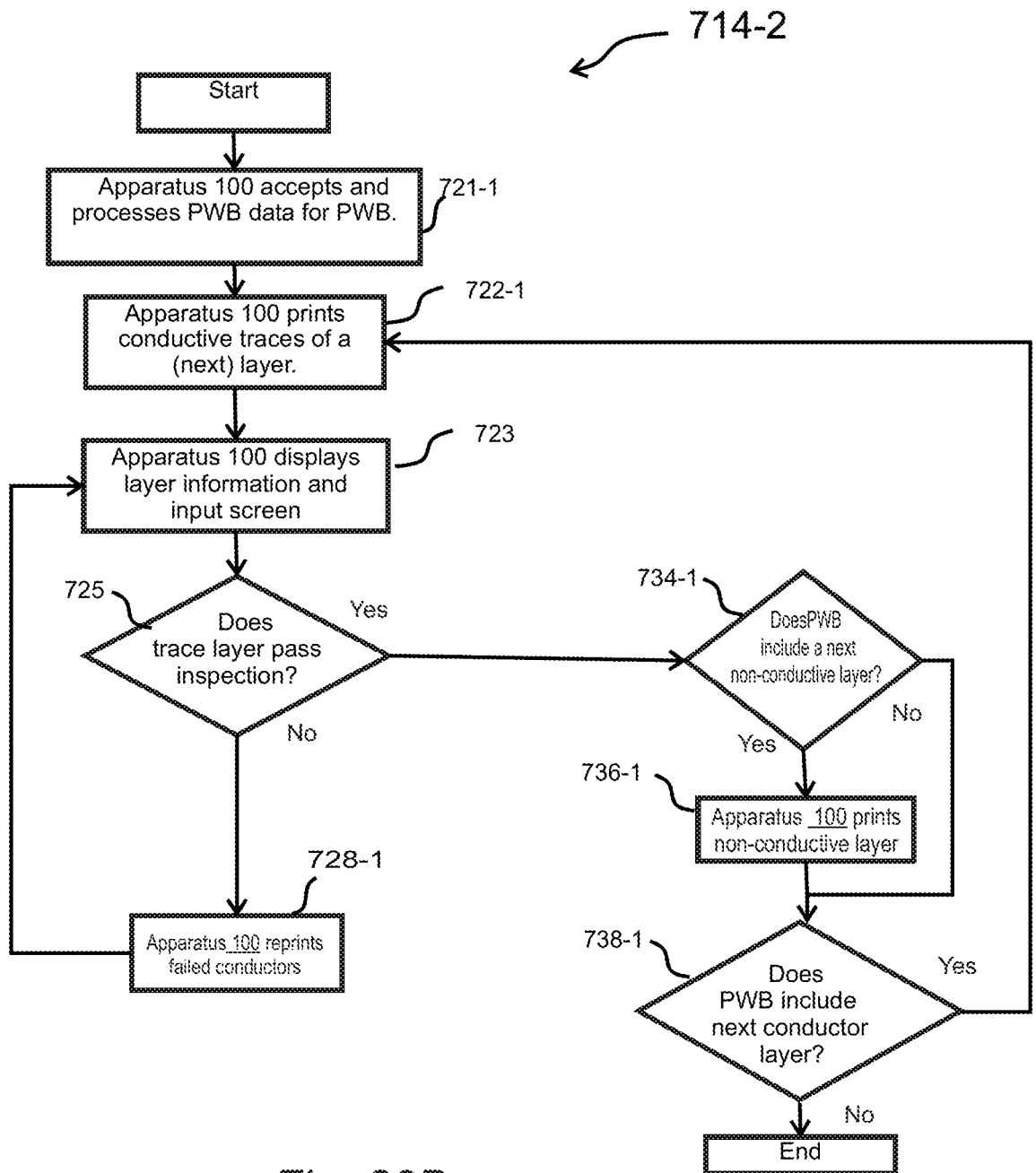
FIG. 29b is flowchart of an embodiment of a semi-automated conductor layer printing and testing process.

When a multilayer PWB is to be printed there may be numerous conductive traces on a single layer and there may be multiple layers. In such situation it may be advantageous to effect conductor testing in groups, or layers, rather than one at a time. Referring to FIG. 29B, a second semi-automated testing process 714-2 is shown which is directed to situations wherein numerous conductive traces are printed on a given layer and is similar to the first semi-automated testing process except as noted herein. This testing process provides for a group of conductive traces to be printed and tested followed by the printing of nonconductive areas if required, with this printing sequence being repeated as necessary to complete the PWB.

The process begins in operation 721-1 by the LTM 150 of the apparatus 100 accepting geometry data for a PWB including one or more layers of printed conductive traces and optionally layers of nonconductive material to be printed as discussed above with reference to operation 721. In the case where a multilayer PWB is to be produced the conductors to be printed are grouped in layers as are the nonconductive areas. The LTM 150 organizes the conductive traces in layers followed by nonconductive layers as required by either the input file data or the translated data produced by the LTM to facilitate producing the PWB by printing conductive and nonconductive material.

Figure 29C:
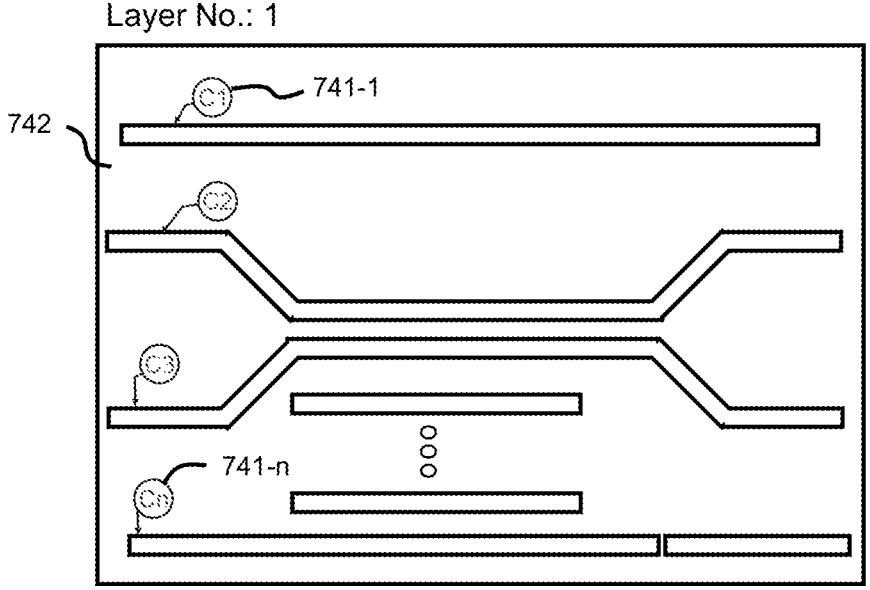
FIG. 29C is a depiction of an embodiment of a display screen for displaying conductor layer data and inputting test results.

In operation 722-1 the apparatus 100 prints conductive traces of a layer, or a next layer, based on the geometry data. The conductive trace or traces are printed using conductive ink on a non-conductive substrate or, on a non-conductive area previously printed by apparatus 100 using a non-conductive ink or material. In operation 723 the apparatus displays a layer information on the display 106. Referring to FIG. 29C, an optional configuration of layer information is depicted as layer information screen 740. A printed layer depiction 742 is in the upper half of the display wherein conductors are optionally given call out labels 741-1 through 741-*n* which correspond to rows in a conductor data table 744 in a lower half of the display. Other information related to the PWB being fabricated is optionally displayed such as, for example and not limitation, a layer number of the layer depicted, a total number of layers in the PWB, a number of conductors in the depicted layer. A conductor table 744 optionally displays an expected resistance for conductors of the depicted layer and include columns for the user to mark whether a give conductor passes or fails review. Input may be via, for example and not limitation, touch screen, keypad or key board, a mouse or other pointing device. Applying callouts labeling the conductors is optional and other methods of coordinating information displayed and input to the conductors may be employed. For example, the user may highlight a given conductor to obtain information and/or input testing status for the conductor. Input buttons for reprinting the failed conductors or proceeding to the next layer for printing are optionally provided at the screen bottom section. Alternatively, simply "Continue" input may be used wherein the apparatus proceeds to reprint failed conductors or proceeds to print a next layer if no failures are found.

Referring again to FIG. 29B, in operation 725 the apparatus awaits the user input indicating whether the printed layer passes inspection. The user may visually and/or electrically inspect each of the conductors and input using the layer information screen 740 which conductors do not pass inspection. By selecting the "Reprint Failed Conductors" button the user directs the apparatus 100 to reprint conductors for which a failed input is made. It is not necessary to have a "passed" input field but such a field may be helpful in keeping track of tested conductors. A further alternative is for the user to activate a "Continue" input which the apparatus interprets as requesting a reprint of all failed conductors and alternatively instruction to proceed to a next layer if no conductors are failed.

When the user detects flawed traces and initiates a reprint in operation 725, flow proceeds to operation 728-1 wherein the LTM150 recalls the geometry data for the failed traces and operates the apparatus 100 to gain print the failed traces. Flow the proceeds back to operation 723 wherein the layer information screen 740 is again displayed. As an option, the display may only display rows for the previously failed conductors in the conductor data table 744. Alternatively, failed conductor rows may be highlighted for soliciting user input. Still further the full table may be displayed but all conductors not previously indicated as failed may be displayed with the "Pass" indication being affirmative. Other methods may be adopted to simplify subsequent verification operations. As an alternative to displaying an expected resistance in the conductor data table 744, the apparatus 100 may simply await confirmation of an acceptable conductor review.

If the user determines that a reprint is not required, i.e., the all conductors of the layer are acceptable, flow proceeds to operation 734-1 wherein the apparatus 100 determines whether there is a subsequent layer of nonconductive areas to be printed. If so, flow proceeds to operation 736-1 wherein the LTM 150 moves on to printing a layer of non-conductive areas as required. Alternatively, flow proceeds to operation 738-1 wherein it is determined whether there is further conductive layer to be printed. If so, flow proceeds back to operation 722-1 and another layer of conductors is printed. Similarly, following operation 736-1 printing a nonconductive layer, operation proceeds to operation 738-1.

When further conductive layers remain flow proceeds back to operation 722-1 wherein another layer of conductive traces is printed. Alternatively, no conductive trace layers remain to be printed, the PWB is complete and the process ends.

Automatic Trace Correction.

One type of traditional test system for testing the electrical continuity and electrical isolation of conductive traces is known as a Universal Grid system. These test systems use a single, double or quad-density grid pattern of test points assembled into a fixture and placed in contact with a fabricated PWB. For example, a single-density grid pattern has spacing of 0.1-inch by 0.1-inch resulting in a 100 points/inch-squared density. A quad-density grid has a density of 400 points/inch-squared. These systems are stand-alone and separate from the PWB fabrication equipment and assembly equipment. The universal grid system may make use of a test-file, such as an IPC-D-356 CAD/CAM file, for identifying the location of via holes and pads. These files identify if the feature is located at the top or the bottom of a chemically etched PWB. For a multi-layer PWB, the universal grid system may not be able to identify conductive line problems embedded within the stack-up and does not allow the user the option to repair the conductive trace as the PWB as the PWB was previously laminated together during PWB fabrication. In this case, when a PWB conductive trace is found faulty, the entire PWB is typically discarded unless a jumper wire is attached external to the PWB. Another type of traditional test system is the Flying Probe-Type system. A flying probe system use robotic probes that are moved across the board for making contact with the conductive traces. Here again, the flying probe may not be able to identify conductive line problems within the multilayered stack-up or does not allow the user the option to repair the conductive trace as the PWB was previous laminated together and no longer repairable.

Using apparatus 100 for printing a single layered, or multilayered PWB, it is possible to automatically test the electrical performance of a printed conductive trace and automatically correct the printed conductive trace which may include a break or undesired high resistance. Referring to FIG. 4, a block diagram of apparatus 100 shows an optional electrical measurement unit 760. Electrical measurement unit 760 includes a probe holder mechanism 762 for probing the surface of a printed conductive trace and electrical test instrument 761 to measure a characteristic of a printed conductive trace. The probe mechanism 762 optionally provides a holder for a single probe tip for contacting the surface of the printed conductive trace. Alternatively, the probe mechanism 762 may alternatively include a holder for two, or more, probe tips configured for positioning probes to contact a surface of a printed conductive trace at two, or more, points along the trace. The probe mechanism 762 also is optionally configured to position a probe tip or tips for a non-contact type measurement which would make electrical connection(s) to the printed conductive trace though capacitive coupling. A non-contact probe will not mar the surface of the printed conductive trace.

Figure 30A:
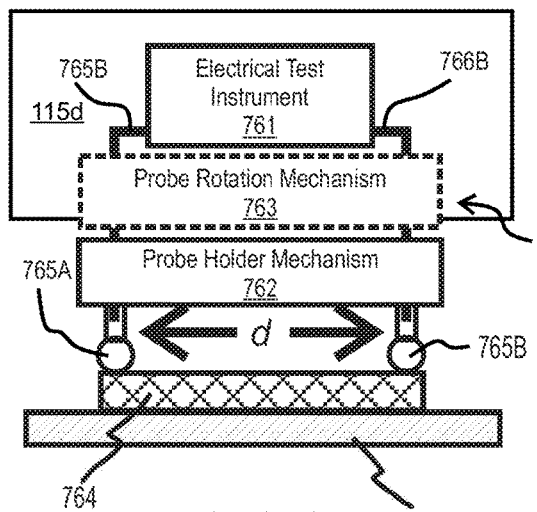
FIG. 30A is a schematic diagram of an embodiment of an electrical measurement unit comprising an electrical test instrument, an optional probe rotation mechanism, and a probe holder mechanism.
Figure 30B:
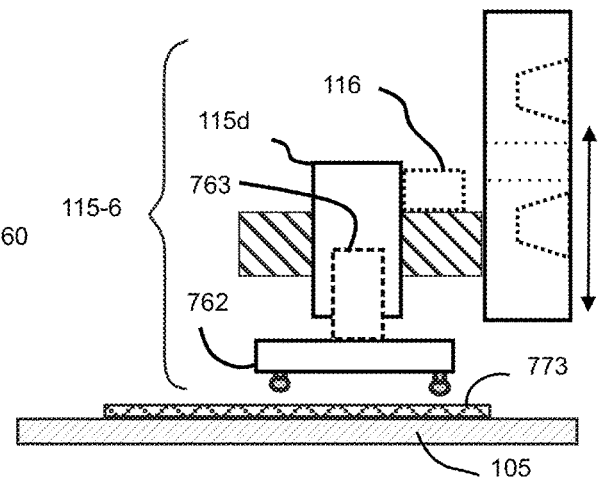
FIG. 30B is a side elevation partial cross section view of an embodiment of a function head comprising an optional probe rotation mechanism, an optional head module rotation mechanism, and a probe holder mechanism.

Referring to FIGS. 30A and 30B the electrical measurement unit 760 is contained in a measurement function head module 115*d* which mounts to apparatus 100 at head mount 110 (shown in FIGS. 5*a* and 5*b*) via a function head 115-6. The head mount 110 provides for three-axis movement of the function head 115-6. Probe holder mechanism 762, being attached to head mount 110, may be rotated relative to the PWB using either the table rotator 139, shown in FIG. 5B, or the rotation motor 116 for rotating the measurement function head module 115*d*. Alternatively, optionally provided is a probe rotation mechanism 763 which rotates the probe holder relative to the measurement function head module 115d. The electrical measurement unit 760 is schematically represented in FIG. 30A and is shown including the optional probe rotation mechanism 763 for rotating probe holder mechanism 762 absent rotation of the table 104 or the function head unit 115d. Hence, the probe rotation mechanism 163 may be omitted if other modes of rotation are to be used. Alternatively, the function head 115-6 for carrying the probe holder mechanism 162 may be configured absent the rotation motor 116 if probe rotation mechanism 163 is present.

As shown in FIG. 30A, the electrical test instrument 761 is connected to first test probe 765A using first probe wire 765B. Electrical test instrument 761 is connected to second test probe 765B using second probe wire 766B. First test probe 765A and/or second test probe 765B may be of a contact-type, having physical contact with the printed conductive line 764 or may be of a contactless-type not having physical contact with the printed conductive line 764. Printed conductive trace 764 is printed on a non-conductive material substrate 105.

The functional portions of the electrical measurement unit 760 may be split with the probe rotation mechanism 763 and probe holder mechanism 762 being mounted to head mount 110 via the function head 115-6 while the electrical test instrument 761 is situated otherwise on the apparatus 100. First probe wire 765B would connect electrical test instrument 761 to first probe tip 765A. First probe wire 765B may include a connector to temporarily disconnect electrical test instrument 761 from first probe tip 765A. Probe holder mechanism 762 may also be temporarily mounted to function head 115 as a separate mechanism. If required, probe rotation mechanism 763 may also be temporarily mounted to function head 115 as a separate mechanism.

A further configuration includes measurement probes 765A and 765B being incorporated into the ink printing mechanism 120 since, as related below, the ink printing mechanism 120 need not make contact with the substrate 105 so the probes may protrude below the ink printing mechanism 120 and selectively make contact with printed conductors by means of vertical movement of the head mount 110. Rather than incorporate into the ink printing mechanism, the probe holder mechanism 762 may be mounted to the ink printing mechanism 120. If required, the probe rotation mechanism 763 may be mounted to ink printing mechanism 120.

Electrical test instrument 761 include types of two-wire and four-wire test systems for measuring the electrical performance of the printed conductive trace. Four-wire test systems are more accurate but require measurement of current and voltage separately. Electrical test instrument 761 also includes measurement types that are capable of measuring the electrical performance of the printed conductive trace which include capacitance, inductance, insertion loss, return loss, time domain reflectometry (TDR) or any other measurement technique that can verify that the printed conductive trace is capable of performing the intended function. For a basic resistance test between two test points, as shown in FIG. 30A, the first test probe 765A and the second continuity test probe 765B are placed in temporary contact with printed conductive trace 764. The first test probe 765A and the second test probe 765B may be configured as spring-loaded pins, also known as pogo-pins, with a tip-shape that will not damage the printed conductive trace 764. Spring probes typically present approximately 75 grams to 130 grams of force when compressed. Another option is to have first test probe 765A and second test probe 765B supported via function head 115-6 by the head mount 110 which has the capability of movement in the vertical axis and can be used to lower first test probe 765A and second test probe 765B to touch the surface of printed conductive trace 764 without causing damage to the printed conductive trace 764. Another technique for determining the electrical continuity of printed conductive trace 764 include applying a voltage across first test probe 765A and second test probe 765B and measuring the current passing through conductive trace 764 and the resistance can be calculated using the Ohm's law equation, specifically, resistance equals voltage divided by current. Another technique for determining the electrical continuity of printed conductive trace 764 include passing a current through the test probes and conductive trace and measuring the associated voltage.

Referring to FIG. 30A, a schematic representation of a probe holder mechanism 762 illustrate that the first test probe 765A and the second test probe 765B are separated by a distance d. The distance d may be predetermined and associated with the smallest line length for the printed conductive trace 764 and the user would manually adjust the spacing between first test probe 765A and second test probe 765B to this predetermined distance. Another variation would have LTM 150 automatically adjust the spacing, d, between first test probe 765A and second test probe 765B to a predetermined distance. Another variation includes LTM 150 reporting the optimized spacing between first test probe 765A and second test probe 765B based on the geometry of printed conductive trace 764 to be tested and then direct the user to manually adjust the spacing between first test probe 765A and second test probe 765B, or, LTM 150 would automatically adjust the spacing between first test probe 765A and second test probe 765B.

In the situation that the probe holder mechanism 762 has a probe separation d that is less than the length of a printed conductive trace, two or more electrical measurements are optionally effected as the first test probe 765A and the second test probe 765B are moved along the printed conductive trace in order to completely measure the electrical properties of the entire printed conductive trace. This technique can also be used to overprint a conductive trace until a desired trace resistance is measured using electrical test unit 760. Overprinting may be required for printed conductive traces that are expected to carry a large current during the PWB intended operation.

Figure 30C:
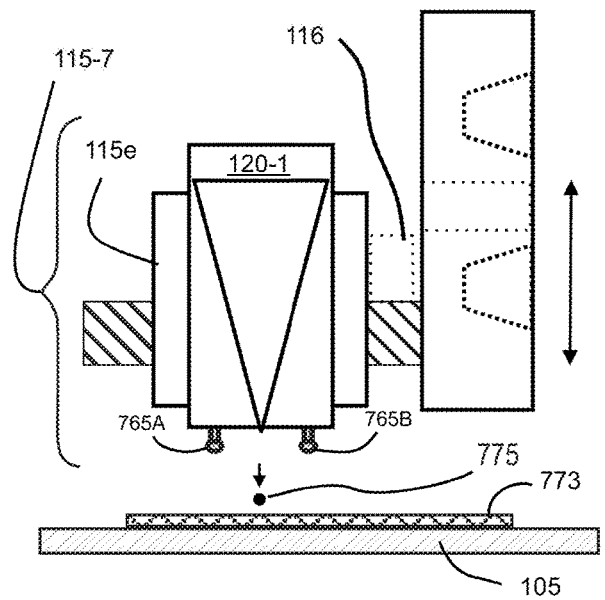
FIG. 30C is a side elevation partial cross section view of an embodiment of a function head comprising optional an optional head module rotation mechanism, and a printhead configured with probes for electrical testing.

In an embodiment of the ink printing mechanism 120, the process for printing conductive traces using thermal and piezoelectric technologies results in a droplet of conductive ink being ejected from an electronically-controlled printing element. In both cases, the printing element does not need to be in contact with the surface of the substrate and has a spacing that is typically between 1-2 mm. This spacing allows the test probes to be located at a closer distance to the substrate which then can be lowered to make contact with the printed conductive ink for continuity testing. Referring to FIG. 30C, this distancing of the printhead from the substrate allows for the test probes, 765A and 765B, to be incorporated directly into a print-test head 120-1 which is symbolically shown. (In FIGS. 6a-6e, printing mechanisms 120, 130, 140 are shown as triangles for purposes of simplicity) The print-test head 120-1 mounts in print-test function module 115e which is carried in a print-test head mount 115-7. When testing is not effected, and printing is in progress, the print-test head 120-1 is positioned above the substrate 105 and ink droplets 775 are ejected to form the conductive trace 773. Hence a printhead utilizing piezoelectric, thermal, or other ejection technology has probes directly incorporated in a bottom of and probe leads making connection along with the usual control contacts of a printhead. When testing commences, ink ejection ceases and the print-test head 120-1 is raised and lowered by the head mount 110 to test portions of conductors.

Figure 30D:
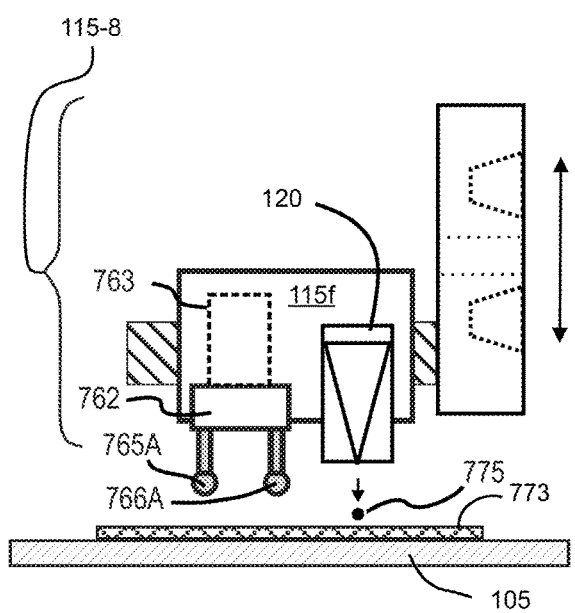
FIG. 30D is a side elevation partial cross section view of an embodiment of a dual function head comprising a printhead and a probe holder mechanism with an optional probe holder rotation mechanism.

Referring to FIG. 30D, there is shown a side-view of a dual function head module 115*f* configured to carry the probe holder mechanism 162 and the conductive ink printing mechanism 120. The dual function head module 115*f* is carried in dual function head 115-8 which mounts to the head mount 110 shown in FIG. 5B. Optionally, the probe rotation mechanism 763 is also included. First test probe 765A and second test probe 765B are mounted to probe holder mechanism 762 and positioned below conductive ink printing element 120 such that first test probe 765A and second test probe 765B can be lowered by apparatus 100 in order to make temporary electrical contact with the conductor 773 and also prevent physical contact of the conductive ink printing element 120 with the substrate 105. Typically, the first test probe 765A and the second test probe 765B can be positioned about 0.5 mm below conductive ink printing element 731.

The LTM 150 controls the position any of the ink printing mechanism, 120 or 120-1, in the vertical direction to provide an appropriate spacing required for printing onto substrate 105. Then conductive ink printing mechanism 120 ejects ink droplet 775 onto the substrate 105. The process continues as the head mount, either the dual function head 115-8 or the print-test head mount 115-7, is moved across the substrate 105 until a series of contiguous droplets create conductive trace 773. Testing the electrical performance is achieved with the probes holder mechanism 762 in the dual function head module 115*e* or the print-test head 120-1.

Reprinting a conductive trace results in printing over the original trace with the same or similar geometry. LTM 150 may automatically reprint the conductive trace if the measured resistance is above a user-entered or calculated value. The calculated value for trace resistance can be automatically determined by LTM 150 knowing the printed trace geometry and the sheet resistivity of the printed conductive ink. When the apparatus 100 is configured for automated testing and correction it may carry either the dual function head 115-8 or the print-test head 115-7. This allows printing and testing to be done without reconfiguring the function head. Alternatively, the apparatus 100 may effect printing the conductive traces using the function head 115-1 (shown in FIG. 6*a*) carrying the ink printing mechanism 120, and automatically exchange the function head module 115*a* for the measurement function head module 115*d*.

Various configurations have been depicted in this description and accompanying drawing for carrying and mounting a printhead, syringe dispenser, extruder, measurement device, and combinations thereof to a head mount 110. These configurations are to be considered examples and are not intended to limit the scope of this disclosure or appended claims. Other configurations for mounting devices effecting any of the functionalities disclosed herein may be adapted to the actualization of apparatus 100 and processes described herein. In the following processes wherein the apparatus 100 alternates between printing conductive traces and effecting measurement of the trace it will be accepted that any of the above noted configurations for effecting the functions of printing and measuring may be employed. For purposes of clarity, discussion of effecting exchanges of the printing function head module 115*a* for the measurement function head module 115*e* will be omitted and statement of the effected function is presumed to include such exchange if required by the configuration of the apparatus 100.

Processes are next described wherein the apparatus effects printing conductive traces and correcting flawed traces. The processes shown starts after a substrate 105 is loaded onto the table 104 or is formed on the table 104 by the apparatus 100 printing the substrate using nonconductive material or extruding nonconductive material to form a substrate. In these processes it is assumed that the probe separation d does not always permit and entire conductive trace to be tested in one measurement. However, it is possible that the probe holder mechanism 762 is adjustable with sufficient range for testing entire conductors. This depends on the PWB size and the range of the probe holder mechanism. Hence, it is understood that given sufficient range, operations to test entire conductors need only adjust the probe separation d to accommodate endpoints of the conductor. Thus it is implicit in the processes describe that if such range is available, each measurement operation constitutes adjusting the range and testing the entire conductor. Subsequent operations directed to testing the entire conductor in segments, or portions, are therefore obviated.

Figure 31A:
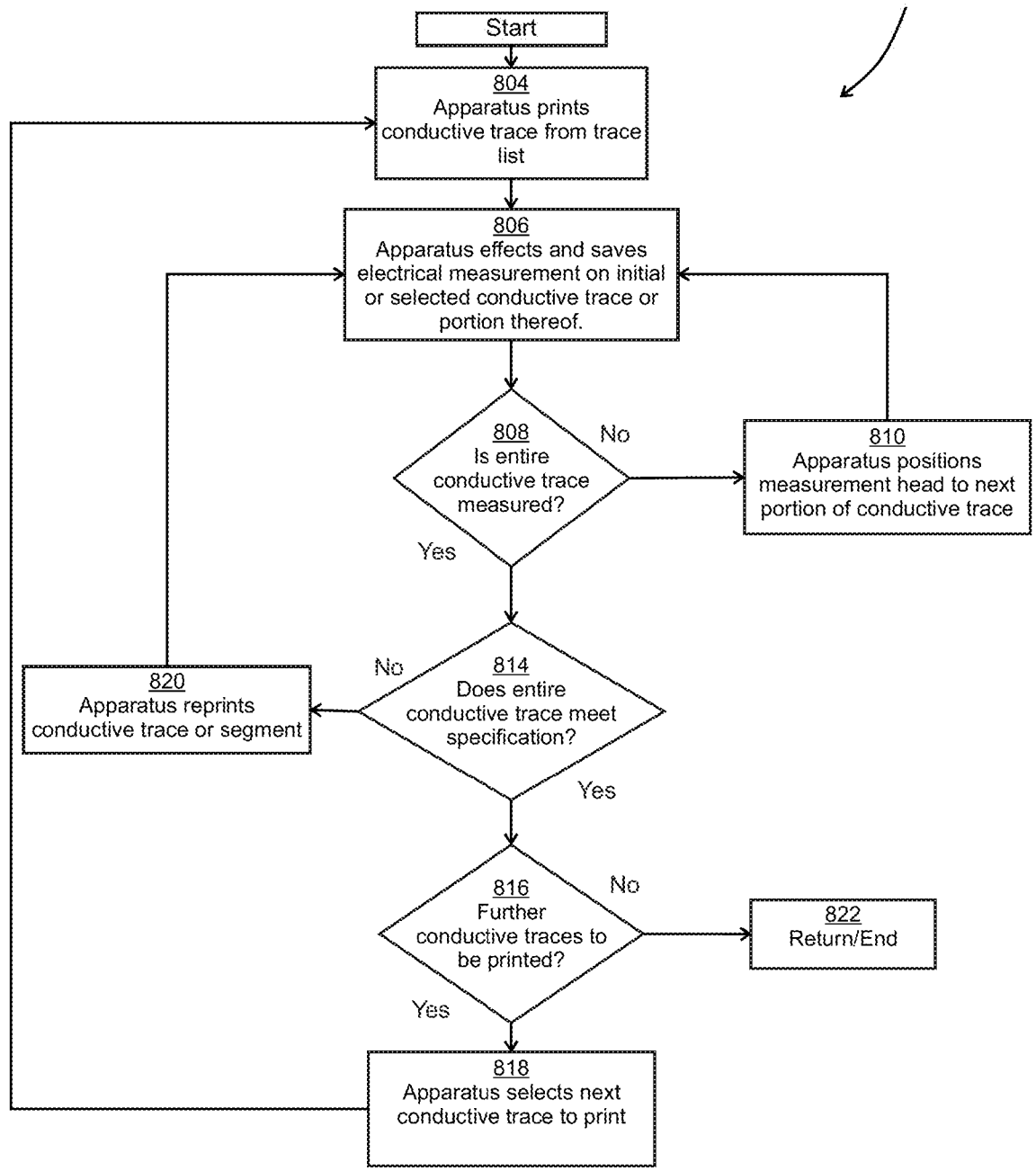
FIG. 31A is flowchart of an embodiment of a sub-process for automated conductor printing and testing wherein conductors are printed and then tested.

Referring to FIG. 31A, a sub-process flowchart is shown wherein apparatus 100 effects a conductor printing and correction process 800 which prints conductive traces, tests the printed traces, reprints conductive traces that fail to pass a measurement test. In operation 804 the sub-process begins accepting conductive trace geometry data which includes data for conductive traces segments which together comprise data for entire conductive traces. The apparatus 100 processes the data and prints a conductive trace. In the next operation the LTM 150 directs apparatus 100 to measures the electrical performance for the printed conductive trace using any of the aforesaid measurement configurations. As previously related, depending on probe space d either an entire trace is measured or a segment, or portion, of the traces is measured. The measurement is saved. In operation 808 it is determined whether the test probe spacing d provided measurement over the entire conductive trace. If the result is negative flow proceeds to operation 810 wherein the probe holder mechanism is repositioned over a different, and contiguous, portion of the selected conductive line. Flow then proceeds to operation 806 wherein a further electrical measurement is made and saved with flow again proceeding to operation 808. When operation 808 yields a positive result, flow proceeds to operation 814 wherein the saved electrical measurements for the conductive trace are evaluated and it is determined whether the conductive trace meets specification. If the result is negative, flow proceeds to operation 820 wherein the conductive trace is reprinted, either in whole or in part. For example, a failed segment of the conductive trace may be reprinted or the entire trace may be reprinted. Flow then proceeds back to operation 806 wherein the measurement operations are again effected.

When operation 814 yields a positive result flow proceeds to operation 816 wherein it is determined whether further conductive traces exist in the trace list to be printed. An affirmative result directs flow back to operation 804 and the next conductive trace is printed. A negative result ends the sub-process with all the traces described in the trace list having been printed, tested, and corrected if necessary.

Figure 31B:
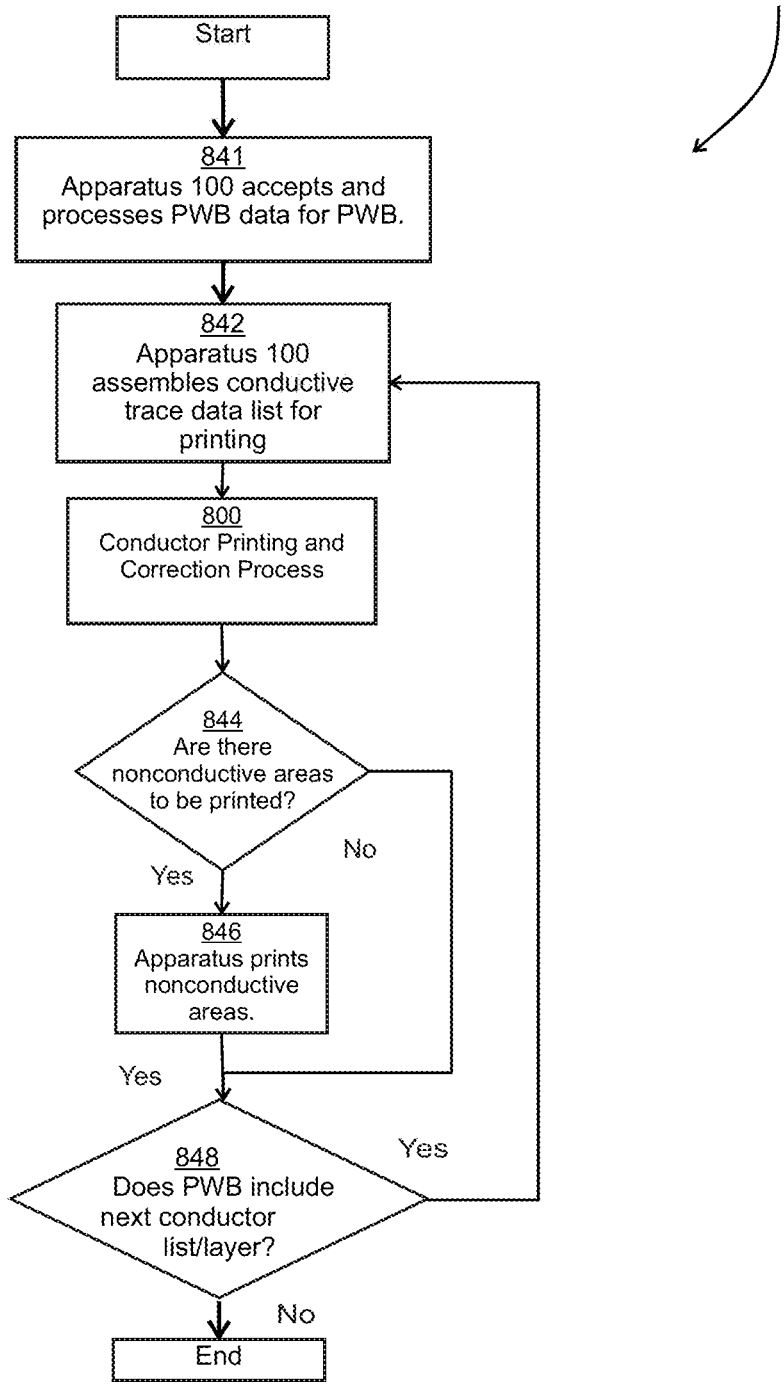
FIG. 31B is flowchart of an embodiment of a process for producing a PWB including the sub-process of FIG. 31A.

Referring to FIG. 31B, a process flowchart is shown for a PWB process with conductor correction 840 which incorporates the conductor printing and correction process 800 detailed above. In operation 841 the LTM 150 of the apparatus 100 accepts geometry data for a PWB including one or more layers of printed conductive traces and optionally layers of nonconductive material to be printed, as discussed above with reference to operation 721. In the case where a multilayer PWB is to be produced the conductors to be printed are grouped in layers as are the nonconductive areas. In operation 842 the LTM 150 organizes the conductive traces in lists corresponding to layers followed by nonconductive layers as required by either the input file data or the translated data produced by the LTM to facilitate producing the PWB by printing conductive and nonconductive material. The term "list" is used figuratively in sense that conductive traces are designated for printing.

Once the printing data is prepared flow proceeds to the conductor printing and correction process 800 detailed above. As discussed this operation prints and test conductors as they are printed. A conductor is printed, then tested, and corrected if necessary. Each conductor of the list of conductive traces is thus printed and verified by measurement. After completion, flow proceeds to operation 844 wherein it is determined if nonconductive areas are to be printed next and operation 848 is effected to print the nonconductive areas if necessary. Alternatively, flow proceeds to operation 848 wherein it determined if there is another conductor layer or conductors in a further list to be printed. It is possible that a list does not comprise a complete layer, as portions of layers may be printed as a group. If further printing is required flow proceeds back to operation 842 wherein a next list of conductors is prepared for printing. If operation 848 yields a negative result, then all the conductive and nonconductive areas have been printed and the PWB is now ready to accept populating with components.

Figure 32A:
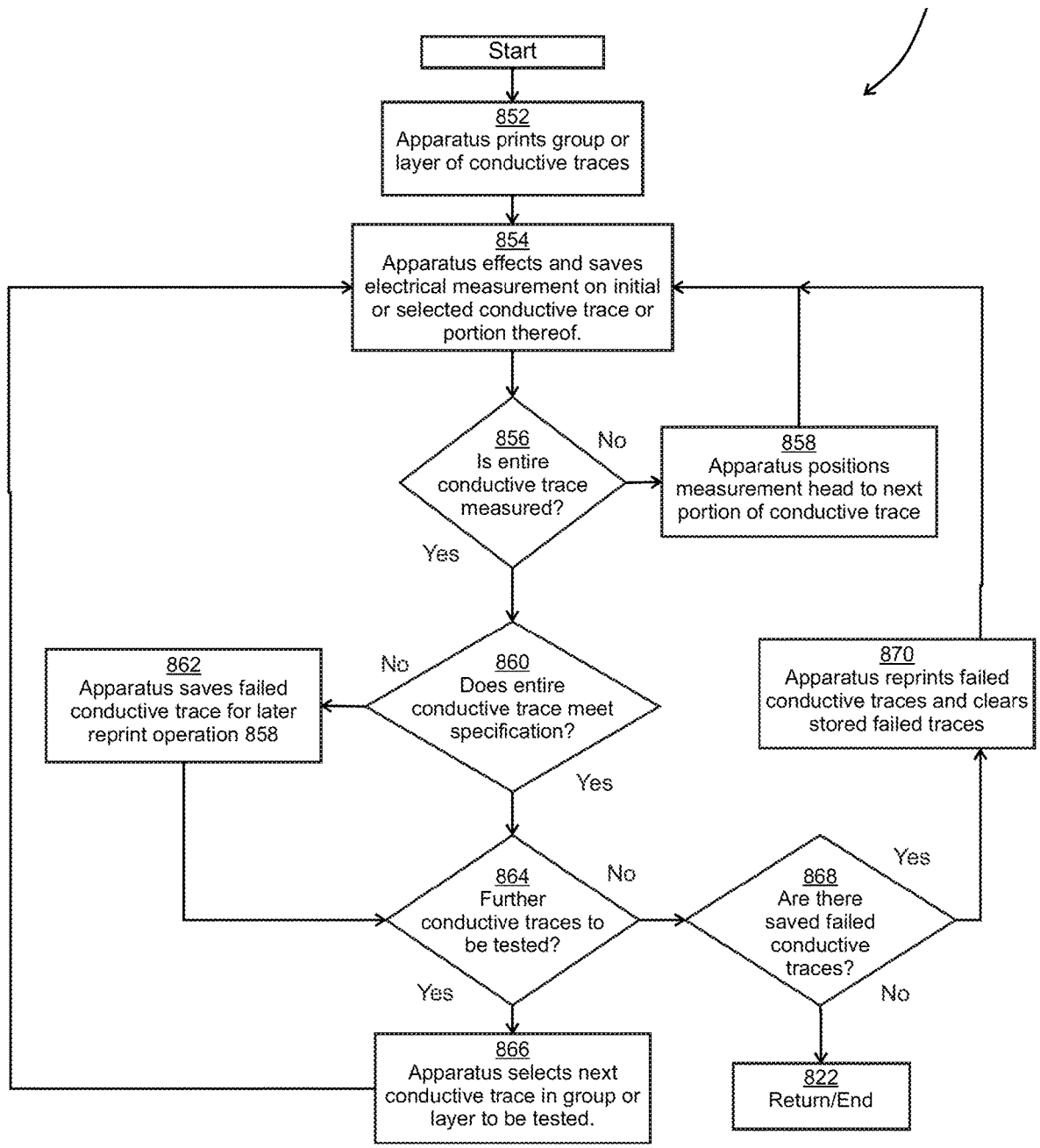
FIG. 32A is flowchart of an embodiment of a sub-process for automated conductor layer or group printing and testing wherein conductors of the layer or group are printed and then the printed conductors of the layer or group are tested.

Referring to FIG. 32A, another a sub-process flowchart is shown wherein apparatus 100 effects a conductor layer printing and correction process 850 which prints conductive traces of a layer or group, then tests the printed traces while saving failure data, and then reprints conductive traces that fail to pass a measurement test. In operation 852 the LTM 150 directs apparatus 100 to sequentially print conductive traces from a prepared list for a group or a layer. In operation 854 the apparatus 100 proceeds measure a conductive trace or segment thereof from the list and saves the test result. In operation 856 it is determined if the entire conductive trace has been tested, if not flow proceeds to operation 858 wherein the measurement head is move to place the probes on a next portion, or segment, of the conductive trace, followed by flow proceeding back to operation 854 where a further measurement is effected. Alternatively, flow proceeds to operation 860 wherein the saved measurements are examined and it is determined if the entire trace meets specification. If the result is negative, flow proceeds to operation 862 wherein indication of the failed trace is saved for later reprinting. If the result is positive operation 864 is effected wherein it is determined if there are further traces in the list to be tested, a positive response results in operation 866 wherein a next trace to be tested is selected from the list of the group or layer.

When all printed traces of the layer or group are tested, operation 864 directs flow to operation 868 wherein a determination is made as to whether there have are failed conductive traces.

As positive result directs flow to operation 870 wherein the apparatus proceeds to reprint the failed conductive traces. Where the conductive traces are tested in segments, reprinting may be limited to reprinting only the failed segments. Once the reprinting is complete flow proceeds back to operation 854 wherein testing is again conducted. If no failures have been detected the sub-process is complete, all conductors of the group or layer have been successfully printed, and flow returns to a process calling the sub-process.

Figure 32B:
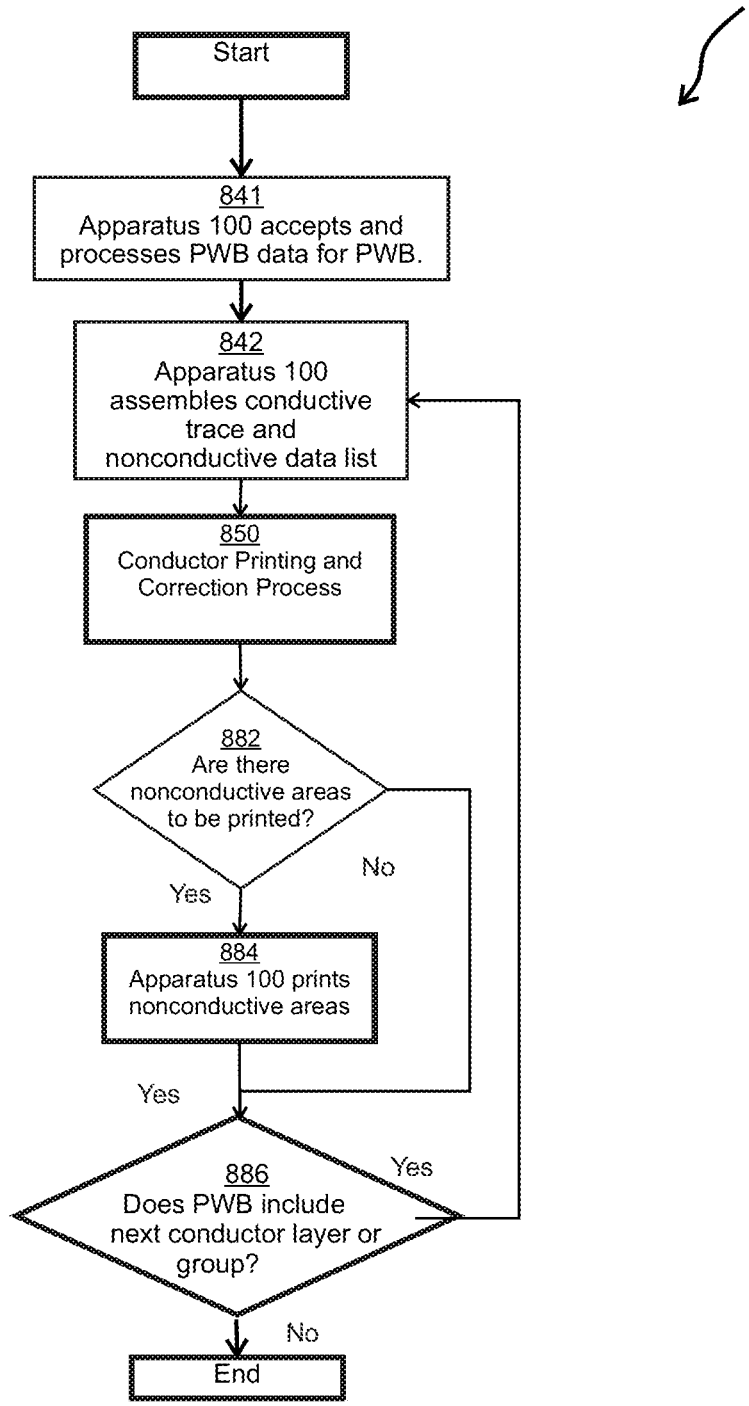
FIG. 32B is flowchart of an embodiment of a process for producing a PWB including the sub-process of FIG. 32

Referring to FIG. 32B, a PWB printing with layer correction process 880 is shown which utilizes the conductor layer printing and correction process 850. In the operation 841, discussed above, the LTM 150 of the apparatus 100 accepts geometry data for a PWB including one or more layers of printed conductive traces and optionally layers of nonconductive material to be printed, and processes the data as required for printing the PWB. In operation 842, discussed above, the LTM organizes the conductive traces in lists corresponding to layers followed by nonconductive layers as required by either the input file data or the translated data produced by the LTM to facilitate producing the PWB by printing conductive and nonconductive material. The flow then proceeds to call the sub-process of FIG. 32A, i.e., the conductor layer printing and correction process 850. This sub-process proceeds to print, test, and correct all conductors of a given layer or group.

After all conductors of a layer or group from the list have been successfully printed, flow proceeds to operation 882 wherein it is determined whether there are nonconductive areas to be printed after the last group or layer of conductive traces has been printed. If there are flow proceeds to operation 884 wherein the apparatus 100 prints the nonconductive areas as required by the processed PWB data. When no nonconductive areas are to be printed, or all nonconductive areas are printed, flow proceeds to operation 886 wherein it is determined whether there are further conductor layers or groups to be printed, and if so flow proceeds back to operation 842 and a next list is prepared to be operated upon by the conductor layer printing and correction process 850.

Selective Board Stiffness.

Printing conductive and non-conductive inks on a flexible substrate provides a means for positioning the final PCB assembly into a non-planar configuration. Over-flexing the substrate can cause damage to the printed conductive lines, printed non-conductive lines, electrical circuit components and a component attachment point to the printed conductive lines. Traditional methods for providing localized stiffness to a flexible substrate include a separate process of bonding rigid materials, such as glass/epoxy board or polyimide film, to one side on the PWB substrate. For this disclosure, the process for creating localized rigidity involves printing conductive and/or non-conductive materials during the fabrication of the PWB.

Figure 33A:
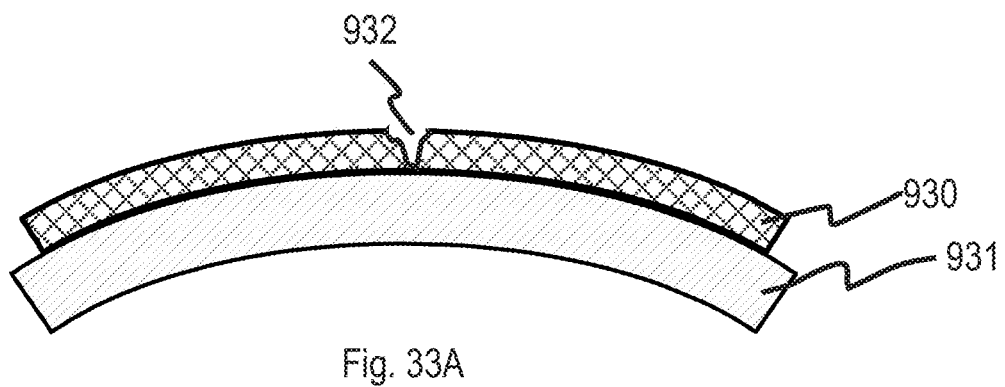
FIG. 33A is a side elevation view of a flexible printed circuit having a conductor flaw.

FIG. 33A shows a side view section of a portion of flexible substrate 831 with printed conductive trace 830 arranged with a shape in a curve. If the bend radius of the curve is smaller than the limit required to maintain electrical continuity across the length of printed conductive trace 830, then printed conductive trace 830 may result in fracture 832 and a circuit failure may result.

Figure 33B:
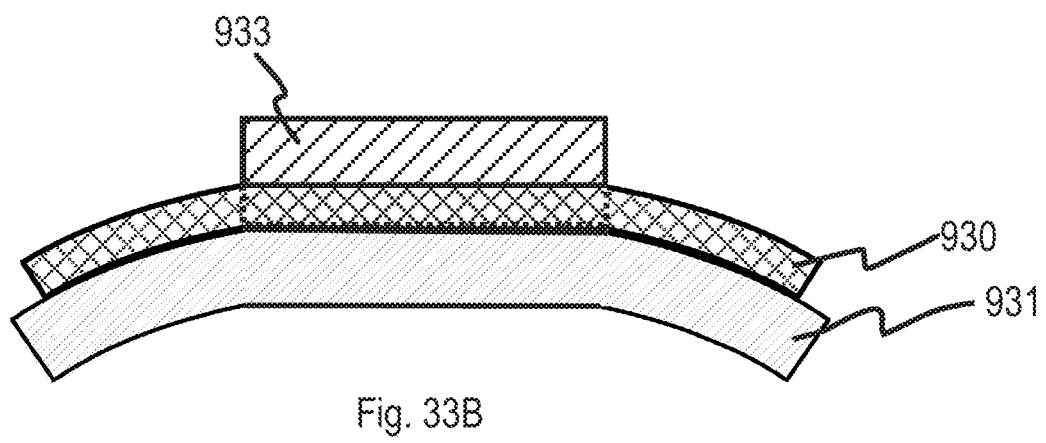
FIG. 33B is a side elevation view of an embodiment of flexible printed circuit having a conductor and a nonconductive stiffener.

At locations where substrate flexing would cause damage to the PWB and associated epoxy and/or solder connections, printing a non-conducting material, such as non-conductive ink or thermoplastic, would increase the rigidity of the flexible substrate and prevent potential damage. For example, FIG. 33B shows a side view of flexible substrate 831 with printed conductive trace 830 arranged with a printed support 833 printed adjacent to a portion the printed conductive trace 830. Printed support 833 will increase the rigidity over the portion of the PWB which the support is printed. Printed support 833 can be printed with a thick layer of the same non-conductive ink used for insulating different layers of printed conductors. Printed support 833 can be printed using another type of conductive or non-conductive ink processed with piezoelectric printing or syringe printing. Printed support 833 may also be printed using a traditional thermoplastic such as a those materials used in Fused Filament Fabrication (FFF) 3D printers. While the example in FIG. 33B shows a side view of printed support 833 having a linear arrangement of uniform thickness, the support can be arranged in a variety of shapes and thicknesses to produce a PWB with unique rigidity over the surface. The LTM 150 is configured to accept data identifying areas requiring stiffening and generate stiffening structure data which is used to direct printing of the nonconductive material to form a stiffening support.

SUMMARY

While particular embodiments of the present disclosure have been shown and described, it will be appreciated by those skilled in the art that, based upon the teachings herein, changes and modifications may be made without departing from this disclosure and its broader aspects and, therefore, the appended claims are to encompass within their scope all such changes and modifications as are within the true spirit and scope of this disclosure. The true spirit and scope is considered to encompass devices and processes, unless specifically limited to distinguish from known subject matter, which provide equivalent functions as required for interaction with other elements of the claims and the scope is not considered limited to devices and functions currently in existence where future developments may supplant usage of currently available devices and processes yet provide the functioning required for interaction with other claim elements. Furthermore, it is to be understood that the disclosure is solely defined by the appended claims. It is understood by those with skill in the art that unless a specific number of an introduced claim element is recited in the claim, such claim element is not limited to a certain number. For example, introduction of a claim element using the indefinite article "a" or "an" does not limit the claim to "one" of the element. Still further, the following appended claims can contain usage of the introductory phrases "at least one" and "one or more" to introduce claim elements. Such phrases are not considered to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; similarly, the use in the claims of definite articles does not alter the above related interpretation indefinite articles such as "a" or "an".

What is claimed is:

1. A kit for printing a circuit on a substrate to produce a printed circuit board on the substrate, the kit comprising:
   a conductive material print head containing a conductive material to be printed on said substrate;
   a nonconductive material print head containing a nonconductive material to be printed on said substrate; and
   a printing apparatus comprising:
      a table for supporting the substrate;
      a function head configured to accept installations of said conductive material print head and said nonconductive material print head such that:
         one of said nonconductive material print head or said conductive material print head is carried on said function head at a given time; or
         both of said nonconductive material print head and said conductive material print head are simultaneously carried on said function head;
      a positioner configured to effect a movement of said function head and said table relative to one another; and
      a controller configured to accept PWB data to operate said function head and said positioner to effect:
         printing on said substrate said nonconductive material when said function head has said nonconductive material print head installed;
         printing on the substrate of said conductive material to form printed conductors when said function head has said conductive material print head installed; and
         reprinting one or more of said printed conductors in response to a test input indicating said one or more printed conductors fail testing.

2. The kit of claim 1 wherein said controller is configured to prompt a user for said test input.

3. The kit of claim 2 wherein said controller is configured to operate a display showing a screen referencing one or more of said printed conductors and configured to prompt the user for said test input corresponding to one or more of said printed conductors.

4. The kit of claim 3 wherein said display presents a diagram of said printed conductors.

5. The kit of claim 1, further comprising:
   an electrical testing device having a testing probe for testing said printed conductors at at least one point;
   said function head being further configured to accept an installation of said testing probe, such that said function head carries said testing probe either alone or in combination with one or more of said conductive material print head, or said nonconductive material print head; and
   wherein, when said testing probe is installed in said function head, said controller is configured to operate said positioner and said function head to effect testing of said printed conductors to produce said test input indicating said one or more printed conductors fail testing and effect said reprinting of said one or more printed conductors in response to said test input when said conductive print head is carried on said function head.

6. The kit of claim 5, wherein said testing probe and said conductive material print head are simultaneously installed in said function head.

7. The kit of claim 5, wherein said testing probe is integrated into said conductive material print head.

8. The kit of claim 7, wherein said conductive material print head is an ink jet print head and said testing probe protrudes from a bottom surface of said ink jet print head.

9. The kit of claim 5, wherein said testing probe includes two probe contacts and said testing device effects a resistance measurement.

10. The kit of claim 5, wherein said controller is configured to obtain actual test values from testing of said printed conductors by operation of said electrical testing device, and produce said test input based on a comparison of said actual test values with expected test values.

11. The kit of claim 10 wherein said controller is configured to automatically effect the following conductor layer printing process:
   said printing said printed conductors on said substrate in a layer;

obtaining said actual test values of said printed conductors of said layer and determining failed printed conductors as said test input based on comparison of said actual test values with said expected test values; and reprinting said failed printed conductors.

12. The kit of claim 11, Wherein said PWB data includes trace geometry data, and said expected test values are determined based on said trace geometry data and predetermined sheet resistivity data of said one or more printed conductors.

13. The kit of claim 12, wherein said test probe includes first and second probe contacts.

14. The kit of claim 13, further comprising a probe holder mechanism responsive to said controller and carrying said first and second probes contacts on said function head, said probe holder mechanism being configured to position said first and second probe contacts a variable distance "d" apart.

15. The kit of claim 14, wherein:

said variable distance "d" has a maximum value; and said controller is configured to determine conductor segments of said printed conductors where said conductors segments have segment lengths not exceeding said maximum value, and effect said testing of said printed conductors by testing individual ones of said conductor segments using expected segment test values determined based on said trace geometry data, segment length, and said predetermined sheet resistivity data.

16. The kit of claim 15, wherein said reprinting said failed printed conductors is limited to reprinting individual ones of said conductor segments which have actual segment test values not meeting requirements of expected segment test values.

17. The kit of claim 16, further comprising a rotation mechanism responsive to said controller and arranged to rotatably support said probe holder mechanism on said function head.

18. The kit of claim 17, wherein said printed circuit board comprises at least first and second layers of conductors with non-conductive material separating at least portions of said first and second layers, and said controller is configured to automatically effect:

said conductor layer printing process to produce said first layer;

printing said non-conductive material separating said first and second layers; and said conductor layer printing process to produce said second layer.

19. The kit of claim 14, wherein said printed circuit board comprises at least first and second layers of conductors with non-conductive material separating at least portions of said first and second layers, and said controller is configured to automatically effect:

said conductor layer printing process to produce said first layer;

printing said non-conductive material separating said first and second layers; and said conductor layer printing process to produce said second layer.

20. The kit of claim 11, wherein said expected test values of said printed conductors are stored predetermined values.

21. The kit of claim 20, wherein said test probe includes first and second probe contacts.

22. The kit of claim 21, further comprising a probe holder mechanism responsive to said controller and carrying said first and second probes contacts on said function head, said probe holder mechanism being configured to position said first and second probe contacts a variable distance "d" apart.

23. The kit of claim 22, wherein:

said variable distance "d" has a maximum value; and said controller is configured to determine conductor segments of said printed conductors where said conductors segments have segment lengths not exceeding said maximum value, and effect said testing of said printed conductors by testing individual ones of said conductor segments.

24. The kit of claim 23, wherein said reprinting said failed printed conductors is limited to reprinting individual ones of said conductor segments which have failed testing.

25. The kit of claim 24, further comprising a rotation mechanism responsive to said controller and arranged to rotatably support said probe holder mechanism on said function head.

26. The kit of claim 25, wherein said printed circuit board comprises at least first and second layers of conductors with non-conductive material separating at least portions of said first and second layers, and said controller is configured to automatically effect:

said conductor layer printing process to produce said first layer;

printing said non-conductive material separating said first and second layers; and said conductor layer printing process to produce said second layer.

27. The kit of claim 22, wherein said printed circuit board comprises at least first and second layers of conductors with non-conductive material separating at least portions of said first and second layers, and said controller is configured to automatically effect:

said conductor layer printing process to produce said first layer;

printing said non-conductive material separating said first and second layers; and said conductor layer printing process to produce said second layer.

28. The kit of claim 11, wherein said printed circuit board comprises at least first and second layers of conductors with non-conductive material separating at least portions of said first and second layers, and said controller is configured to automatically effect:

said conductor layer printing process to produce said first layer;

printing said non-conductive material separating said first and second layers; and said conductor layer printing process to produce said second layer.

29. The kit of claim 28 wherein said electrical testing device produces said actual test values reflecting anyone of resistance, capacitance, inductance, insertion loss, return loss, or time domain reflectometry.

30. The kit of claim 29 wherein said electrical testing device effects testing via non-contact capacitive coupling.

31. The kit of claim 11 wherein said electrical testing device produces said actual test values reflecting any one of resistance, capacitance, inductance, insertion loss, return loss, or time domain reflectometry.

32. The kit of claim 31 wherein said electrical testing device effects testing via non-contact capacitive coupling.

* * * * *